(12) United States Patent
Suruga et al.

(10) Patent No.: US 11,594,700 B2
(45) Date of Patent: Feb. 28, 2023

(54) ORGANIC ELECTROLUMINESCENT DEVICE

(71) Applicant: Hodogaya Chemical Co., Ltd., Tokyo (JP)

(72) Inventors: Kazuyuki Suruga, Tokyo (JP); Takeshi Yamamoto, Tokyo (JP); Keigo Naito, Tokyo (JP)

(73) Assignee: Hodogaya Chemical Co., Ltd., Tokyo (JP)

( * ) Notice: Subject to any disclaimer, the term of this patent is extended or adjusted under 35 U.S.C. 154(b) by 665 days.

(21) Appl. No.: 16/347,008

(22) PCT Filed: Oct. 30, 2017

(86) PCT No.: PCT/JP2017/039064
§ 371 (c)(1),
(2) Date: May 2, 2019

(87) PCT Pub. No.: WO2018/092561
PCT Pub. Date: May 24, 2018

(65) Prior Publication Data
US 2019/0273216 A1   Sep. 5, 2019

(30) Foreign Application Priority Data
Nov. 16, 2016   (JP) .............................. JP2016-223157

(51) Int. Cl.
*H01L 51/50* (2006.01)
*H01L 51/00* (2006.01)
*H01L 51/52* (2006.01)

(52) U.S. Cl.
CPC ...... *H01L 51/5072* (2013.01); *H01L 51/0045* (2013.01); *H01L 51/50* (2013.01); *H01L 51/5056* (2013.01); *H01L 51/5206* (2013.01)

(58) Field of Classification Search
CPC . H01L 51/5072; H01L 51/0045; H01L 51/50; H01L 51/5056; H01L 51/5206; H01L 51/0067; H01L 51/5096; H01L 51/0072; H01L 51/0052; H01L 51/006; H01L 51/5024; H01L 51/52
USPC ....................................................... 428/690
See application file for complete search history.

(56) References Cited

U.S. PATENT DOCUMENTS

| | | | |
|---|---|---|---|
| 9,705,092 B2 | 7/2017 | Yamamoto et al. | |
| 9,732,036 B2 | 8/2017 | Yokoyama et al. | |
| 9,831,441 B2 | 11/2017 | Parham et al. | |
| 10,497,876 B2 | 12/2019 | Yokoyama et al. | |
| 10,693,078 B2 | 6/2020 | Hayashi et al. | |
| 11,158,811 B2 * | 10/2021 | Hayashi | H01L 51/006 |
| 2006/0180806 A1 | 8/2006 | Arakane et al. | |
| 2009/0072732 A1 | 3/2009 | Arakane et al. | |
| 2009/0267491 A1 * | 10/2009 | Takashima | C07C 229/68 564/426 |
| 2012/0175599 A1 | 7/2012 | Yokoyama et al. | |
| 2012/0273767 A1 * | 11/2012 | Yokoyama | H05B 33/20 257/E51.026 |
| 2013/0105787 A1 * | 5/2013 | Tanaka | C07D 209/86 257/40 |

(Continued)

FOREIGN PATENT DOCUMENTS

| | | |
|---|---|---|
| EP | 1589789 A1 | 10/2005 |
| EP | 2471771 A1 | 7/2012 |

(Continued)

OTHER PUBLICATIONS

CAS reg, No. 1141757-83-6, May 1, 2009. (Year: 2009).*

(Continued)

*Primary Examiner* — Douglas J McGinty
(74) *Attorney, Agent, or Firm* — Locke Lord LLP; James E. Armstrong, IV; Nicholas J. DiCeglie, Jr.

(57) ABSTRACT

To provide a material for an organic EL device that is excellent in hole injection and transport abilities, electron blocking ability, thin film stability, and durability, as a material for an organic EL device with high efficiency and high durability, and also to provide an organic EL device having a high efficiency, a low driving voltage, and a long lifetime by combining the material with various materials for an organic EL device that is excellent in hole and electron injection and transport abilities, electron blocking ability, thin film stability, and durability. An organic electroluminescent device comprising at least an anode, a hole transport layer, a light emitting layer, an electron transport layer and a cathode in this order, wherein the hole transport layer comprises a carbazole compound of the following general formula (1), and the light emitting layer comprises a blue light emitting dopant.

(1)

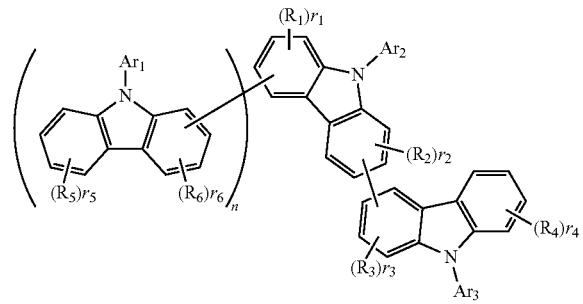

6 Claims, 1 Drawing Sheet

(56) References Cited

U.S. PATENT DOCUMENTS

| | | | |
|---|---|---|---|
| 2014/0339518 A1 | 11/2014 | Yamamoto et al. | |
| 2015/0207075 A1* | 7/2015 | Mujica-Fernaud | C09K 11/06 |
| | | | 252/500 |
| 2015/0280133 A1 | 10/2015 | Parham et al. | |
| 2015/0280136 A1* | 10/2015 | Ryu | H01L 51/006 |
| | | | 257/40 |
| 2017/0207395 A1 | 7/2017 | Hayashi et al. | |
| 2017/0346009 A1 | 11/2017 | Yokoyama et al. | |
| 2017/0346015 A1 | 11/2017 | Hayashi et al. | |
| 2018/0175301 A1* | 6/2018 | Ookuma | C07D 209/88 |
| 2020/0335703 A1* | 10/2020 | Mochizuki | H01L 51/0059 |
| 2021/0009584 A1* | 1/2021 | Kase | H01L 51/0072 |

FOREIGN PATENT DOCUMENTS

| | | |
|---|---|---|
| EP | 2595208 A1 | 5/2013 |
| JP | 2014-138006 A | 7/2014 |
| JP | 2015-216135 A | 12/2015 |
| JP | 2015-536567 A | 12/2015 |
| TW | 201315795 A | 4/2013 |
| TW | 201632494 A | 9/2016 |
| WO | 2012/008281 A1 | 1/2012 |
| WO | 2013/022419 A1 | 2/2013 |
| WO | 2014/024880 A1 | 2/2014 |
| WO | 2014/067614 A1 | 5/2014 |
| WO | 2016/013184 A1 | 1/2016 |
| WO | 2016/088759 A1 | 6/2016 |
| WO | 2016/104289 A1 | 6/2016 |

OTHER PUBLICATIONS

Office Action dated Jul. 15, 2021, issued for the corresponding Taiwanese Patent Application No. 106138854 and Japanese translation thereof.

Office Action dated Aug. 10, 2021, issued for corresponding Japanese Patent Application No. 2018-551557.

Supplementary European Search Report dated Oct. 26, 2020, issued for the corresponding European Patent Application No. 17872655.0.

Dfficial Communication issued in corresponding European Patent Application No. EP 17872655.0, dated Aug. 29, 2022.

International Search Report ated Jan. 16, 2018, issued for PCT/JP2017/039064.

* cited by examiner

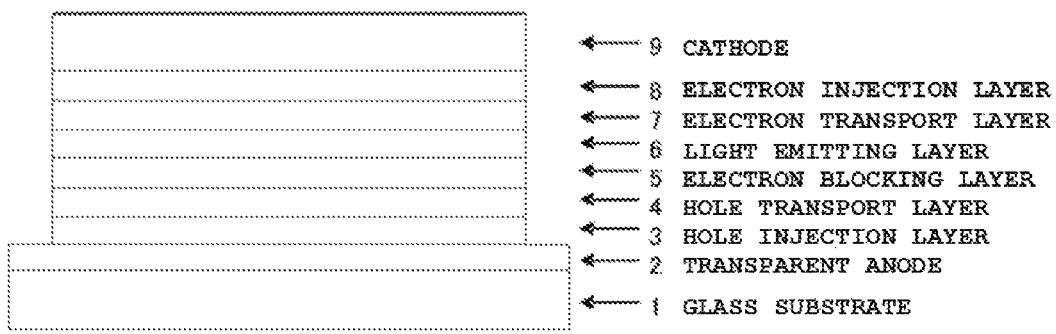

ORGANIC ELECTROLUMINESCENT DEVICE

TECHNICAL FIELD

The present invention relates to an organic electroluminescent device which is a preferred self-luminous device for various display devices. Specifically, this invention relates to organic electroluminescent devices (hereinafter referred to as organic EL devices) using specific carbazole compounds.

BACKGROUND ART

The organic EL device is a self-luminous device and has been actively studied for their brighter, superior visibility and the ability to display clearer images in comparison with liquid crystal devices.

In 1987, C. W. Tang and colleagues at Eastman Kodak developed a laminated structure device using materials assigned with different roles, realizing practical applications of an organic EL device with organic materials. These researchers laminated an electron-transporting phosphor and a hole-transporting organic substance, and injected both charges into a phosphor layer to cause emission in order to obtain a high luminance of 1,000 cd/m$^2$ or more at a voltage of 10 V or less (refer to PTLs 1 and 2, for example).

To date, various improvements have been made for practical applications of the organic EL device. Various roles of the laminated structure are further subdivided to provide an electroluminescence device that includes an anode, a hole injection layer, a hole transport layer, a light emitting layer, an electron transport layer, an electron injection layer, and a cathode successively formed on a substrate, and high efficiency and durability have been achieved by the electroluminescence device (refer to NPL 1, for example).

Further, there have been attempts to use triplet excitons for further improvements of luminous efficiency, and the use of a phosphorescence-emitting compound has been examined (refer to NPL 2, for example).

Devices that use light emission caused by thermally activated delayed fluorescence (TADF) have also been developed. In 2011, Adachi et al. at Kyushu University, National University Corporation realized 5.3% external quantum efficiency with a device using a thermally activated delayed fluorescent material (refer to NPL 3, for example).

The light emitting layer can be also fabricated by doping a charge-transporting compound generally called a host material, with a fluorescent compound, a phosphorescence-emitting compound, or a delayed fluorescent-emitting material. As described in the NPL, the selection of organic materials in an organic EL device greatly influences various device characteristics such as efficiency and durability (refer to NPL 2, for example).

In an organic EL device, charges injected from both electrodes recombine in a light emitting layer to cause emission. What is important here is how efficiently the hole and electron charges are transferred to the light emitting layer in order to form a device having excellent carrier balance. The probability of hole-electron recombination can be improved by improving hole injectability and electron blocking performance of blocking injected electrons from the cathode, and high luminous efficiency can be obtained by confining excitons generated in the light emitting layer. The role of a hole transport material is therefore important, and there is a need for a hole transport material that has high hole injectability, high hole mobility, high electron blocking performance, and high durability to electrons.

Heat resistance and amorphousness of the materials are also important with respect to the lifetime of the device. The materials with low heat resistance cause thermal decomposition even at a low temperature by heat generated during the drive of the device, which leads to the deterioration of the materials. The materials with low amorphousness cause crystallization of a thin film even in a short time and lead to the deterioration of the device. The materials in use are therefore required to have characteristics of high heat resistance and satisfactory amorphousness.

N,N'-diphenyl-N,N'-di(α-naphthyl)benzidine (NPD) and various aromatic amine derivatives are known as the hole transport materials used for the organic EL device (refer to PTLs 1 and 2, for example). Although NPD has desirable hole transportability, its glass transition point (Tg), which is an index of heat resistance, is as low as 96° C., which causes the degradation of device characteristics by crystallization under a high-temperature condition (refer to NPL 4, for example). The aromatic amine derivatives described in the PTLs include a compound known to have an excellent hole mobility of 10$^{-3}$ cm$^2$/Vs or higher (refer to PTLs 1 and 2, for example). However, since the compound is insufficient in terms of electron blocking performance, some of the electrons pass through the light emitting layer, and improvements in luminous efficiency cannot be expected. For such a reason, a material with higher electron blocking performance, a more stable thin-film state and higher heat resistance is needed for higher efficiency. Although an aromatic amine derivative having high durability is reported (refer to PTL 3, for example), the derivative is used as a charge transporting material used in an electrophotographic photoconductor, and there is no example of using the derivative in the organic EL device.

Arylamine compounds having a substituted carbazole structure are proposed as compounds improved in the characteristics such as heat resistance and hole injectability (refer to PTLs 4 and 5, for example). However, while the devices using these compounds for the hole injection layer or the hole transport layer have been improved in heat resistance, luminous efficiency and the like, the improvements are still insufficient. Further lower driving voltage and higher luminous efficiency are therefore needed.

In order to improve characteristics of the organic EL device and to improve the yield of the device production, it has been desired to develop a device having high luminous efficiency, low driving voltage and a long lifetime by using in combination the materials that excel in hole and electron injection/transport performances, stability as a thin film and durability, permitting holes and electrons to be highly efficiently recombined together.

Further, in order to improve characteristics of the organic EL device, it has been desired to develop a device that maintains carrier balance and has high efficiency, low driving voltage and a long lifetime by using in combination the materials that excel in hole and electron injection/transport performances, stability as a thin film and durability.

CITATION LIST

Patent Literature

PTL 1: JP-A-8-048656
PTL 2: Japanese Patent No. 3194657
PTL 3: Japanese Patent No. 4943840
PTL 4: JP-A-2006-151979
PTL 5: WO2008/62636
PTL 6: KR-A-10-2015-0130206

PTL 7: KR-A-10-2013-0060157
PTL 8: WO2014/009310

Non Patent Literature

NPL 1: The Japan Society of Applied Physics, 9th Lecture Preprints, pp. 55 to 61 (2001)
NPL 2: The Japan Society of Applied Physics, 9th Lecture Preprints, pp. 23 to 31 (2001)
NPL 3: Appl. Phys. Let., 98, 083302 (2011)
NPL 4: Organic EL Symposium, the 3rd Regular presentation Preprints, pp. 13 to 14 (2006)

SUMMARY OF INVENTION

Technical Problem

An object of the present invention is to provide a material for an organic EL device that is excellent in hole injection and transport abilities, electron blocking ability, thin film stability, and durability, as a material for an organic EL device with high efficiency and high durability, and also to provide an organic EL device having a high efficiency, a low driving voltage, and a long lifetime by combining the material with various materials for an organic EL device that is excellent in hole and electron injection and transport abilities, electron blocking ability, thin film stability, and durability, in such a manner that the characteristics of the materials can be effectively exhibited.

Physical properties of the organic compound to be provided by the present invention include (1) good hole injection characteristics, (2) large hole mobility, (3) stability in a thin-film state, and (4) excellent heat resistance. Physical properties of the organic EL device to be provided by the present invention include (1) high luminous efficiency and high power efficiency, (2) low turn on voltage, (3) low actual driving voltage, and (4) a long lifetime.

Solution to Problem

For achieving the object, the present inventors have focused the fact that a carbazole material is excellent in hole injection ability and transport ability, thin film stability, and durability, and they have produced various organic EL devices in such a manner that the carbazole compound having a particular structure are selected and used as a material of a hole transporting layer or an electron blocking layer adjacent to a light emitting layer so that holes can be efficiently injected and transported into a light emitting layer, and holes can be efficiently injected and transported into a light emitting layer including a specific light emitting material (dopant), and the hole transport material having a particular structure and the specific light-emitting material (dopant) are combined to maintain carrier balance, and they have earnestly investigated the characteristics of the devices. As a result, they have completed the present invention.

Specifically, according to the present invention, the following organic EL devices are provided.

1) An organic EL device comprising at least an anode, a hole transport layer, a light emitting layer, an electron transport layer and a cathode in this order, wherein the hole transport layer comprises a carbazole compound of the following general formula (1), and the light emitting layer comprises a blue light emitting dopant.

[Chemical Formula 1]

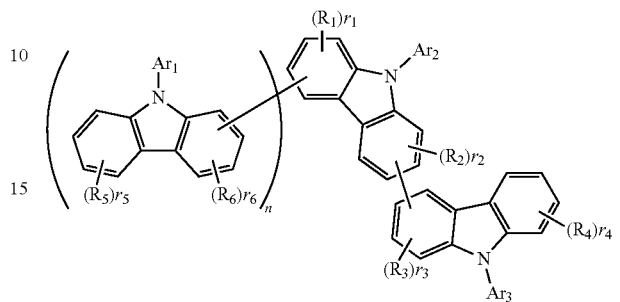

In the formula, $Ar_1$ to $Ar_3$ may be the same or different, and represent a substituted or unsubstituted aromatic hydrocarbon group, a substituted or unsubstituted aromatic heterocyclic group, or a substituted or unsubstituted condensed polycyclic aromatic group. $R_1$ to $R_6$ may be the same or different, and represent a deuterium atom, a fluorine atom, a chlorine atom, a cyano group, a nitro group, a linear or branched alkyl group of 1 to 6 carbon atoms that may have a substituent, a cycloalkyl group of 5 to 10 carbon atoms that may have a substituent, a linear or branched alkenyl group of 2 to 6 carbon atoms that may have a substituent, a linear or branched alkyloxy group of 1 to 6 carbon atoms that may have a substituent, a cycloalkyloxy group of 5 to 10 carbon atoms that may have a substituent, a substituted or unsubstituted aromatic hydrocarbon group, a substituted or unsubstituted aromatic heterocyclic group, a substituted or unsubstituted condensed polycyclic aromatic group, a substituted or unsubstituted aryloxy group, or a disubstituted amino group substituted with a group selected from an aromatic hydrocarbon group, an aromatic heterocyclic group, and a condensed polycyclic aromatic group, where the respective groups may bind to each other via a single bond, a substituted or unsubstituted methylene group, an oxygen atom, or a sulfur atom to form a ring, and the respective groups may bind to the benzene ring binding with $R_1$ to $R_6$ via a linking group such as substituted or unsubstituted methylene, an oxygen atom, a sulfur atom, or a monosubstituted amino group to form a ring. $r_4$ and $r_5$ represent an integer of 0 to 4, and $r_1$, $r_2$, $r_3$, and $r_6$ represent an integer of 0 to 3. n represents 0 or 1.

2) An organic EL device comprising at least an anode, a hole transport layer, an electron blocking layer, a light emitting layer, an electron transport layer and a cathode in this order, wherein the electron blocking layer comprises a carbazole compound of the general formula (1), and the light emitting layer comprises a blue light emitting dopant.

3) The organic EL device of 1) or 2), wherein the blue light emitting dopant is a pyrene derivative.

4) The organic EL device of 1) or 2), wherein the blue light emitting dopant is an amine derivative having a condensed ring structure of the following general formula (2).

[Chemical Formula 2]

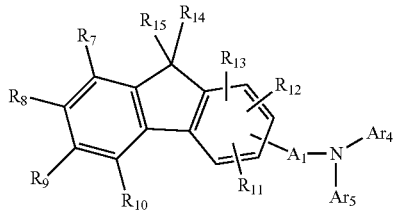

(2)

In the formula, $A_1$ represents a divalent group of a substituted or unsubstituted aromatic hydrocarbon, a divalent group of a substituted or unsubstituted aromatic heterocyclic ring, a divalent group of substituted or unsubstituted condensed polycyclic aromatics, or a single bond. $Ar_4$ and $Ar_5$ may be the same or different, and represent a substituted or unsubstituted aromatic hydrocarbon group, a substituted or unsubstituted aromatic heterocyclic group, or a substituted or unsubstituted condensed polycyclic aromatic group, where $Ar_4$ and $Ar_5$ may bind to each other via a single bond, substituted or unsubstituted methylene, an oxygen atom, or a sulfur atom to form a ring. $R_7$ to $R_{10}$ may be the same or different, and represent a hydrogen atom, a deuterium atom, a fluorine atom, a chlorine atom, cyano, nitro, linear or branched alkyl of 1 to 6 carbon atoms that may have a substituent, cycloalkyl of 5 to 10 carbon atoms that may have a substituent, linear or branched alkenyl of 2 to 6 carbon atoms that may have a substituent, linear or branched alkyloxy of 1 to 6 carbon atoms that may have a substituent, cycloalkyloxy of 5 to 10 carbon atoms that may have a substituent, a substituted or unsubstituted aromatic hydrocarbon group, a substituted or unsubstituted aromatic heterocyclic group, a substituted or unsubstituted condensed polycyclic aromatic group, substituted or unsubstituted aryloxy, or a disubstituted amino group substituted with a group selected from an aromatic hydrocarbon group, an aromatic heterocyclic group, and a condensed polycyclic aromatic group, where the respective groups may bind to each other via a single bond, substituted or unsubstituted methylene, an oxygen atom, or a sulfur atom to form a ring, and the respective groups may bind to the benzene ring binding with $R_7$ to $R_{10}$ via a linking group such as substituted or unsubstituted methylene, an oxygen atom, a sulfur atom, or a monosubstituted amino group to form a ring. $R_{11}$ to $R_{13}$ may be the same or different, and represent a hydrogen atom, a deuterium atom, a fluorine atom, a chlorine atom, cyano, nitro, linear or branched alkyl of 1 to 6 carbon atoms that may have a substituent, cycloalkyl of 5 to 10 carbon atoms that may have a substituent, linear or branched alkenyl of 2 to 6 carbon atoms that may have a substituent, linear or branched alkyloxy of 1 to 6 carbon atoms that may have a substituent, cycloalkyloxy of 5 to 10 carbon atoms that may have a substituent, a substituted or unsubstituted aromatic hydrocarbon group, a substituted or unsubstituted aromatic heterocyclic group, a substituted or unsubstituted condensed polycyclic aromatic group, or substituted or unsubstituted aryloxy, where the respective groups may bind to each other via a single bond, substituted or unsubstituted methylene, an oxygen atom, or a sulfur atom to form a ring, and the respective groups may bind to the benzene ring binding with $R_{11}$ to $R_{13}$ via a linking group such as substituted or unsubstituted methylene, an oxygen atom, a sulfur atom, or a monosubstituted amino group to form a ring. $R_{14}$ and $R_{15}$ may be the same or different, and represent linear or branched alkyl of 1 to 6 carbon atoms that may have a substituent, cycloalkyl of 5 to 10 carbon atoms that may have a substituent, linear or branched alkenyl of 2 to 6 carbon atoms that may have a substituent, a substituted or unsubstituted aromatic hydrocarbon group, a substituted or unsubstituted aromatic heterocyclic group, a substituted or unsubstituted condensed polycyclic aromatic group, or substituted or unsubstituted aryloxy, where the respective groups may bind to each other via a linking group such as a single bond, substituted or unsubstituted methylene, an oxygen atom, a sulfur atom, or a monosubstituted amino group to form a ring.

5) The organic EL device of any one of 1) to 4), wherein the electron transport layer includes a compound of the following general formula (3) having a pyrimidine ring structure.

[Chemical Formula 3]

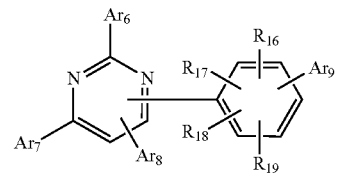

(3)

In the formula, $Ar_6$ represents a substituted or unsubstituted aromatic hydrocarbon group, or a substituted or unsubstituted condensed polycyclic aromatic group. $Ar_7$ and $Ar_8$ may be the same or different, and represent a hydrogen atom, a substituted or unsubstituted aromatic hydrocarbon group, or a substituted or unsubstituted condensed polycyclic aromatic group. $Ar_9$ represents a substituted or unsubstituted aromatic heterocyclic group. $R_{16}$ to $R_{19}$ may be the same or different, and represent a hydrogen atom, a deuterium atom, a fluorine atom, a chlorine atom, cyano, trifluoromethyl, linear or branched alkyl of 1 to 6 carbon atoms, a substituted or unsubstituted aromatic hydrocarbon group, a substituted or unsubstituted aromatic heterocyclic group, or a substituted or unsubstituted condensed polycyclic aromatic group, where $Ar_8$ and $Ar_8$ are not simultaneously a hydrogen atom.

6) The organic EL device of any one of 1) to 5), wherein the light emitting layer includes an anthracene derivative.

7) The organic EL device of 6), wherein the light emitting layer includes a host material which is the anthracene derivative.

Specific examples of the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $Ar_1$ to $Ar_a$ in the general formula (1) include phenyl, biphenylyl, terphenylyl, naphthyl, anthracenyl, phenanthrenyl, fluorenyl, indenyl, pyrenyl, perylenyl, fluoranthenyl, triphenylenyl, pyridyl, pyrimidinyl, triazinyl, furyl, pyrrolyl, thienyl, quinolyl, isoquinolyl, benzofuranyl, benzothienyl, indolyl, carbazolyl, benzoxazolyl, benzothiazolyl, quinoxalinyl, benzoimidazolyl, pyrazolyl, dibenzofuranyl, dibenzothienyl, naphthyridinyl, phenanthrolinyl, acridinyl, and carbolinyl.

Specific examples of the "substituent" in the "substituted aromatic hydrocarbon group", the "substituted aromatic heterocyclic group", or the "substituted condensed polycyclic aromatic group" represented by $Ar_1$ to $Ar_a$ in the general formula (1) include a deuterium atom; cyano; nitro; halogen atoms such as a fluorine atom, a chlorine atom, a bromine atom, and an iodine atom; linear or branched alkyls of 1 to 6 carbon atoms such as methyl, ethyl, n-propyl, isopropyl, n-butyl, isobutyl, tert-butyl, n-pentyl, isopentyl, neopentyl, and n-hexyl; linear or branched alkyloxys of 1 to 6 carbon atoms such as methyloxy, ethyloxy, and propyloxy; alkenyls such as vinyl and allyl; aryloxys such as phenyloxy and tolyloxy; arylalkyloxys such as benzyloxy and phenethyloxy; aromatic hydrocarbon groups or condensed polycyclic aromatic groups such as phenyl, biphenylyl, terphenylyl, naphthyl, anthracenyl, phenanthrenyl, fluorenyl, indenyl, pyrenyl, perylenyl, fluoranthenyl, and triphenylenyl; aromatic heterocyclic groups such as pyridyl, pyrimidinyl, triazinyl, thienyl, furyl, pyrrolyl, quinolyl, isoquinolyl, benzofuranyl, benzothienyl, indolyl, carbazolyl, benzoxazolyl, benzothiazolyl, quinoxalinyl, benzoimidazolyl, pyrazolyl, dibenzofuranyl, dibenzothienyl, and carbolinyl; arylvinyls such as styryl and naphthylvinyl; acyls such as acetyl and benzoyl. These substituents may be further substituted with the exemplified substituents above. These substituents may bind to each other via such as a single bond, substituted or unsubstituted methylene, an oxygen atom, or a sulfur atom to form a ring.

Specific examples of the "linear or branched alkyl of 1 to 6 carbon atoms", the "cycloalkyl of 5 to 10 carbon atoms", or the "linear or branched alkenyl of 2 to 6 carbon atoms" in the "linear or branched alkyl of 1 to 6 carbon atoms that may have a substituent", the "cycloalkyl of 5 to 10 carbon atoms that may have a substituent", or the "linear or branched alkenyl of 2 to 6 carbon atoms that may have a substituent" represented by $R_1$ to $R_6$ in the general formula (1) include methyl, ethyl, n-propyl, isopropyl, n-butyl, isobutyl, tert-butyl, n-pentyl, isopentyl, neopentyl, n-hexyl, cyclopentyl, cyclohexyl, 1-adamantyl, 2-adamantyl, vinyl, allyl, isopropenyl, and 2-butenyl. These groups may bind to each other via a single bond, substituted or unsubstituted methylene, an oxygen atom, or a sulfur atom to form a ring. These groups ($R_1$ to $R_6$) may bind to the benzene ring directly binding with these groups ($R_1$ to $R_6$) via a linking group such as substituted or unsubstituted methylene, an oxygen atom, a sulfur atom, or a monosubstituted amino group to form a ring.

Specific examples of the "substituent" in the "linear or branched alkyl of 1 to 6 carbon atoms that has a substituent", the "cycloalkyl of 5 to 10 carbon atoms that has a substituent", or the "linear or branched alkenyl of 2 to 6 carbon atoms that has a substituent" represented by $R_1$ to $R_6$ in the general formula (1) include a deuterium atom; cyano; nitro; halogen atoms such as a fluorine atom, a chlorine atom, a bromine atom, and an iodine atom; linear or branched alkyloxys of 1 to 6 carbon atoms such as methyloxy, ethyloxy, and propyloxy; alkenyls such as vinyl and allyl; aryloxys such as phenyloxy and tolyloxy; arylalkyloxys such as benzyloxy and phenethyloxy; aromatic hydrocarbon groups or condensed polycyclic aromatic groups such as phenyl, biphenylyl, terphenylyl, naphthyl, anthracenyl, phenanthrenyl, fluorenyl, indenyl, pyrenyl, perylenyl, fluoranthenyl, and triphenylenyl; aromatic heterocyclic groups such as pyridyl, pyrimidinyl, triazinyl, thienyl, furyl, pyrrolyl, quinolyl, isoquinolyl, benzofuranyl, benzothienyl, indolyl, carbazolyl, benzoxazolyl, benzothiazolyl, quinoxalinyl, benzoimidazolyl, pyrazolyl, dibenzofuranyl, dibenzothienyl, and carbolinyl; disubstituted amino groups substituted by an aromatic hydrocarbon group or a condensed polycyclic aromatic group, such as diphenylamino and dinaphth-ylamino; disubstituted amino groups substituted by an aromatic heterocyclic group, such as dipyridylamino and dithienylamino; and disubstituted amino groups substituted by substituents selected from aromatic hydrocarbon groups, condensed polycyclic aromatic groups, and aromatic heterocyclic groups. These substituents may be further substituted with the exemplified substituents above. These substituents may bind to each other via a single bond, substituted or unsubstituted methylene, an oxygen atom, or a sulfur atom to form a ring.

Specific examples of the "linear or branched alkyloxy of 1 to 6 carbon atoms" or the "cycloalkyloxy of 5 to 10 carbon atoms" in the "linear or branched alkyloxy of 1 to 6 carbon atoms that may have a substituent" or the "cycloalkyloxy of 5 to 10 carbon atoms that may have a substituent" represented by $R_1$ to $R_6$ in the general formula (1) include methyloxy, ethyloxy, n-propyloxy, isopropyloxy, n-butyloxy, tert-butyloxy, n-pentyloxy, n-hexyloxy, cyclopentyloxy, cyclohexyloxy, cycloheptyloxy, cyclooctyloxy, 1-adamantyloxy, and 2-adamantyloxy. These groups may bind to each other via a single bond, substituted or unsubstituted methylene, an oxygen atom, or a sulfur atom to form a ring. These groups ($R_1$ to $R_6$) may bind to the benzene rings directly binding with these groups ($R_1$ to $R_6$) via a linking group such as substituted or unsubstituted methylene, an oxygen atom, a sulfur atom, or a monosubstituted amino group to form a ring. These groups may have a substituent. Examples of the substituent include the same groups exemplified as the "substituent" in the "linear or branched alkyl of 1 to 6 carbon atoms that has a substituent", the "cycloalkyl of 5 to 10 carbon atoms that has a substituent", or the "linear or branched alkenyl of 2 to 6 carbon atoms that has a substituent" represented by $R_1$ to $R_6$ in the general formula (1), and possible embodiments may also be the same embodiments as the exemplified embodiments.

Examples of the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $R_1$ to $R_6$ in the general formula (1) include the same groups exemplified as the groups for the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $Ar_1$ to $Ar_a$ in the general formula (1). These groups may bind to each other via a single bond, substituted or unsubstituted methylene, an oxygen atom, or a sulfur atom to form a ring. These groups ($R_1$ to $R_6$) may bind to the benzene rings directly binding with these groups ($R_1$ to $R_6$) via a linking group such as substituted or unsubstituted methylene, an oxygen atom, a sulfur atom, or a monosubstituted amino group to form a ring. These groups may have a substituent. Examples of the substituent include a deuterium atom; cyano; nitro; halogen atoms such as a fluorine atom, a chlorine atom, a bromine atom, and an iodine atom; linear or branched alkyls of 1 to 6 carbon atoms such as methyl, ethyl, n-propyl, n-butyl, isobutyl, tert-butyl, n-pentyl, isopentyl, neopentyl, and n-hexyl; linear or branched alkyloxys of 1 to 6 carbon atoms such as methyloxy, ethyloxy, and propyloxy; alkenyls such as vinyl and allyl; aryloxys such as phenyloxy and tolyloxy; arylalkyloxys such as benzyloxy and phenethyloxy; aromatic hydrocarbon groups or condensed polycyclic aromatic groups such as phenyl, biphenylyl, terphenylyl, naphthyl, anthracenyl, phenanthrenyl, fluorenyl, indenyl, pyrenyl, perylenyl, fluoranthenyl, and triphenylenyl; aromatic heterocyclic groups such as pyridyl, pyrimidinyl, triazinyl, thienyl, furyl, pyrrolyl, quinolyl, isoquinolyl, benzofuranyl, benzothienyl, indolyl, carbazolyl, benzoxazolyl, benzothiazolyl, quinoxalinyl, benzoimidazolyl, pyrazolyl, dibenzofuranyl, dibenzothienyl, and carbolinyl; arylvinyls such as styryl and naphthylvinyl; acyls such as acetyl and benzoyl; silyls such as trimethylsilyl and triphenylsilyl; disubstituted amino groups substituted by an aromatic hydrocarbon group or a condensed polycyclic aromatic group, such as diphenylamino and dinaphthylamino; disubstituted amino groups substituted by an aromatic heterocyclic group, such as dipyridylamino and dithienylamino; and disubstituted amino groups substituted by substituents selected from aromatic hydrocarbon groups, condensed polycyclic aromatic groups, and aromatic heterocyclic groups. These substituents may be further substituted with the exemplified substituents above. These substituents may bind to each other via a single bond, substituted or unsubstituted methylene, an oxygen atom, or a sulfur atom to form a ring.

Specific examples of the "aryloxy group" in the "substituted or unsubstituted aryloxy group" represented by $R_1$ to $R_6$ in the general formula (1) include phenyloxy, biphenylyloxy, terphenylyloxy, naphthyloxy, anthracenyloxy, phenanthrenyloxy, fluorenyloxy, indenyloxy, pyrenyloxy, and perylenyloxy. These substituents may bind to each other via a single bond, substituted or unsubstituted methylene, an oxygen atom, or a sulfur atom to form a ring. These groups ($R_1$ to $R_6$) may bind to the benzene rings directly binding with these groups ($R_1$ to $R_6$) via a linking group such as substituted or unsubstituted methylene, an oxygen atom, a sulfur atom, or a monosubstituted amino group to form a ring. These groups may have a substituent. Examples of the substituent include the same groups exemplified as the "substituent" that the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $R_1$ to $R_6$ in the general formula (1) may have, and possible embodiments may also be the same embodiments as the exemplified embodiments.

Examples of the "aromatic hydrocarbon group", the "aromatic heterocyclic group", or the "condensed polycyclic aromatic group" in the "disubstituted amino group substituted by substituents selected from aromatic hydrocarbon group, aromatic heterocyclic group, and condensed polycyclic aromatic group" represented by $R_1$ to $R_6$ in the general formula (1) include the same groups exemplified as the groups for the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $Ar_1$ to $Ar_a$ in the general formula (1). These groups may have a substituent. Examples of the substituent include the same groups exemplified as the "substituent" that the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $R_1$ to $R_6$ in the general formula (1) may have, and possible embodiments may also be the same embodiments as the exemplified embodiments.

As for the "disubstituted amino group substituted by substituents selected from aromatic hydrocarbon group, aromatic heterocyclic group, and condensed polycyclic aromatic group" represented by $R_1$ to $R_6$ in the general formula (1), these groups ($R_1$ to $R_6$) may bind to each other via a single bond, substituted or unsubstituted methylene, an oxygen atom, or a sulfur atom to form a ring, through the "aromatic hydrocarbon group", the "aromatic heterocyclic group", or the "condensed polycyclic aromatic group" that these groups ($R_1$ to $R_6$) have. These groups ($R_1$ to $R_6$) may bind to the benzene ring directly binding with these groups ($R_1$ to $R_6$) via a linking group such as substituted or unsubstituted methylene, an oxygen atom, a sulfur atom, or a monosubstituted amino group to form a ring, through the "aromatic hydrocarbon group", the "aromatic heterocyclic group", or the "condensed polycyclic aromatic group" that these groups ($R_1$ to $R_6$) have.

Specific examples of the "aromatic hydrocarbon", the "aromatic heterocyclic ring", or the "condensed polycyclic aromatics" of the "substituted or unsubstituted aromatic hydrocarbon", the "substituted or unsubstituted aromatic heterocyclic ring", or the "substituted or unsubstituted condensed polycyclic aromatics" in the "divalent group of a substituted or unsubstituted aromatic hydrocarbon", the "divalent group of a substituted or unsubstituted aromatic heterocyclic ring", or the "divalent group of substituted or unsubstituted condensed polycyclic aromatics" represented by $A_1$ in the general formula (2) include benzene, biphenyl, terphenyl, tetrakisphenyl, styrene, naphthalene, anthracene, acenaphthalene, fluorene, phenanthrene, indane, pyrene, triphenylene, pyridine, pyrimidine, triazine, pyrrole, furan, thiophene, quinoline, isoquinoline, benzofuran, benzothiophene, indoline, carbazole, carboline, benzoxazole, benzothiazole, quinoxaline, benzimidazole, pyrazole, dibenzofuran, dibenzothiophene, naphthyridine, phenanthroline, and acridine. The "divalent group of a substituted or unsubstituted aromatic hydrocarbon", the "divalent group of a substituted or unsubstituted aromatic heterocyclic ring", or the "divalent group of substituted or unsubstituted condensed polycyclic aromatics" represented by $A_1$ in the general formula (2) is a divalent group that results from the removal of two hydrogen atoms from the above "aromatic hydrocarbon", "aromatic heterocyclic ring", or "condensed polycyclic aromatics". These divalent groups may have a substituent, and examples of the substituent include the same substituents exemplified as the "substituent" in the "substituted aromatic hydrocarbon group", the "substituted aromatic heterocyclic group", or the "substituted condensed polycyclic aromatic group" represented by $Ar_1$ to $Ar_a$ in the general formula (1), and possible embodiments may also be the same embodiments as the exemplified embodiments.

Examples of the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $Ar_4$ and $Ar_5$ in the general formula (2) include the same groups exemplified as the groups for the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $Ar_1$ to $Ar_3$ in the general formula (1).

Ar$_4$ and Ar$_5$ may bind to each other via a single bond, substituted or unsubstituted methylene, an oxygen atom, or a sulfur atom to form a ring. These groups may have a substituent. Examples of the substituent include the same groups exemplified as the "substituent" in the "substituted aromatic hydrocarbon group", the "substituted aromatic heterocyclic group", or the "substituted condensed polycyclic aromatic group" represented by Ar$_1$ to Ar$_3$ in the general formula (1), and possible embodiments may also be the same embodiments as the exemplified embodiments.

Examples of the "linear or branched alkyl of 1 to 6 carbon atoms", the "cycloalkyl of 5 to 10 carbon atoms", or the "linear or branched alkenyl of 2 to 6 carbon atoms" in the "linear or branched alkyl of 1 to 6 carbon atoms that may have a substituent", the "cycloalkyl of 5 to 10 carbon atoms that may have a substituent", or the "linear or branched alkenyl of 2 to 6 carbon atoms that may have a substituent" represented by R$_7$ to R$_{15}$ in the general formula (2) include the same groups exemplified as the groups for the "linear or branched alkyl of 1 to 6 carbon atoms", the "cycloalkyl of 5 to 10 carbon atoms", or the "linear or branched alkenyl of 2 to 6 carbon atoms" in the "linear or branched alkyl of 1 to 6 carbon atoms that may have a substituent", the "cycloalkyl of 5 to 10 carbon atoms that may have a substituent", or the "linear or branched alkenyl of 2 to 6 carbon atoms that may have a substituent" represented by R$_1$ to R$_6$ in the general formula (1). These groups may bind to each other to form a ring via a linking group, such as a single bond, substituted or unsubstituted methylene, an oxygen atom, a sulfur atom, or a monosubstituted amino group. These groups may have a substituent. Examples of the substituent include the same groups exemplified as the "substituent" in the "linear or branched alkyl of 1 to 6 carbon atoms that may have a substituent", the "cycloalkyl of 5 to 10 carbon atoms that may have a substituent", or the "linear or branched alkenyl of 2 to 6 carbon atoms that may have a substituent" represented by R$_1$ to R$_6$ in the general formula (1), and possible embodiments may also be the same embodiments as the exemplified embodiments.

Examples of the "linear or branched alkyloxy of 1 to 6 carbon atoms", or the "cycloalkyloxy of 5 to 10 carbon atoms" in the "linear or branched alkyloxy of 1 to 6 carbon atoms that may have a substituent", or the "cycloalkyloxy of 5 to 10 carbon atoms that may have a substituent" represented by R$_7$ to R$_{13}$ in the general formula (2) include the same groups exemplified as the groups for the "linear or branched alkyloxy of 1 to 6 carbon atoms", or the "cycloalkyloxy of 5 to 10 carbon atoms" in the "linear or branched alkyloxy of 1 to 6 carbon atoms that may have a substituent", or the "cycloalkyloxy of 5 to 10 carbon atoms that may have a substituent" represented by R$_1$ to R$_6$ in the general formula (1). These groups may bind to each other via a linking group such as a single bond, substituted or unsubstituted methylene, an oxygen atom, a sulfur atom, or a monosubstituted amino group to form a ring. These groups may have a substituent. Examples of the substituent include the same groups exemplified as the "substituent" in the "linear or branched alkyloxy of 1 to 6 carbon atoms that has a substituent", or the "cycloalkyloxy of 5 to 10 carbon atoms that has a substituent" represented by R$_1$ to R$_6$ in the general formula (1), and possible embodiments may also be the same embodiments as the exemplified embodiments.

Examples of the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by R$_7$ to R$_{13}$ in the general formula (2) include the same groups exemplified as the groups for the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by Ar$_1$ to Ar$_3$ in the general formula (1). These groups may bind to each other via a single bond, substituted or unsubstituted methylene, an oxygen atom, or a sulfur atom to form a ring. These groups (R$_7$ to R$_{13}$) may bind to the benzene rings directly binding with these groups (R$_7$ to R$_{13}$) via a linking group such as substituted or unsubstituted methylene, an oxygen atom, a sulfur atom, or a monosubstituted amino group to form a ring. These groups may have a substituent. Examples of the substituent include the same groups exemplified as the "substituent" in the "substituted or unsubstituted aromatic hydrocarbon group", the "substituted or unsubstituted aromatic heterocyclic group", or the "substituted or unsubstituted condensed polycyclic aromatic group" represented by Ar$_1$ to Ar$_a$ in the general formula (1), and possible embodiments may also be the same embodiments as the exemplified embodiments.

Examples of the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by R$_{14}$ and R$_{15}$ in the general formula (2) include the same groups exemplified as the groups for the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by Ar$_1$ to Ar$_a$ in the general formula (1). These groups may bind to each other via a linking group such as a single bond, substituted or unsubstituted methylene, an oxygen atom, a sulfur atom, or a monosubstituted amino group to form a ring. These groups may have a substituent. Examples of the substituent include the same groups exemplified as the "substituent" in the "substituted or unsubstituted aromatic hydrocarbon group", the "substituted or unsubstituted aromatic heterocyclic group", or the "substituted or unsubstituted condensed polycyclic aromatic group" represented by R$_1$ to R$_6$ in the general formula (1), and possible embodiments may also be the same embodiments as the exemplified embodiments.

Examples of the "aryloxy" in the "substituted or unsubstituted aryloxy" represented by R$_7$ to R$_{15}$ in the general formula (2) include the same groups exemplified as the groups for the "aryloxy" in the "substituted or unsubstituted aryloxy" represented by R$_1$ to R$_6$ in the general formula (1), and possible embodiments may also be the same embodiments as the exemplified embodiments. These groups may bind to each other via a linking group such as a single bond, substituted or unsubstituted methylene, an oxygen atom, or a sulfur atom, or a monosubstituted amino group to form a ring. These groups may have a substituent. Examples of the substituent include the same groups exemplified as the "substituent" in the "substituted or unsubstituted aryloxy" represented by R$_1$ to R$_6$ in the general formula (1), and possible embodiments may also be the same embodiments as the exemplified embodiments.

Examples of the "aromatic hydrocarbon group", the "aromatic heterocyclic group", or the "condensed polycyclic aromatic group" in the "disubstituted amino group substituted by substituents selected from aromatic hydrocarbon group, aromatic heterocyclic group, and condensed polycyclic aromatic group" represented by $R_7$ to $R_{10}$ in the general formula (2) include the same groups exemplified as the groups for the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $Ar_1$ to $Ar_a$ in the general formula (1). These groups may have a substituent. Examples of the substituent include the same groups exemplified as the "substituent" that the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $R_1$ to $R_6$ in the general formula (1) may have, and possible embodiments may also be the same embodiments as the exemplified embodiments.

As for the "disubstituted amino group substituted by substituents selected from aromatic hydrocarbon group, aromatic heterocyclic group, and condensed polycyclic aromatic group" represented by $R_7$ to $R_{10}$ in the general formula (2), these groups ($R_7$ to $R_{10}$) may bind to each other via a single bond, substituted or unsubstituted methylene, an oxygen atom, or a sulfur atom to form a ring, through the "aromatic hydrocarbon group", the "aromatic heterocyclic group", or the "condensed polycyclic aromatic group" that these groups ($R_1$ to $R_6$) have. These groups ($R_7$ to $R_{10}$) may bind to the benzene ring directly binding with these groups ($R_7$ to $R_{10}$) via a linking group, such as substituted or unsubstituted methylene, an oxygen atom, a sulfur atom, or a monosubstituted amino group to form a ring, through the "aromatic hydrocarbon group", the "aromatic heterocyclic group", or the "condensed polycyclic aromatic group" that these groups ($R_7$ to $R_{10}$) have.

Specific examples of the "aromatic hydrocarbon group" or the "condensed polycyclic aromatic group" in the "substituted or unsubstituted aromatic hydrocarbon group" or the "substituted or unsubstituted condensed polycyclic aromatic group" represented by $Ar_6$ to $Ar_8$ in the general formula (3) include phenyl, biphenylyl, terphenylyl, quaterphenyl, styryl, naphthyl, anthracenyl, acenaphthenyl, phenanthrenyl, fluorenyl, indenyl, pyrenyl, perylenyl, fluoranthenyl and triphenylenyl. Further, these groups may have a substituent. Examples of the substituent include the same groups exemplified as the "substituent" in the "substituted aromatic hydrocarbon group", the "substituted aromatic heterocyclic group", or the "substituted condensed polycyclic aromatic group" represented by $Ar_1$ to $Ar_3$ in the general formula (1), and possible embodiments may also be the same embodiments as the exemplified embodiments.

Specific examples of the "aromatic heterocyclic group" in the "substituted or unsubstituted aromatic heterocyclic group" represented by $Ar_9$ in the general formula (3) include triazinyl, pyridyl, pyrimidinyl, furyl, pyrrolyl, thienyl, quinolyl, isoquinolyl, benzofuranyl, benzothienyl, indolyl, carbazolyl, benzoxazolyl, benzothiazolyl, quinoxalinyl, benzoimidazolyl, pyrazolyl, dibenzofuranyl, dibenzothienyl, naphthyridinyl, phenanthrolinyl, acridinyl, and carbolinyl. Further, these groups may have a substituent. Examples of the substituent include the same groups exemplified as the "substituent" in the "substituted aromatic hydrocarbon group", the "substituted aromatic heterocyclic group", or the "substituted condensed polycyclic aromatic group" represented by $Ar_1$ to $Ar_a$ in the general formula (1), and possible embodiments may also be the same embodiments as the exemplified embodiments.

Specific examples of the "linear or branched alkyl of 1 to 6 carbon atoms" represented by $R_{16}$ to $R_{19}$ in the general formula (3) include methyl, ethyl, n-propyl, isopropyl, n-butyl, 2-methylpropyl, tert-butyl, n-pentyl, 3-methylbutyl, tert-pentyl, n-hexyl, iso-hexyl and tert-hexyl.

Specific examples of the "aromatic hydrocarbon group", the "aromatic heterocyclic group", or the "condensed polycyclic aromatic group" in the "substituted or unsubstituted aromatic hydrocarbon group", the "substituted or unsubstituted aromatic heterocyclic group", or the "substituted or unsubstituted condensed polycyclic aromatic group" represented by $R_{16}$ to $R_{19}$ in the general formula (3) include phenyl, biphenylyl, terphenylyl, quaterphenyl, styryl, naphthyl, anthracenyl, acenaphthenyl, phenanthrenyl, fluorenyl, indenyl, pyrenyl, perylenyl, fluoranthenyl, triphenylenyl, triazinyl, pyridyl, pyrimidinyl, furyl, pyrrolyl, thienyl, quinolyl, isoquinolyl, benzofuranyl, benzothienyl, indolyl, carbazolyl, benzoxazolyl, benzothiazolyl, quinoxalinyl, benzoimidazolyl, pyrazolyl, dibenzofuranyl, dibenzothienyl, naphthyridinyl, phenanthrolinyl, acridinyl, and carbolinyl. Further, these groups may have a substituent. Examples of the substituent include the same groups exemplified as the "substituent" in the "substituted aromatic hydrocarbon group", the "substituted aromatic heterocyclic group", or the "substituted condensed polycyclic aromatic group" represented by $Ar_1$ to $Ar_3$ in the general formula (1), and possible embodiments may also be the same embodiments as the exemplified embodiments.

$Ar_1$ to $Ar_3$ in the general formula (1) are preferably the "substituted or unsubstituted aromatic hydrocarbon group", further preferably substituted or unsubstituted phenyl, biphenylyl, terphenylyl, naphthyl, anthracenyl, phenanthrenyl, pyrenyl, or fluorenyl.

$R_1$ to $R_6$ in the general formula (1) are preferably a deuterium atom or the "substituted or unsubstituted aromatic hydrocarbon group", further preferably substituted or unsubstituted phenyl, biphenylyl, naphthyl, or fluorenyl.

In the general formula (1), $r_4$ and $r_5$ each represents an integer of 0 to 4, preferably 0 or 1. In the general formula (1), $r_1$, $r_2$, $r_3$, and $r_6$ each represents an integer of 0 to 3, preferably 0 or 1.

$A_1$ in the general formula (2) is preferably the "divalent group of a substituted or unsubstituted aromatic hydrocarbon" or a single bond, far preferably, a divalent group that results from the removal of two hydrogen atoms from benzene, biphenyl, or naphthalene; or a single bond, particularly preferably a single bond.

$Ar_4$ and $Ar_5$ in the general formula (2) are preferably phenyl, biphenylyl, naphthyl, fluorenyl, indenyl, pyridyl, dibenzofuranyl, pyridobenzofuranyl. $Ar_4$ and $Ar_5$ in the general formula (2) may bind to each other directly or through substituents of these groups, via a single bond, substituted or unsubstituted methylene, an oxygen atom, or a sulfur atom to form a ring.

It is preferable that at least one of $R_7$ to $R_{10}$ in the general formula (2) is a "disubstituted amino group substituted with a group selected from an aromatic hydrocarbon group, an aromatic heterocyclic group, or a condensed polycyclic aromatic group", and the "aromatic hydrocarbon group", the "aromatic heterocyclic group", or the "condensed polycyclic aromatic group" in this case is preferably phenyl, biphenylyl, naphthyl, fluorenyl, indenyl, pyridyl, dibenzofuranyl, or pyridobenzofuranyl.

In the general formula (2), an embodiment where adjacent two or all of $R_7$ to $R_{10}$ are vinyls, and the adjacent two vinyls bind to each other via a single bond to form a condensed ring, that is, to form a naphthalene ring or a phenanthrene ring with the benzene ring binding with $R_7$ to $R_{10}$, is also preferable. In the general formula (2), an embodiment where any one of $R_7$ to $R_{10}$ is the "aromatic hydrocarbon group", and binds to the benzene ring binding with $R_7$ to $R_{10}$, via substituted or unsubstituted methylene, an oxygen atom, or a sulfur atom to form a ring is preferable. In this case, an embodiment where the "aromatic hydrocarbon group" is phenyl, and binds to the benzene ring binding with $R_7$ to $R_{10}$ via an oxygen atom, or a sulfur atom to form a ring, that is, to form a dibenzofuran ring or a dibenzothiophene ring with the benzene ring binding with $R_7$ to $R_{10}$, is particularly preferable.

In the general formula (2), an embodiment where any one of $R_{11}$ to $R_{13}$ is the "aromatic hydrocarbon group", and binds to the benzene ring binding with $R_{11}$ to $R_{13}$ via substituted or unsubstituted methylene, an oxygen atom, or a sulfur atom to form a ring is preferable. In this case, an embodiment where the "aromatic hydrocarbon group" is phenyl, and binds to the benzene ring binding with $R_{11}$ to $R_{13}$ via an oxygen atom, or a sulfur atom to form a ring, that is, to form a dibenzofuran ring or a dibenzothiophene ring with the benzene ring binding with $R_{11}$ to $R_{13}$, is particularly preferable.

In the amine derivative having a condensed ring structure of the general formula (2), as the embodiment where $R_7$ to $R_{13}$ bind to each other to form a ring, or the embodiment where $R_7$ to $R_{13}$ bind to the benzene rings binding with $R_7$ to $R_{13}$ to form a ring, as described above, embodiments of the following general formulae (2a-a), (2a-b), (2b-a), (2b-b), (2b-c), (2b-d), (2c-a), and (2c-b) are preferably used.

[Chemical Formula 4]

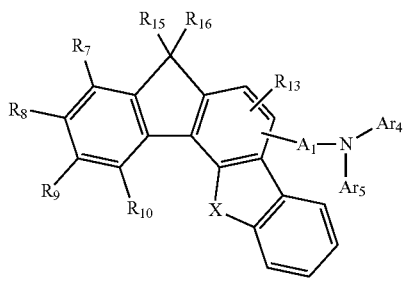

(2a-a)

[Chemical Formula 5]

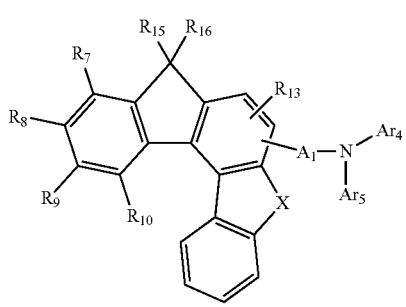

(2a-b)

[Chemical Formula 6]

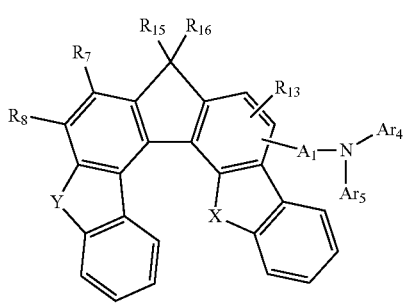

(2b-a)

[Chemical Formula 7]

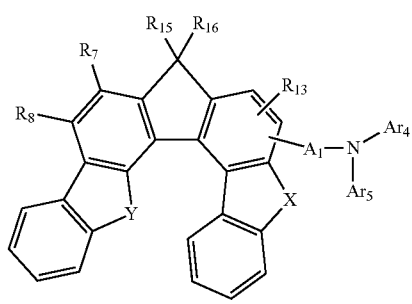

(2b-b)

[Chemical Formula 8]

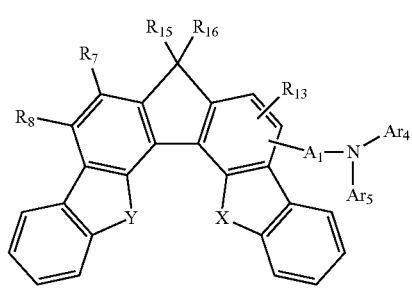

(2b-c)

[Chemical Formula 9]

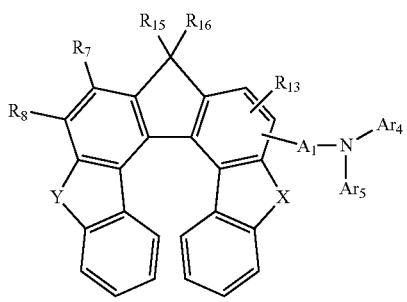

(2b-d)

[Chemical Formula 10]

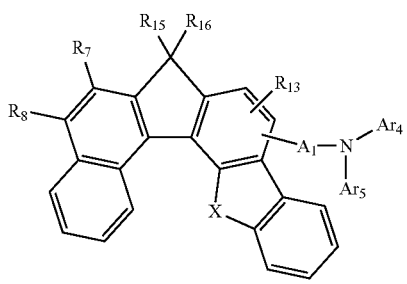

(2c-a)

[Chemical Formula 11]

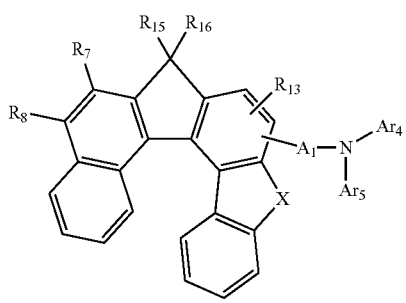

(2c-b)

[Chemical Formula 13]

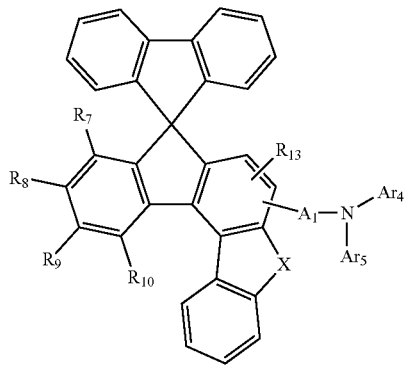

(2a-b1)

In the formulae, X and Y may be the same or different and represent an oxygen atom or a sulfur atom, and $A_1$, $Ar_4$, $Ar_5$, $R_7$ to $R_{10}$, and $R_{13}$ to $R_{15}$ have the same meanings as shown for the general formula (2).

$R_{14}$ and $R_{15}$ in the general formula (2) are preferably the "substituted or unsubstituted aromatic hydrocarbon group", the "substituted or unsubstituted an oxygen-containing aromatic heterocyclic group", or the "substituted or unsubstituted condensed polycyclic aromatic group", further preferably phenyl, naphthyl, phenanthrenyl, pyridyl, quinolyl, isoquinolyl, or dibenzofuranyl, and particularly preferably phenyl.

An embodiment where $R_{14}$ and $R_{15}$ bind to each other via a linking group such as a single bond, substituted or unsubstituted methylene, an oxygen atom, a sulfur atom, or a monosubstituted amino group to form a ring is preferable, and an embodiment where the groups bind to each other via a single bond to form a ring is particularly preferable.

In the amine derivative having a condensed ring structure of the general formula (2), as the embodiment where $R_{14}$ and $R_{15}$ bind to each other to form a ring as described above, embodiments of the following general formulae (2a-a1), (2a-b1), (2b-a1), (2b-b1), (2b-c1), (2b-d1), (2c-a1), and (2c-b1) are preferably used.

[Chemical Formula 12]

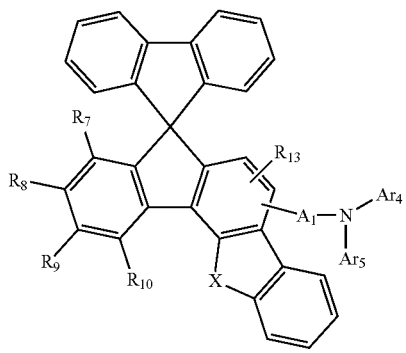

(2a-a1)

[Chemical Formula 14]

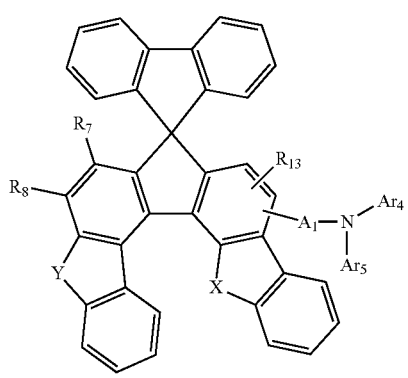

(2b-a1)

[Chemical Formula 15]

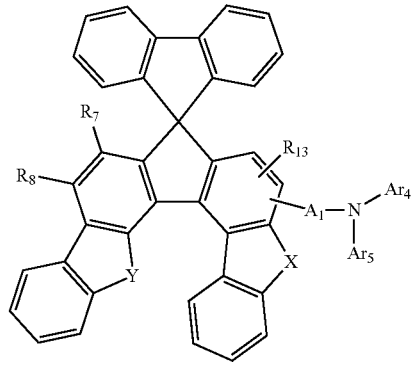

(2b-b1)

[Chemical Formula 16]

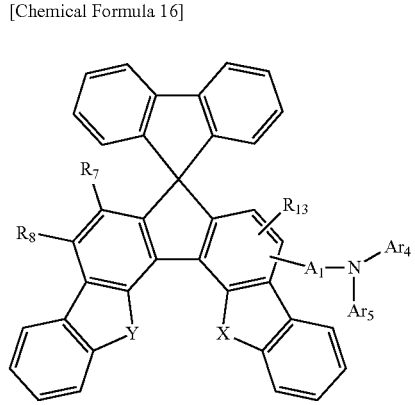

(2b-c1)

-continued

[Chemical Formula 17]

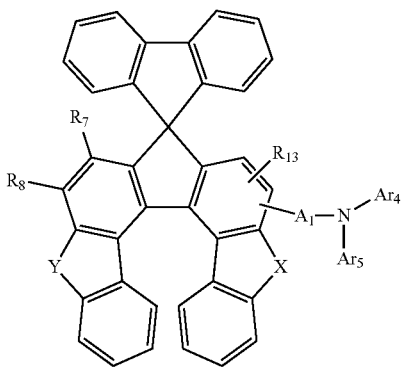

(2b-d1)

[Chemical Formula 18]

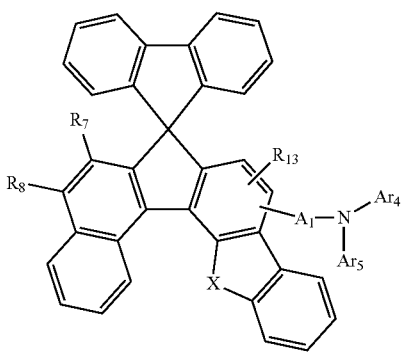

(2c-a1)

[Chemical Formula 19]

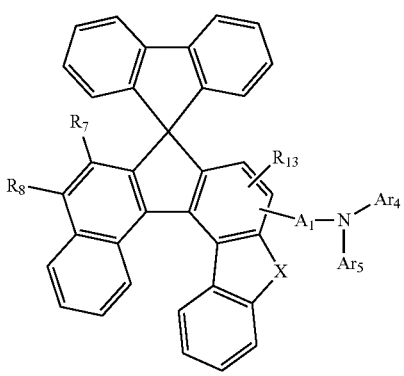

(2c-b1)

In the formulae, X and Y may be the same or different and represent an oxygen atom or a sulfur atom, and $A_1$, $Ar_4$, $Ar_5$, $R_7$ to $R_{10}$, and $R_{13}$ have the same meanings as shown for the general formula (2).

$Ar_6$ in the general formula (3) is preferably phenyl, biphenylyl, naphthyl, anthracenyl, acenaphthenyl, phenanthrenyl, fluorenyl, indenyl, pyrenyl, perylenyl, fluoranthenyl or triphenylenyl, and further preferably phenyl, biphenylyl, naphthyl, anthracenyl, phenanthrenyl, pyrenyl, fluoranthenyl or triphenylenyl. The phenyl group preferably has a substituted or unsubstituted condensed polycyclic aromatic group as a substituent, and further preferably has a substituent selected from naphthyl, anthracenyl, phenanthrenyl, pyrenyl, fluoranthenyl and triphenylenyl. $Ar_7$ in the general formula (3) is preferably phenyl that has a substituent. The substituent of the phenyl in this case is preferably an aromatic hydrocarbon group, such as phenyl, biphenylyl, and terphenyl, or a condensed polycyclic aromatic group, such as naphthyl, anthracenyl, acenaphthenyl, phenanthrenyl, fluorenyl, indenyl, pyrenyl, perylenyl, fluoranthenyl, and triphenylenyl, and further preferably phenyl, naphthyl, anthracenyl, phenanthrenyl, pyrenyl, fluoranthenyl, or triphenylenyl.

$Ar_8$ in the general formula (3) is preferably phenyl that has a substituent. The substituent of the phenyl in this case is preferably an aromatic hydrocarbon group, such as phenyl, biphenylyl, and terphenyl, or a condensed polycyclic aromatic group, such as naphthyl, anthracenyl, acenaphthenyl, phenanthrenyl, fluorenyl, indenyl, pyrenyl, perylenyl, fluoranthenyl, and triphenylenyl, and further preferably phenyl, naphthyl, anthracenyl, phenanthrenyl, pyrenyl, fluoranthenyl, or triphenylenyl.

In the general formula (3), it is preferable that $Ar_6$ and $Ar_7$ are not the same as each other from the viewpoint of thin film stability. When $Ar_6$ and $Ar_7$ are not the same groups, the groups may have different substituents and may be substituted on different positions.

In the general formula (3), $Ar_7$ and $Ar_8$ may be the same groups, but there may be a possibility that the compound is easily crystallized due to the high symmetry of the entire molecule, and from the viewpoint of thin film stability, it is preferable that $Ar_7$ and $Ar_8$ are different each other, and $Ar_7$ and $Ar_8$ are not simultaneously a hydrogen atom.

In the general formula (3), it is preferable that one of $Ar_7$ and $Ar_8$ is a hydrogen atom.

$Ar_9$ in the general formula (3) is preferably a nitrogen-containing heterocyclic group such as triazinyl, pyridyl, pyrimidinyl, pyrrolyl, quinolyl, isoquinolyl, indolyl, carbazolyl, benzoxazolyl, benzothiazolyl, quinoxalinyl, benzoimidazolyl, pyrazolyl, naphthyridinyl, phenanthrolinyl, acridinyl, or carbolinyl, more preferably triazinyl, pyridyl, pyrimidinyl, quinolyl, isoquinolyl, indolyl, quinoxalinyl, benzoimidazolyl, naphthyridinyl, phenanthrolinyl, or acridinyl, particularly preferably pyridyl, pyrimidinyl, quinolyl, isoquinolyl, indolyl, quinoxalinyl, benzoimidazolyl, phenanthrolinyl, or acridinyl.

In the general formula (3), a bonding position of $Ar_9$ in the benzene ring is preferably a meta position with respect to a bonding position of the pyrimidine ring from the viewpoint of stability as a thin film.

Examples of the compound having a pyrimidine ring structure represented by the general formula (3) include compounds having a pyrimidine ring structure of the following general formula (3a) and the general formula (3b) in which a bonding pattern of the substituents is different.

[Chemical Formula 20]

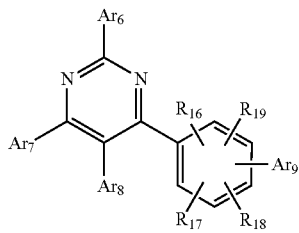

(3a)

In the formula, Ar$_6$ to Ar$_9$ and R$_{16}$ to R$_{19}$ represent the same meanings as described in the above general formula (3).

[Chemical Formula 21]

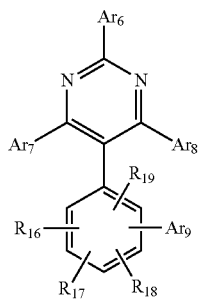

(3b)

In the formula, Ar$_6$ to Ar$_9$ and R$_{16}$ to R$_{19}$ represent the same meanings as described in the above general formula (3).

The carbazole compounds of the general formula (1) for preferred use in the organic EL device of the present invention, can be used as a constitutive material of a hole transport layer or an electron blocking layer of an organic EL device. The carbazole compounds of the general formula (1) have high hole mobility and high electron blocking ability, and are therefore preferred compounds as a material of a hole transport layer or an electron blocking layer.

The amine derivatives of the general formula (2) having a condensed ring structure preferably used in the organic EL device of the present invention can be used as a constitutive material of a light emitting layer of an organic EL device. The compound is excellent in light emission efficiency as compared to the conventional materials, and is a preferred compound as a dopant material for a light emitting layer.

The compounds of the general formula (3) having a pyrimidine ring structure, for preferable use in the organic EL device of the present invention, can be used as a constitutive material of an electron transport layer of an organic EL device.

The compounds of the general formula (3) having a pyrimidine ring structure, excel in electron injection and transport abilities and further excel in stability as a thin film and durability, and are therefore preferred compounds as a material of an electron transport layer.

In the organic EL device of the present invention, materials for an organic EL device having excellent hole and electron injection/transport performances, stability as a thin film, and durability are combined while taking carrier balance that matches the characteristics of a material of a light emitting layer having a specific structure into consideration. Therefore, compared with the conventional organic EL devices, hole transport efficiency to a light emitting layer from a hole transport layer is improved, and electron transport efficiency to a light emitting layer from an electron transport layer is also improved. As a result, luminous efficiency is improved, and also driving voltage is decreased, and thus, durability of the organic EL device can be improved. Thus, an organic EL device having high luminous efficiency and a long lifetime can be attained.

Advantageous Effects of Invention

The organic EL device of the present invention can achieve an organic EL device which can efficiently inject/transport holes into a light emitting layer, and therefore has high efficiency, low driving voltage, and a long lifetime by selecting a carbazole compound having a specific structure, which has excellent hole and electron injection/transport performances, stability as a thin film, and durability, and can effectively exhibit hole injection/transport roles. Further, an organic EL device having high efficiency, low driving voltage, and particularly a long lifetime can be achieved by selecting a carbazole compound having a specific structure, and by combining this compound with a specific electron transport material so as to achieve good carrier balance that matches characteristics of a material of the light emitting layer having a specific structure. According to the present invention, the luminous efficiency and durability of the conventional organic EL devices can be improved.

BRIEF DESCRIPTION OF DRAWINGS

FIG. 1 is a diagram illustrating the configuration of the organic EL devices of Examples 6 to 10 and Comparative Examples 1 to 3.

DESCRIPTION OF EMBODIMENTS

The following presents specific examples of preferred compounds among the carbazole compounds of the general formula (1) preferably used in the organic EL device of the present invention. The present invention, however, is not restricted to these compounds.

[Chemical Formula 22]
(1-1)
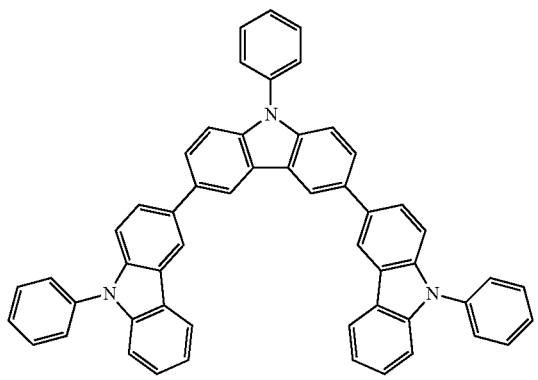
[Chemical Formula 23]
(1-2)
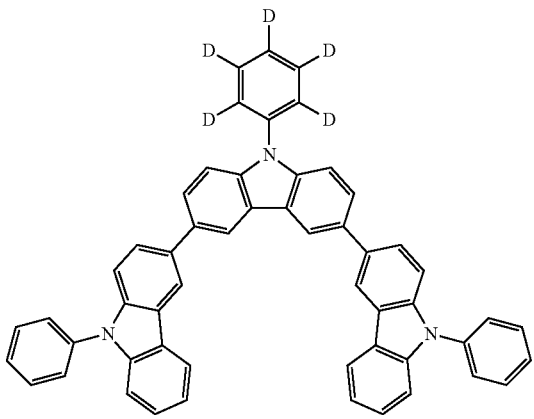
[Chemical Formula 24]
(1-3)
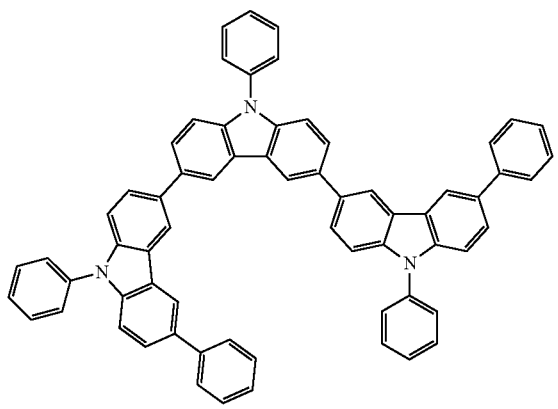
[Chemical Formula 25]
(1-4)
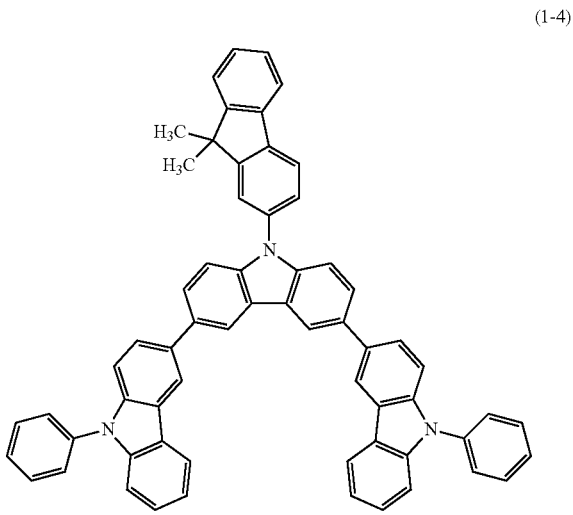
[Chemical Formula 26]
(1-7)
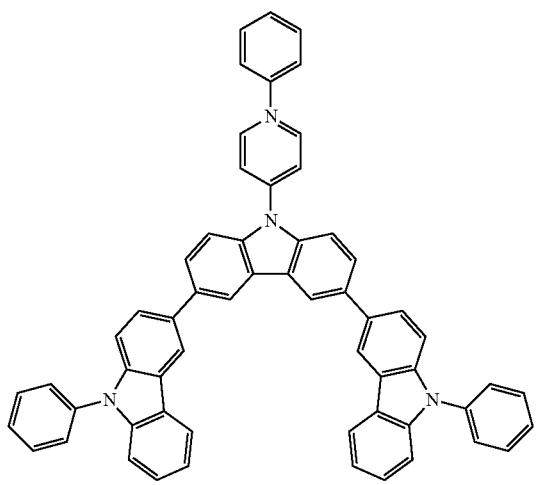
[Chemical Formula 27]
(1-6)
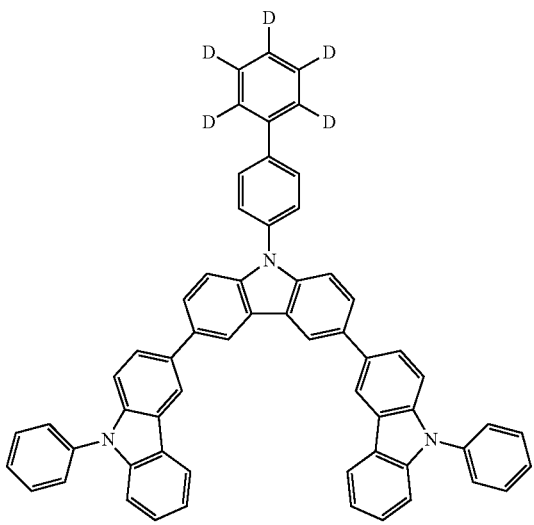

[Chemical Formula 28]
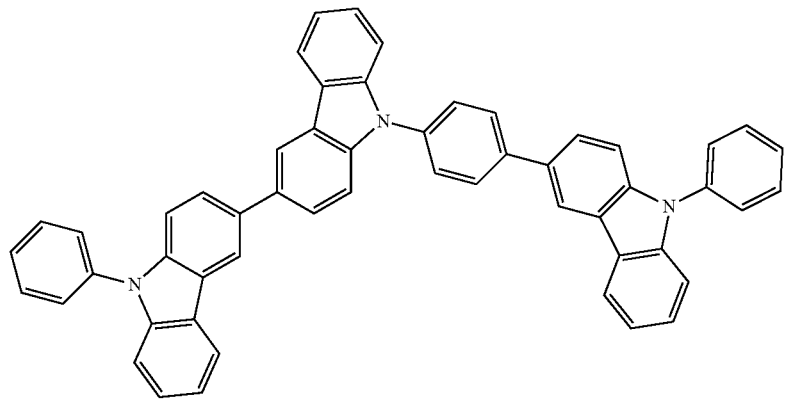
(1-7)
[Chemical Formula 29]
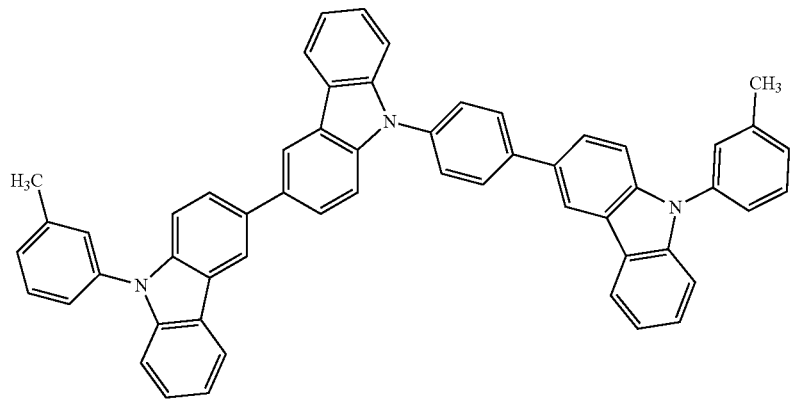
(1-8)
[Chemical Formula 30]
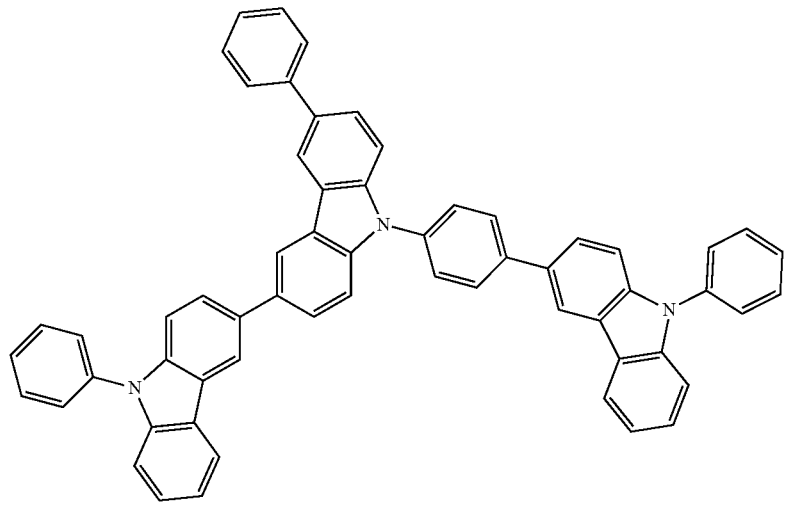
(1-9)

[Chemical Formula 31]
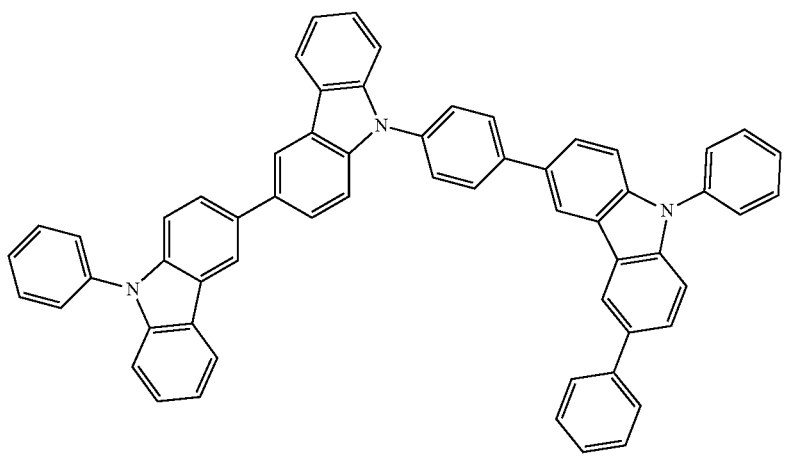
(1-10)
[Chemical Formula 32]
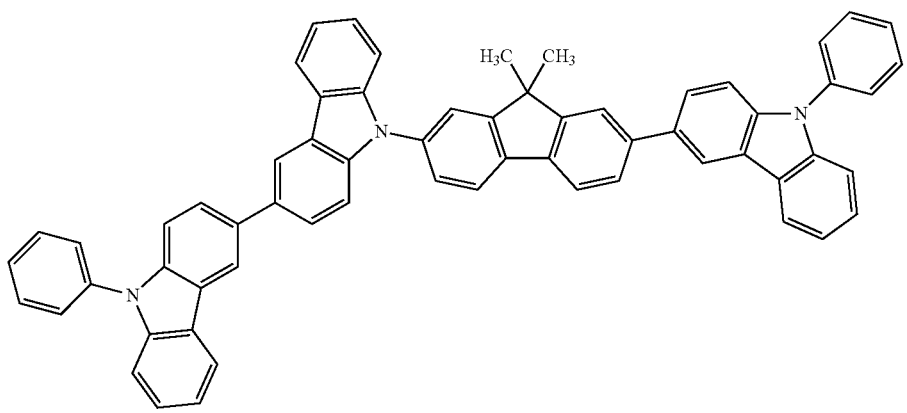
(1-11)
[Chemical Formula 33]
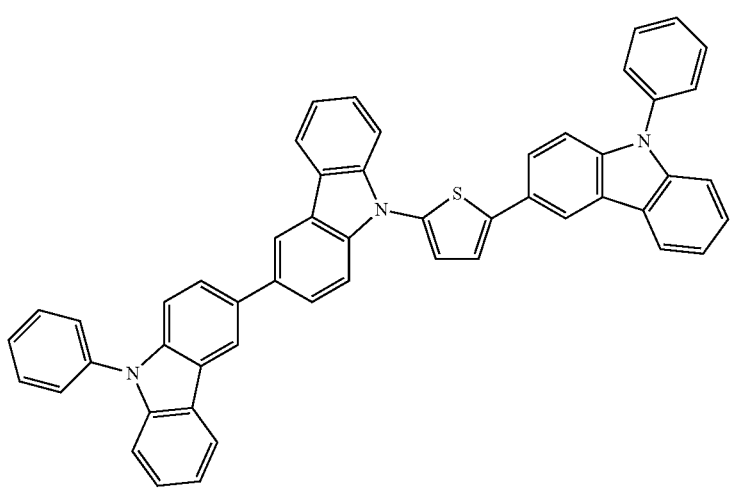
(1-12)

[Chemical Formula 34]
(1-13)
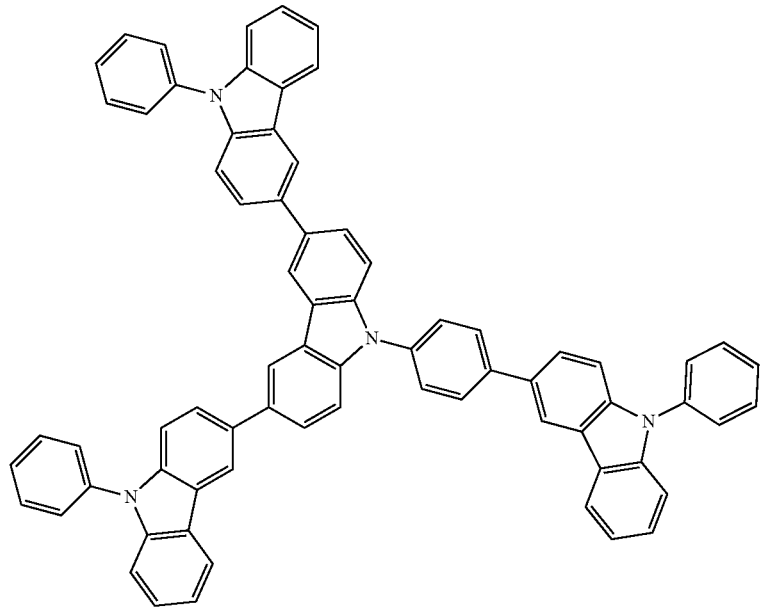
[Chemical Formula 35]
(1-14)
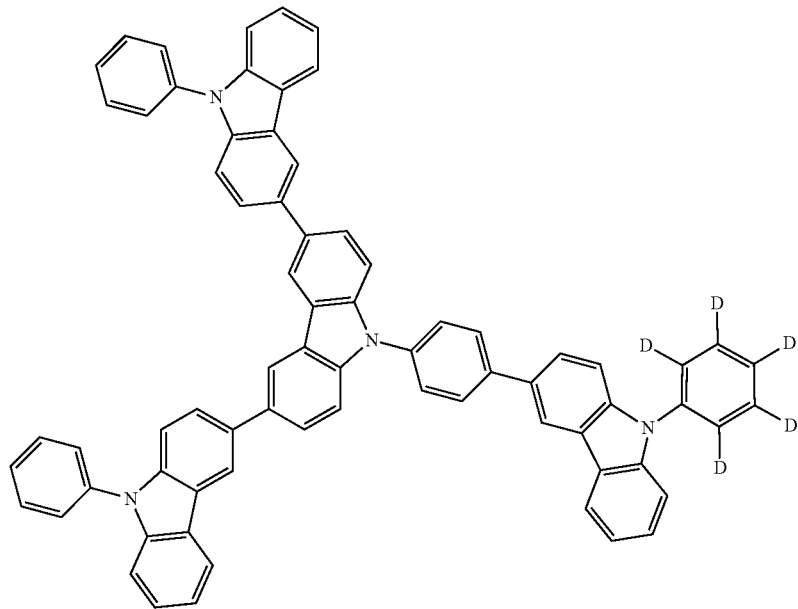

[Chemical Formula 36]
(1-15)
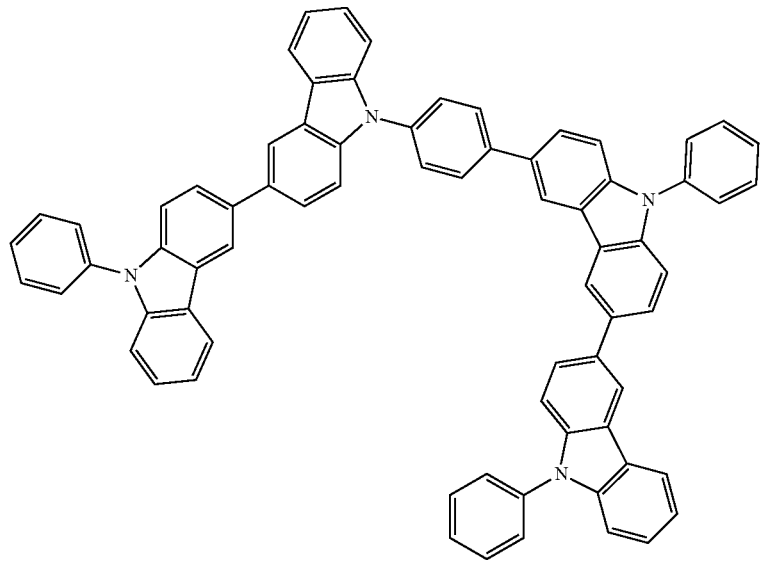
[Chemical Formula 37]
(1-16)
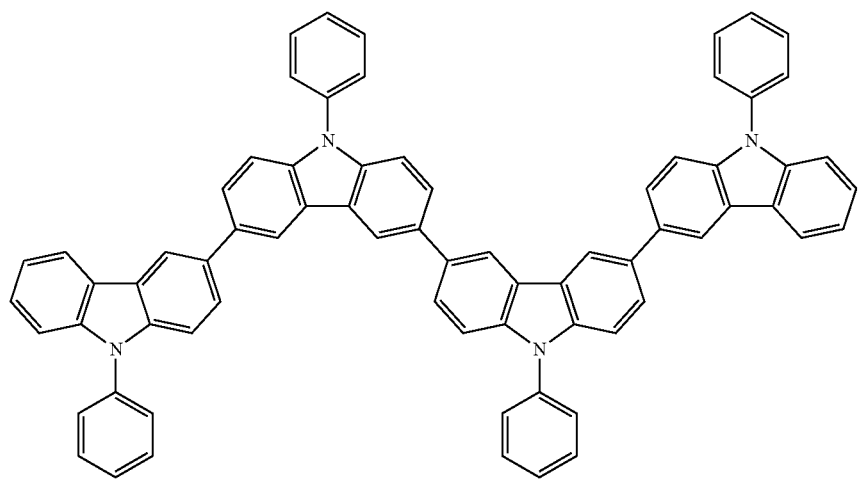

[Chemical Formula 38]
(1-17)
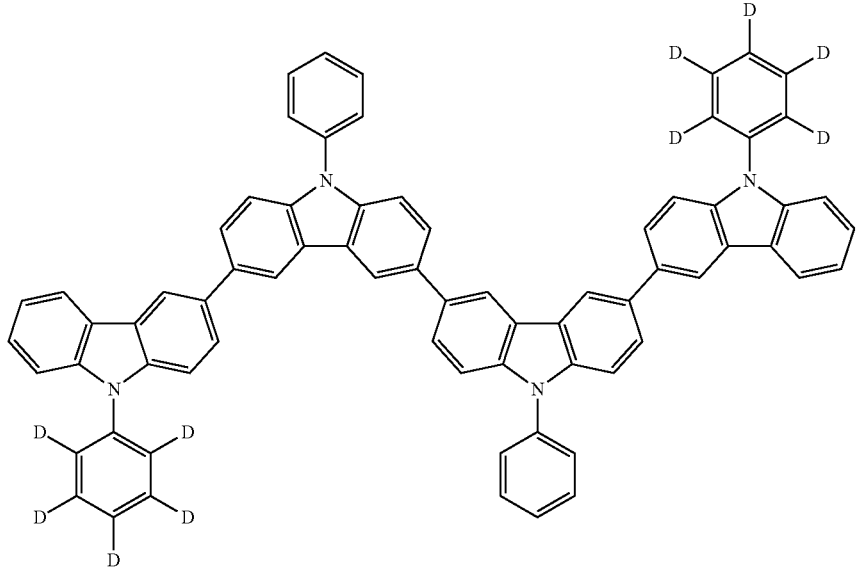
The following presents specific examples of preferred compounds among the amine derivatives having a condensed ring structure of the general formula (2) preferably used in the organic EL device of the present invention. The present invention, however, is not restricted to these compounds.
[Chemical Formula 39]
(2-1)
[Chemical Formula 40]
(2-2)
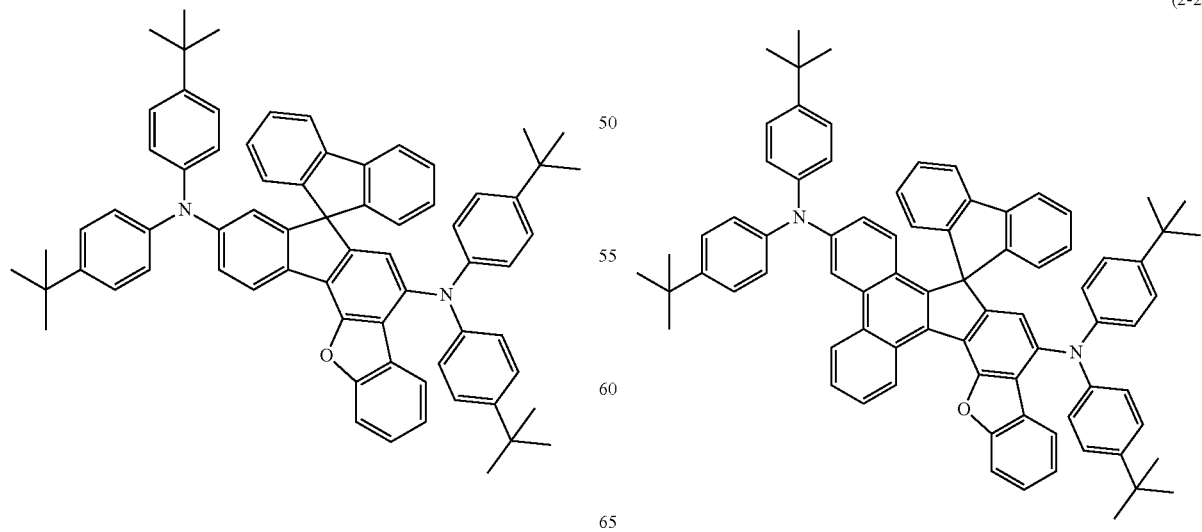

[Chemical Formula 41]
(2-3)
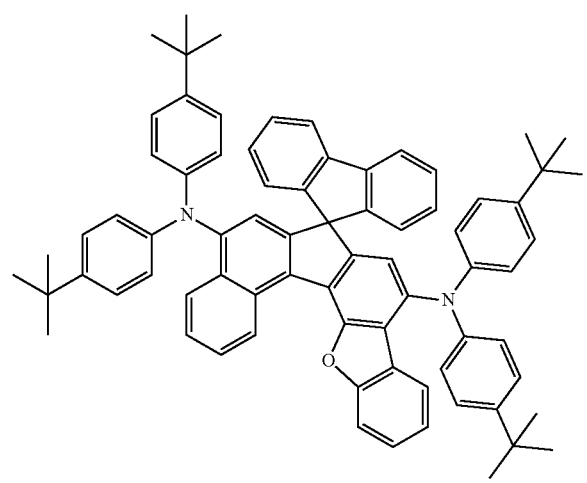
[Chemical Formula 42]
(2-4)
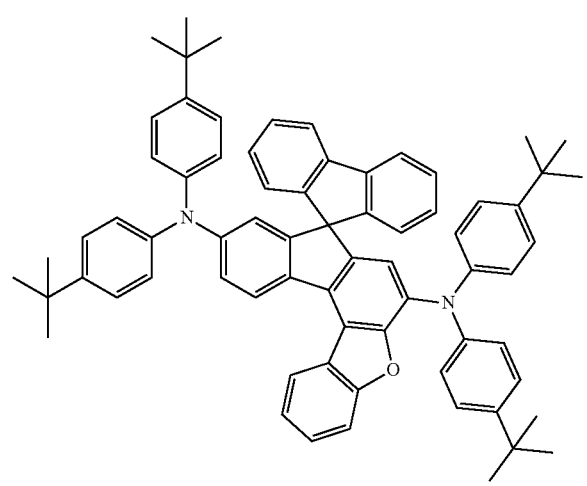
[Chemical Formula 43]
(2-5)
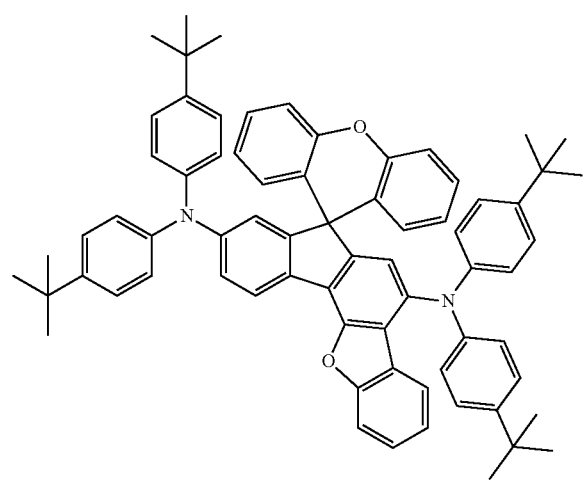
[Chemical Formula 44]
(2-6)
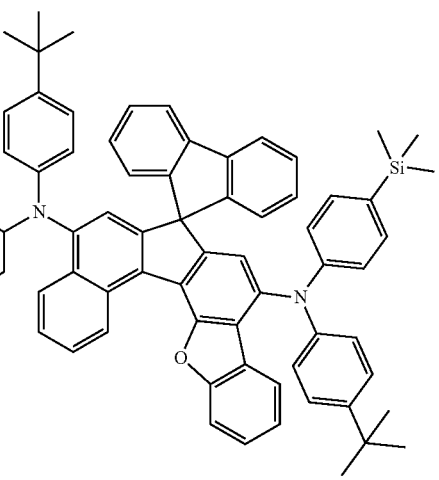
[Chemical Formula 45]
(2-7)
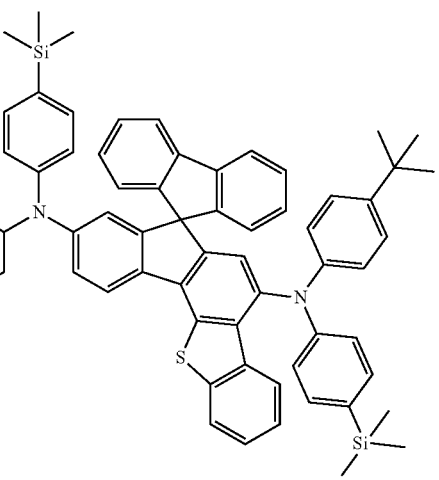
[Chemical Formula 46]
(2-8)

-continued
[Chemical Formula 47]
(2-9)
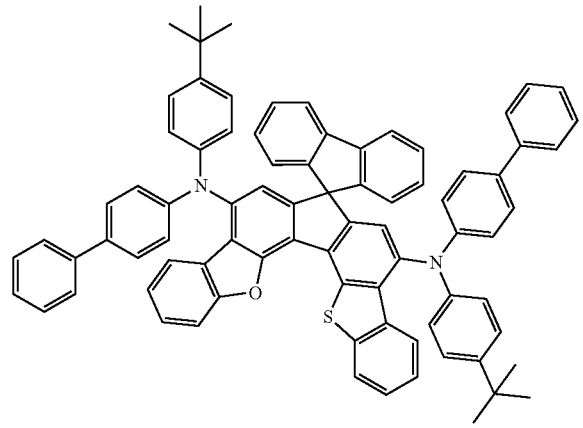
[Chemical Formula 48]
(2-10)
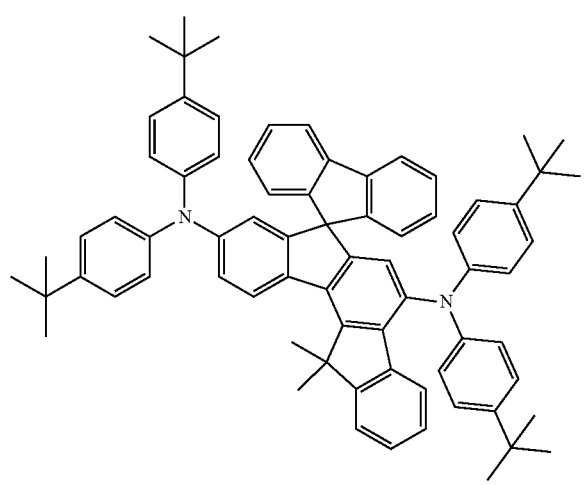
[Chemical Formula 49]
(2-11)
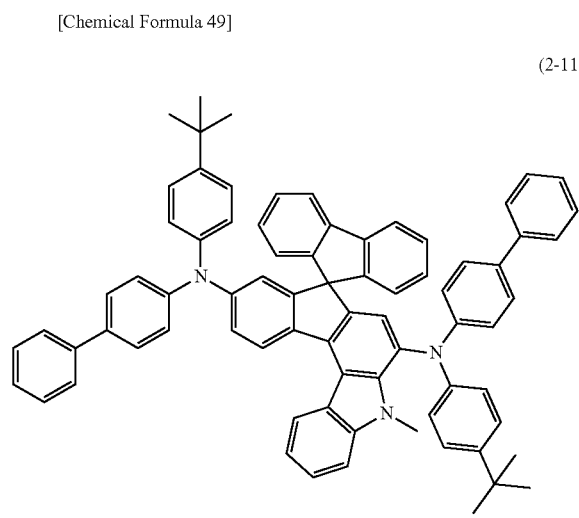
-continued
[Chemical Formula 50]
(2-12)
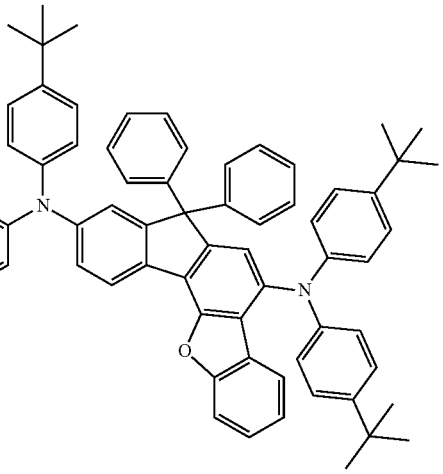
[Chemical Formula 51]
(2-13)
[Chemical Formula 52]
(2-14)
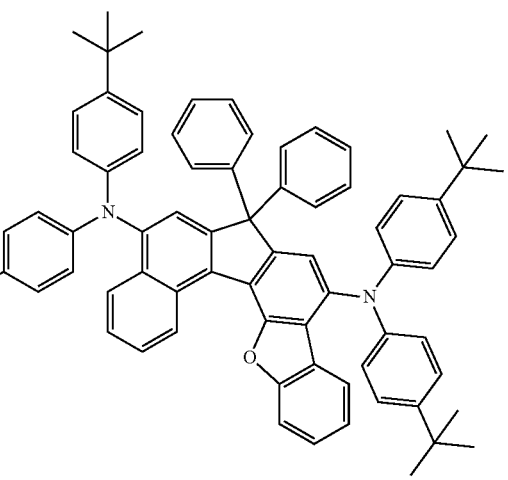

-continued
[Chemical Formula 53]
(2-15)
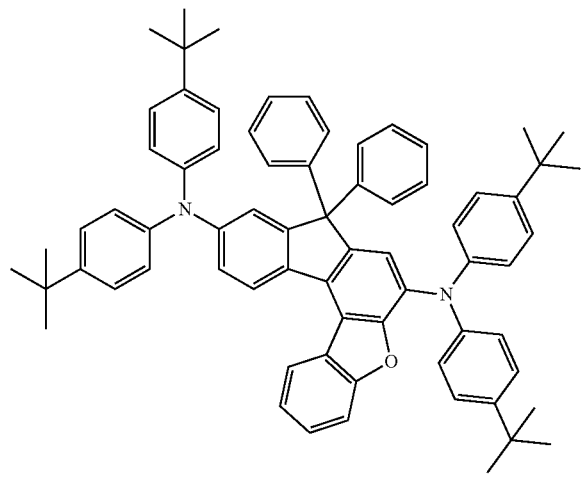
[Chemical Formula 54]
(2-16)
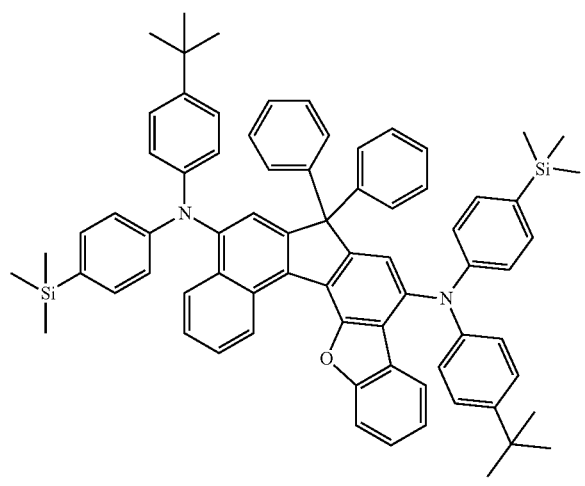
[Chemical Formula 55]
(2-17)
[Chemical Formula 56]
(2-18)
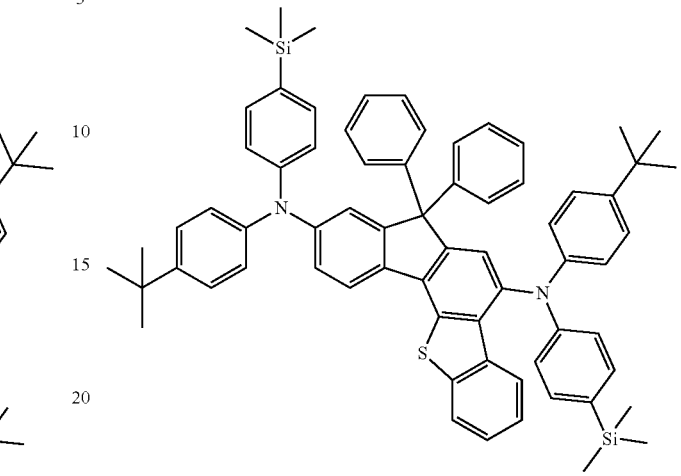
[Chemical Formula 57]
(2-19)
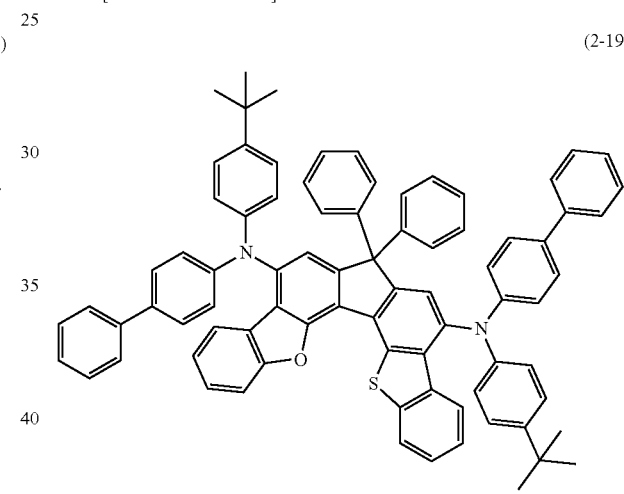
[Chemical Formula 58]
(2-20)

-continued

[Chemical Formula 59]

(2-21)

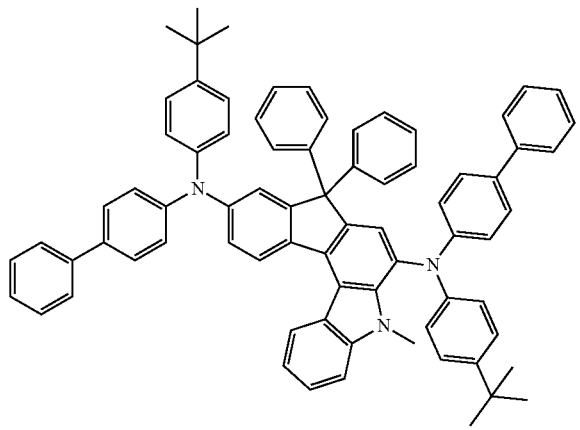

[Chemical Formula 60]

(3-1)

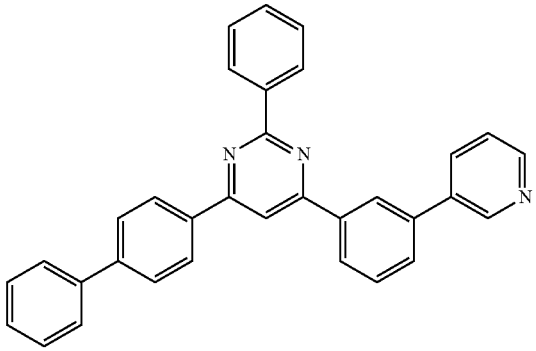

[Chemical Formula 61]

(3-2)

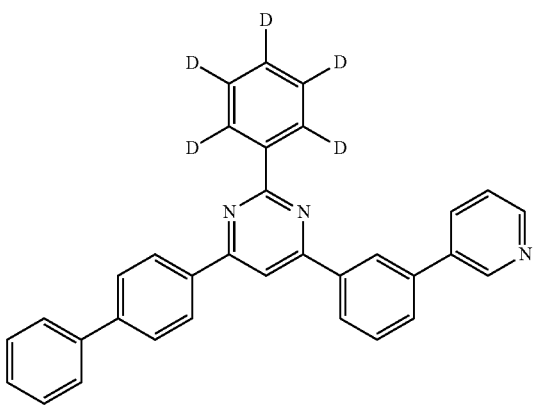

-continued

[Chemical Formula 62]

(3-3)

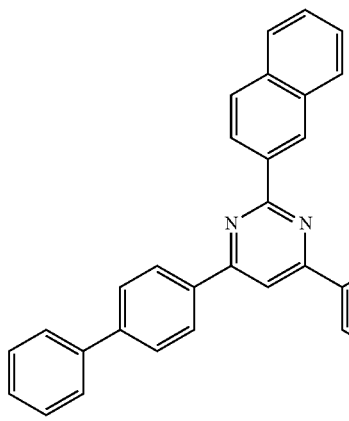

[Chemical Formula 63]

(3-4)

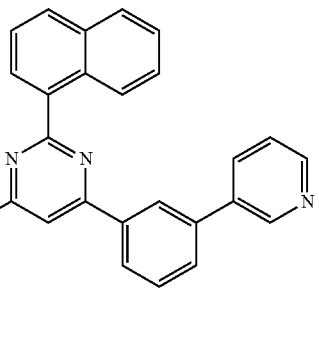

[Chemical Formula 64]

(3-5)

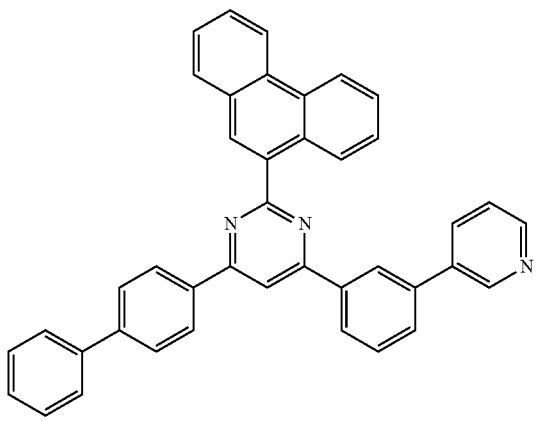

The amine derivatives having a condensed ring structure described above can be synthesized by a known method (refer to PTL 6, for example).

The following presents specific examples of preferred compounds among the compounds having a pyrimidine ring structure of the general formula (3) preferably used in the organic EL device of the present invention. The present invention, however, is not restricted to these compounds.

[Chemical Formula 65]
(3-6)
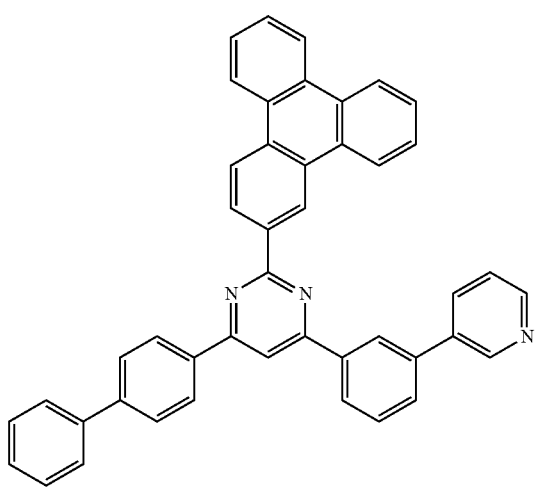
[Chemical Formula 66]
(3-7)
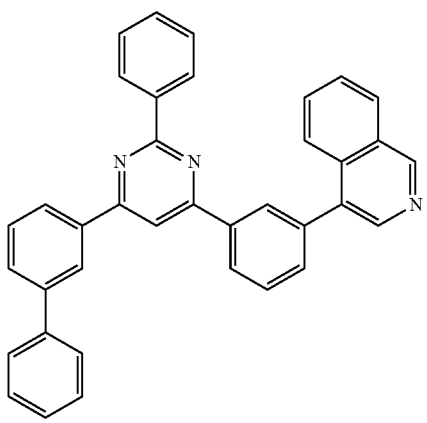
[Chemical Formula 67]
(3-8)
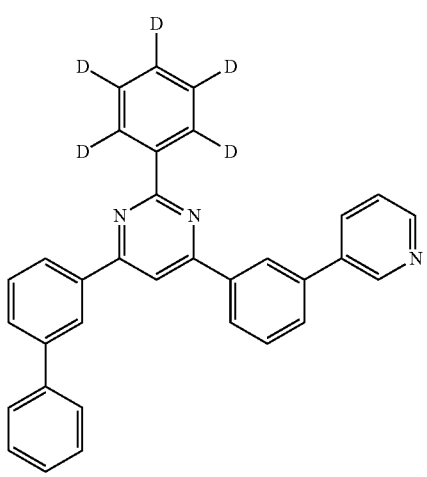
[Chemical Formula 68]
(3-9)
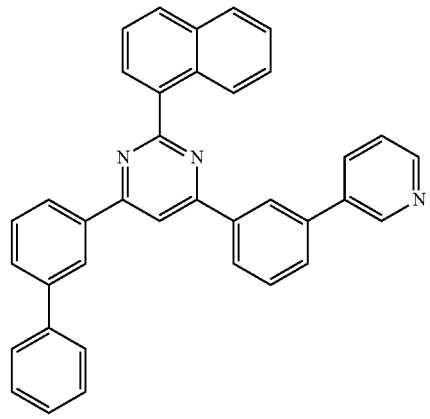
[Chemical Formula 69]
(3-10)
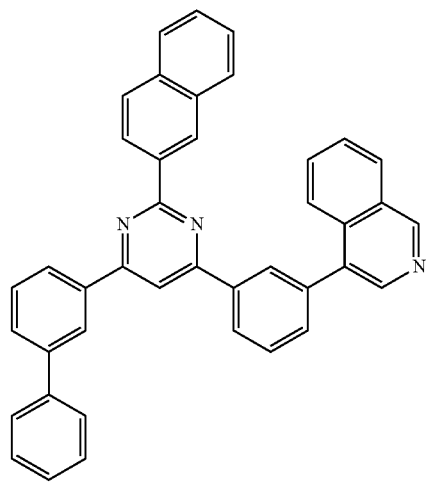
[Chemical Formula 70]
(3-11)
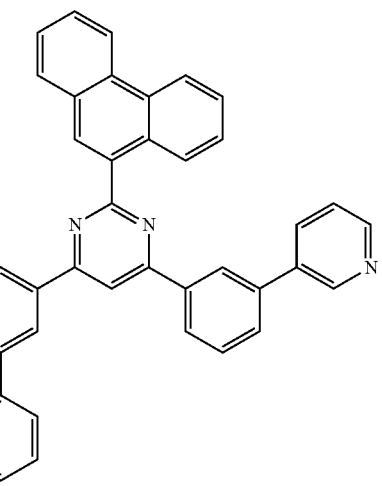

[Chemical Formula 71]
(3-12)
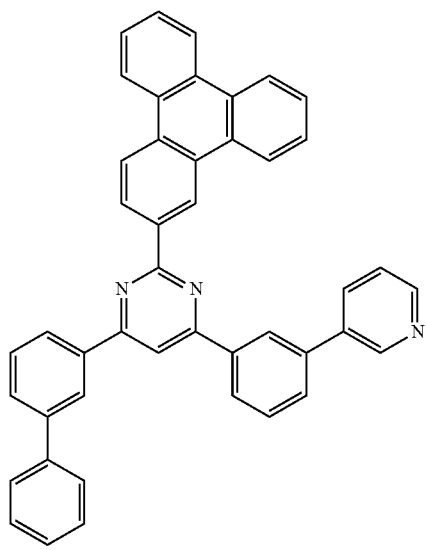
[Chemical Formula 72]
(3-13)
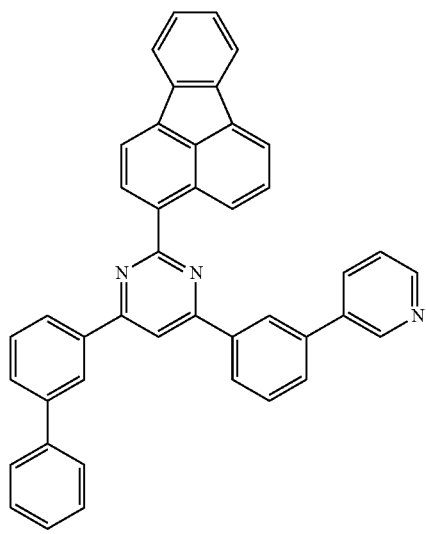
[Chemical Formula 73]
(3-14)
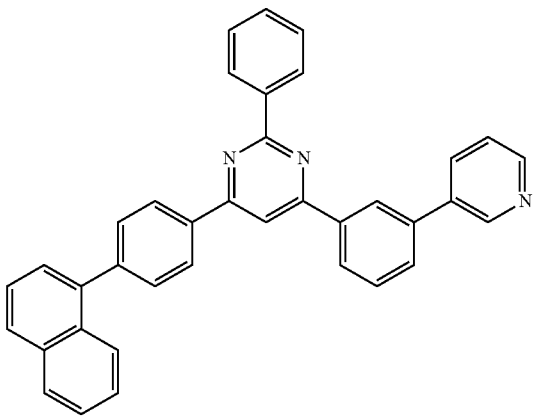
[Chemical Formula 74]
(3-15)
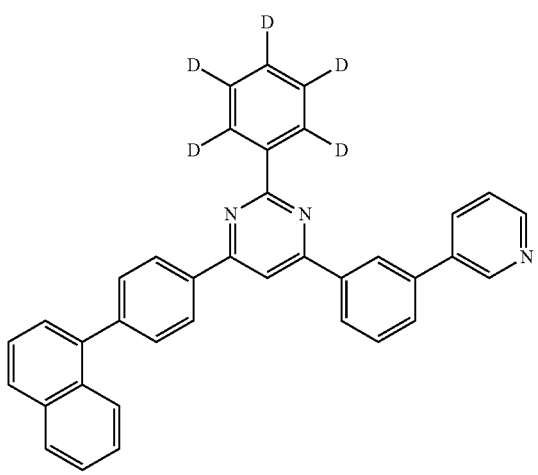
[Chemical Formula 75]
(3-16)
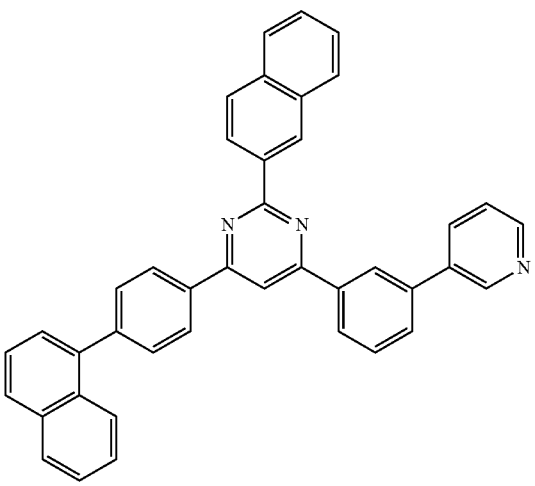
[Chemical Formula 76]
(3-17)

[Chemical Formula 77]
(3-18)
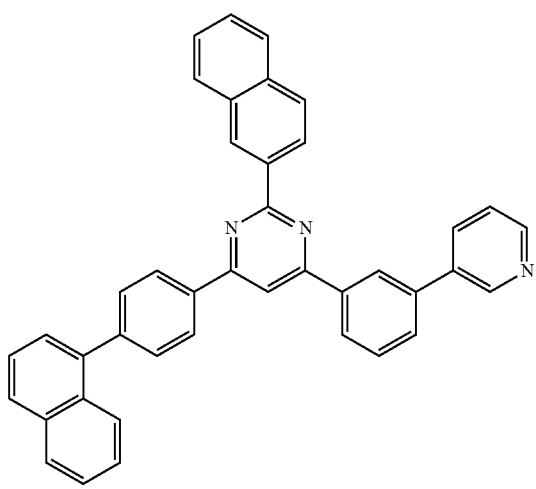
[Chemical Formula 78]
(3-19)
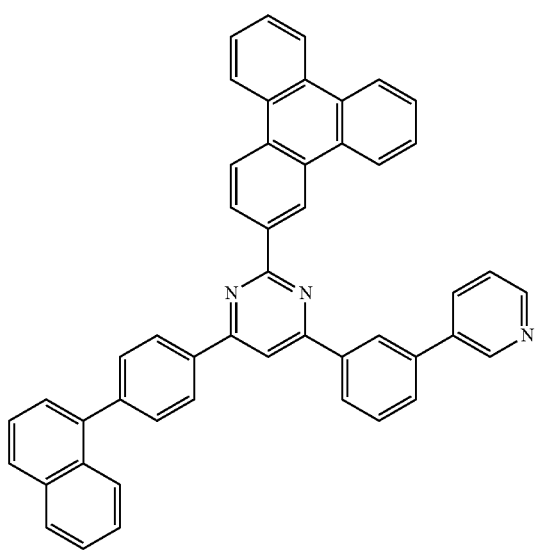
[Chemical Formula 79]
(3-20)
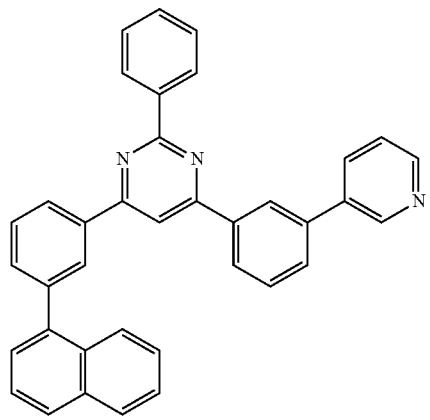
[Chemical Formula 80]
(3-21)
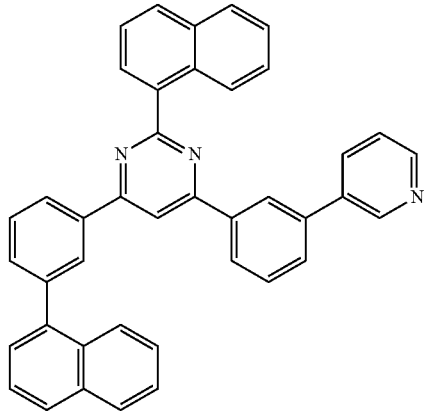
[Chemical Formula 81]
(3-22)
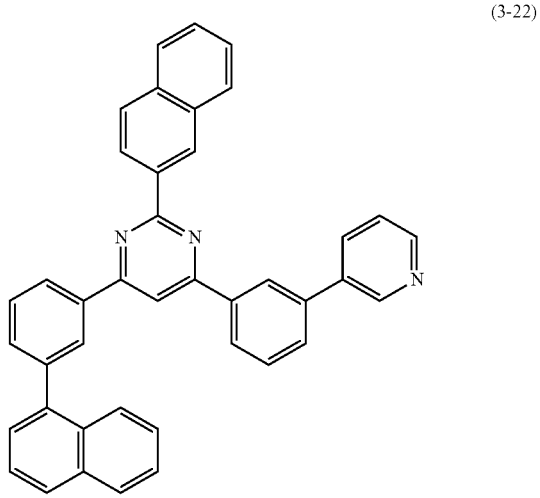
[Chemical Formula 82]
(3-23)
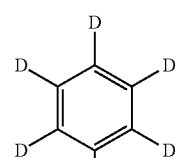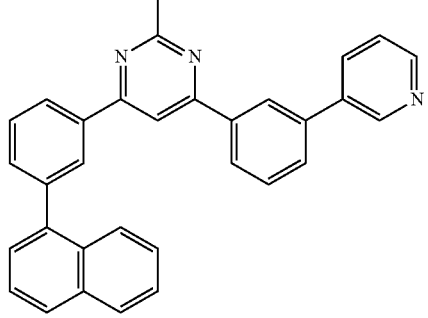

[Chemical Formula 83]
(3-24)
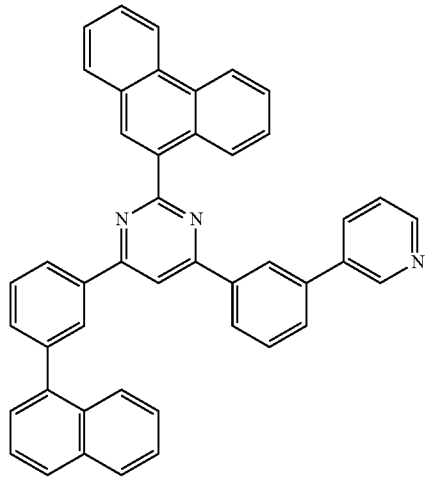
[Chemical Formula 84]
(3-25)
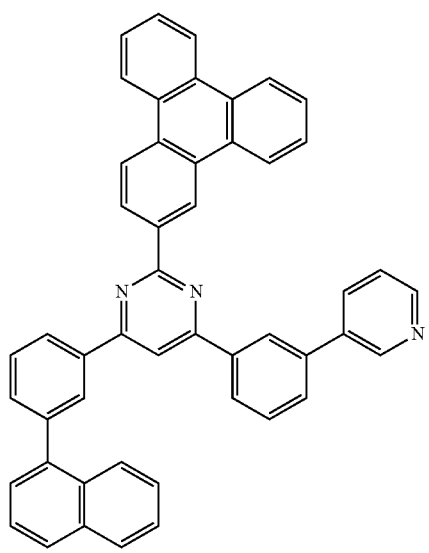
[Chemical Formula 85]
(3-26)
[Chemical Formula 86]
(3-27)
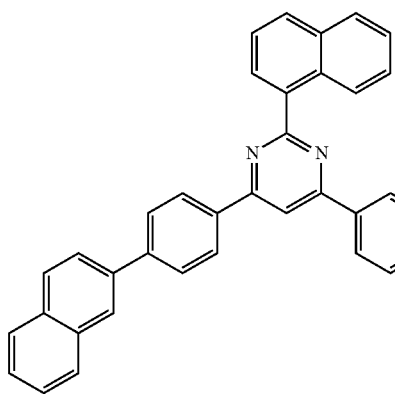
[Chemical Formula 87]
(3-28)
[Chemical Formula 88]
(3-29)
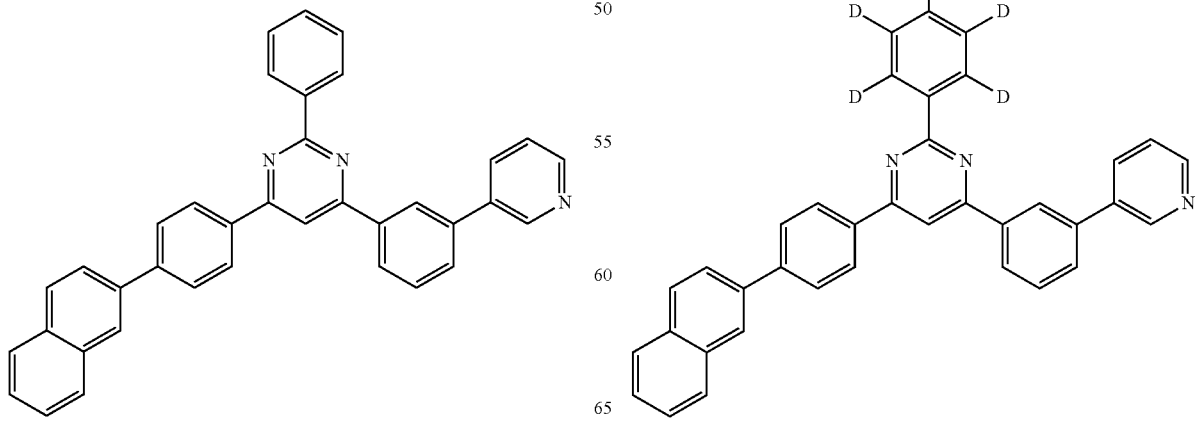

[Chemical Formula 89]
(3-30)
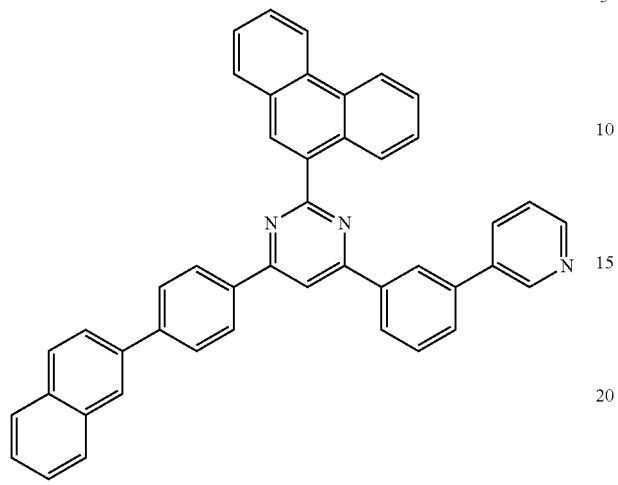
[Chemical Formula 90]
(3-31)
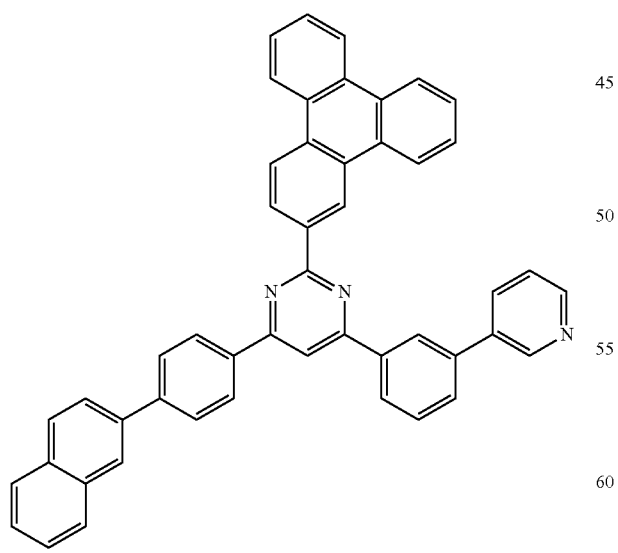
[Chemical Formula 91]
(3-32)
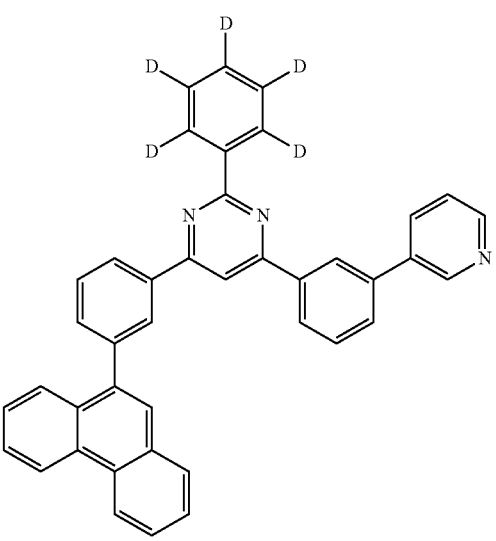
[Chemical Formula 92]
(3-33)

[Chemical Formula 93]
(3-34)
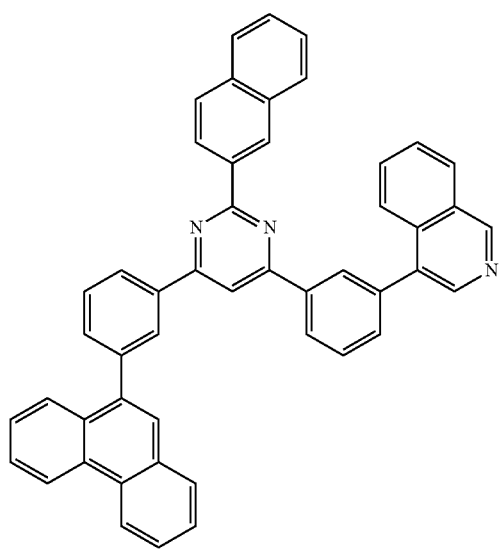
[Chemical Formula 94]
(3-35)
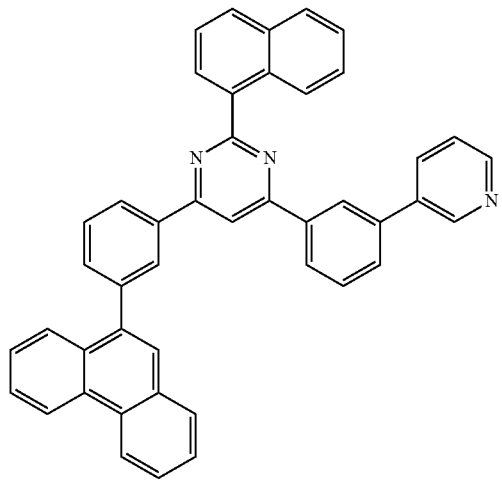
[Chemical Formula 95]
(3-36)
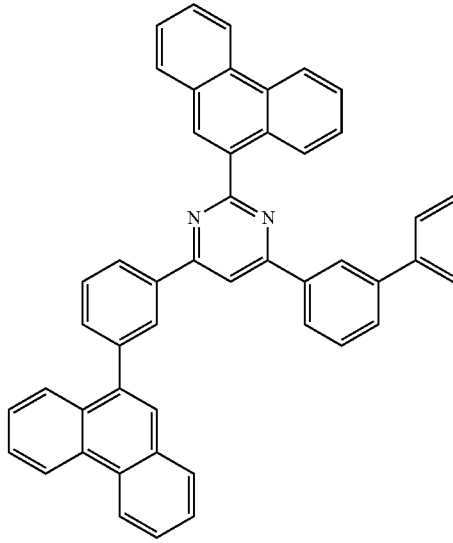
[Chemical Formula 96]
(3-37)
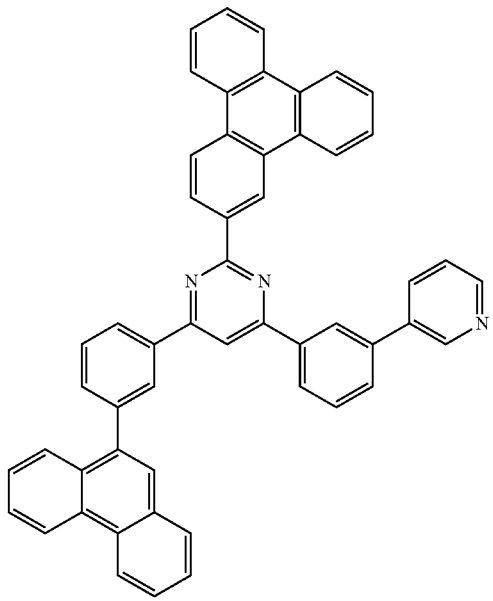

[Chemical Formula 97]
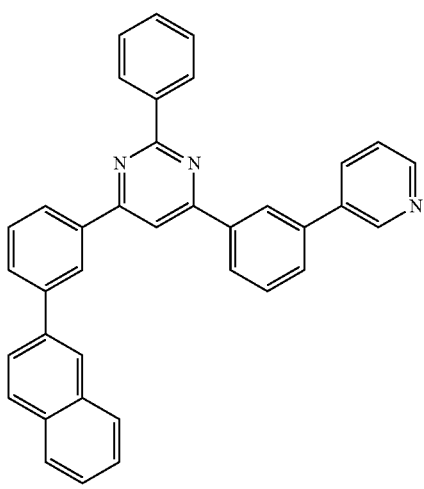
(3-38)
[Chemical Formula 98]
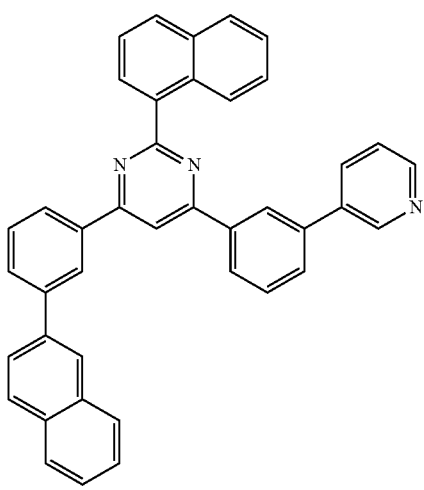
(3-39)
[Chemical Formula 99]
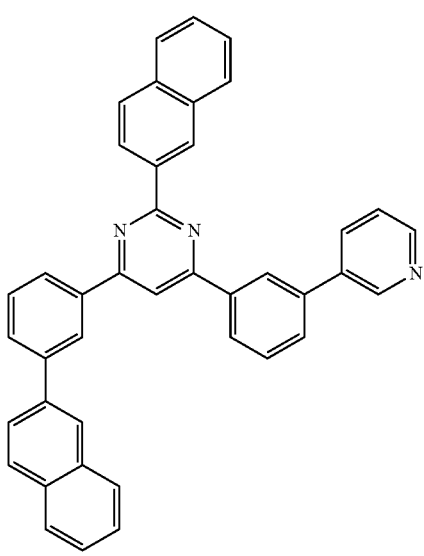
(3-40)
[Chemical Formula 100]
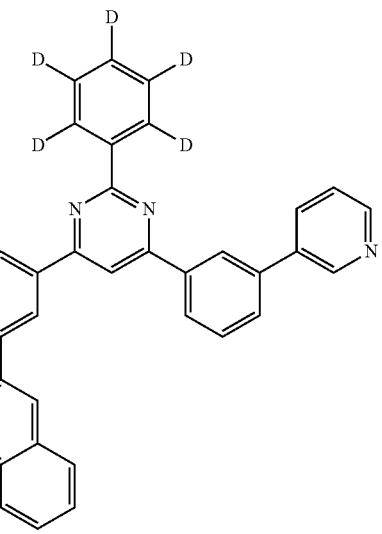
(3-41)
[Chemical Formula 101]
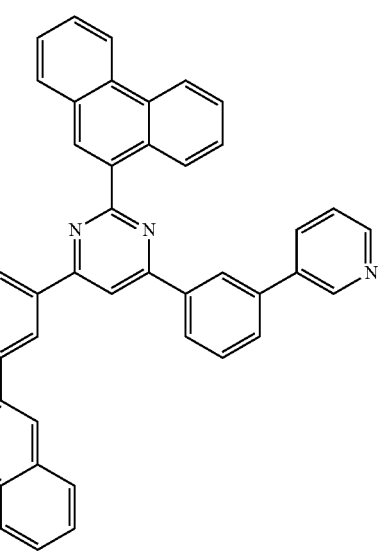
(3-42)

[Chemical Formula 102]
(3-43)
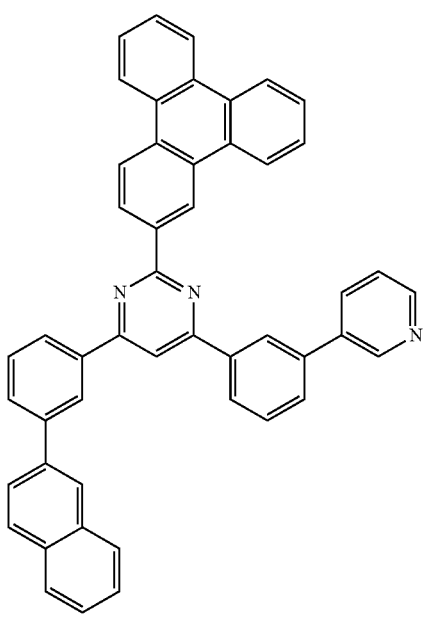
[Chemical Formula 103]
(3-44)
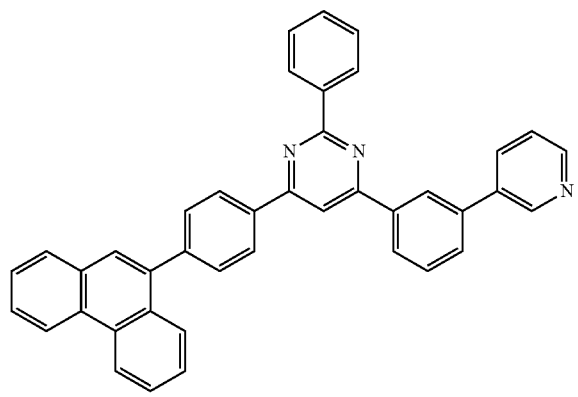
[Chemical Formula 104]
(3-45)
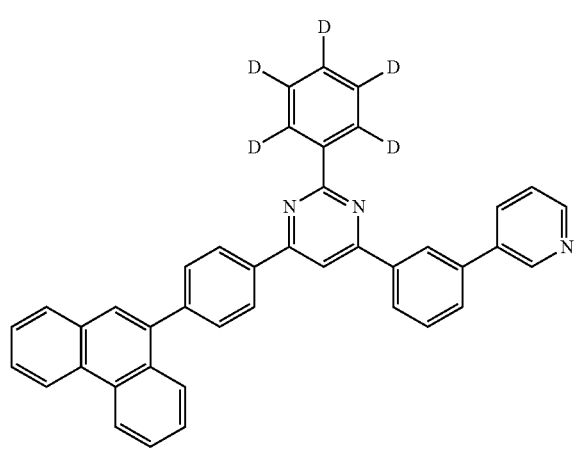
[Chemical Formula 105]
(3-46)
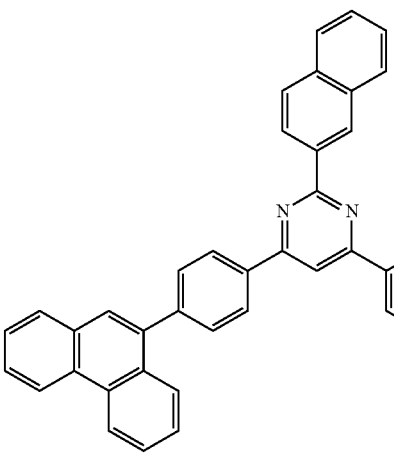
[Chemical Formula 106]
(3-47)
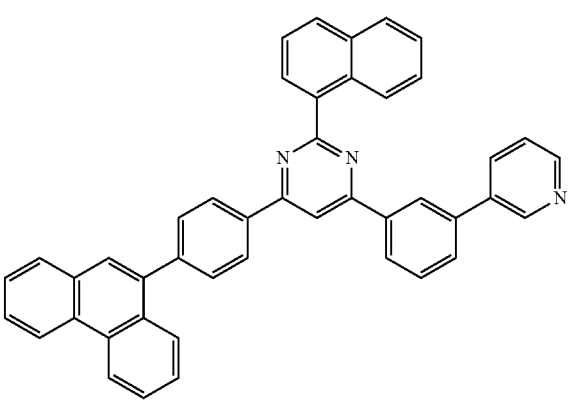
[Chemical Formula 107]
(3-48)
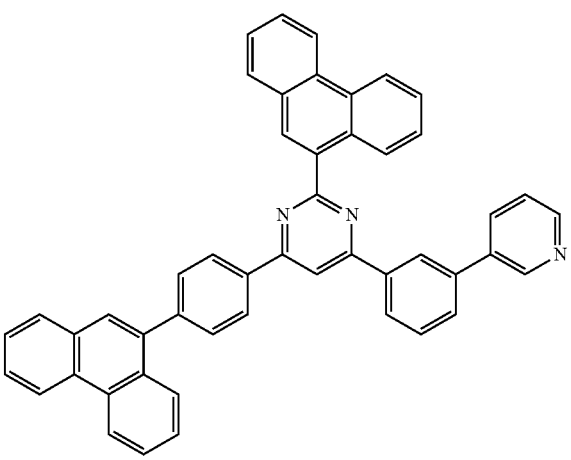

[Chemical Formula 108]
(3-49)
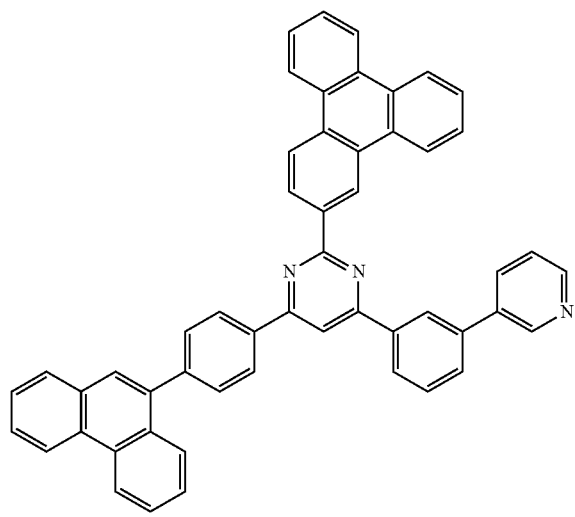
[Chemical Formula 109]
(3-50)
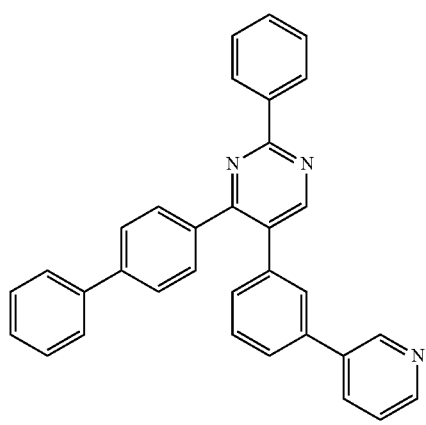
[Chemical Formula 110]
(3-51)
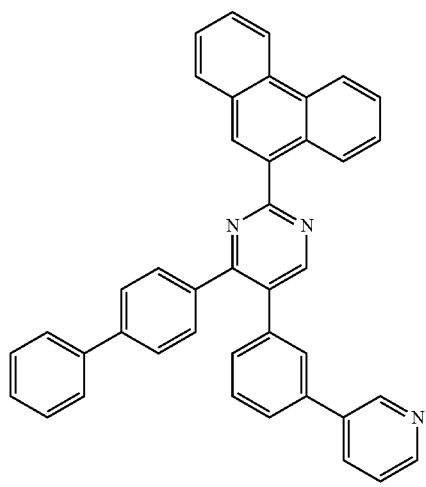
[Chemical Formula 111]
(3-52)
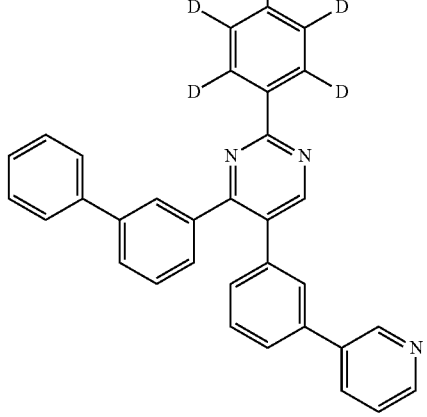
[Chemical Formula 112]
(3-53)
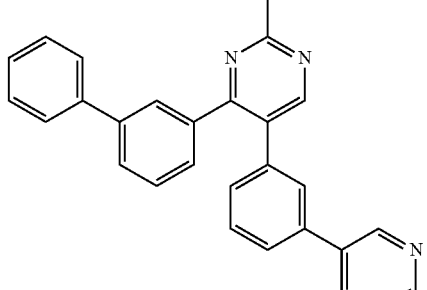
[Chemical Formula 113]
(3-54)
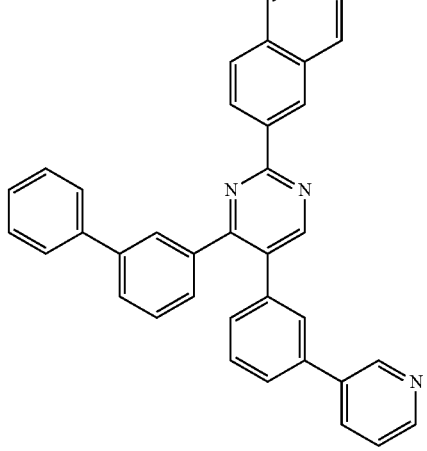

-continued
[Chemical Formula 114]
(3-55)
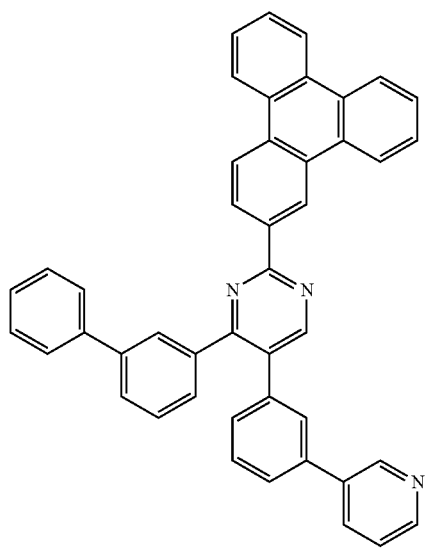
[Chemical Formula 115]
(3-56)
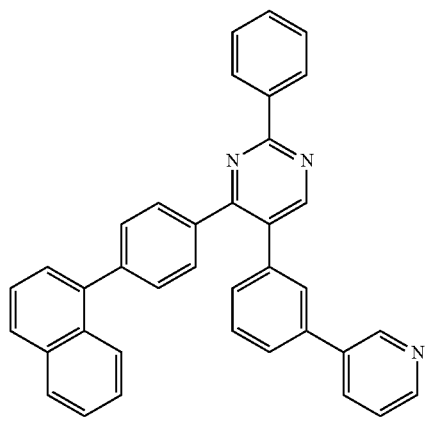
[Chemical Formula 116]
(3-57)
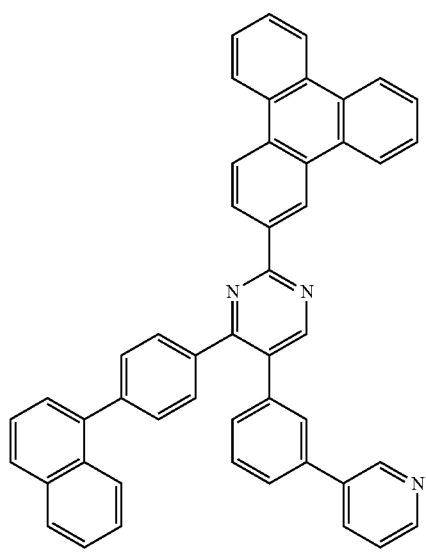
-continued
[Chemical Formula 117]
(3-58)
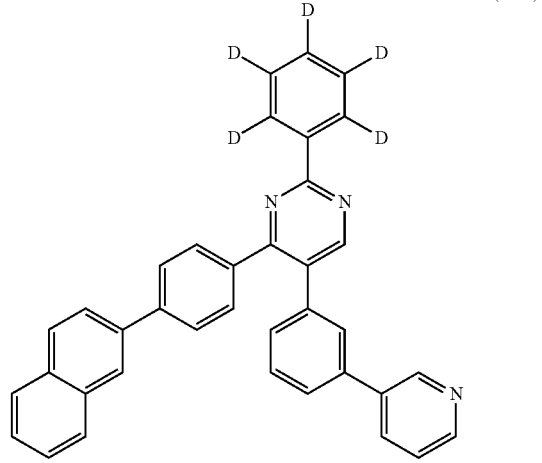
[Chemical Formula 118]
(3-59)
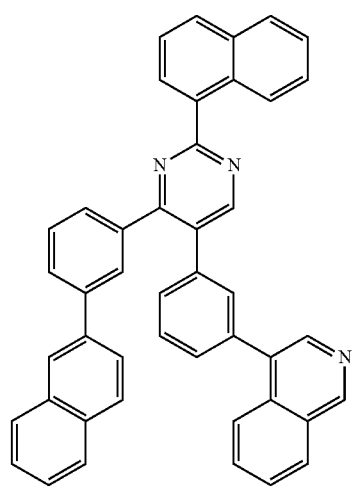
[Chemical Formula 119]
(3-60)
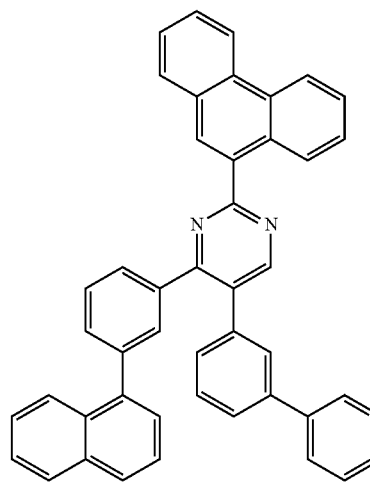

[Chemical Formula 120]
(3-61)
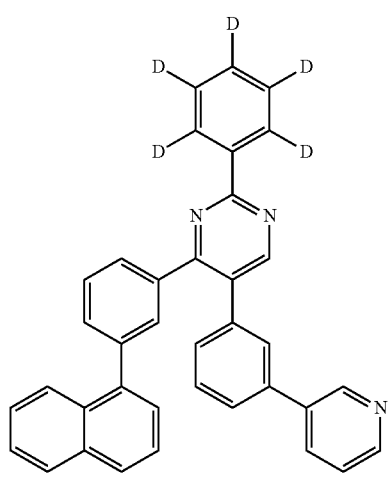
[Chemical Formula 121]
(3-62)
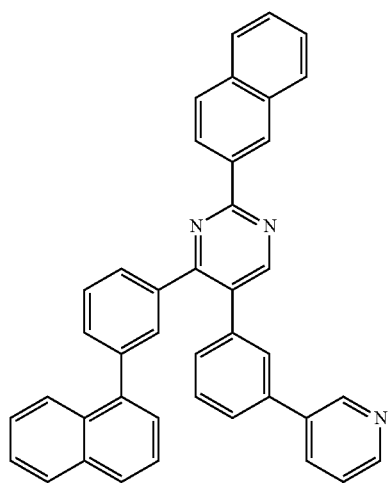
[Chemical Formula 122]
(3-63)
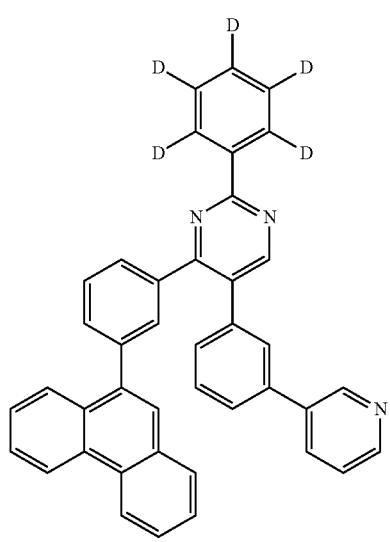
[Chemical Formula 123]
(3-64)
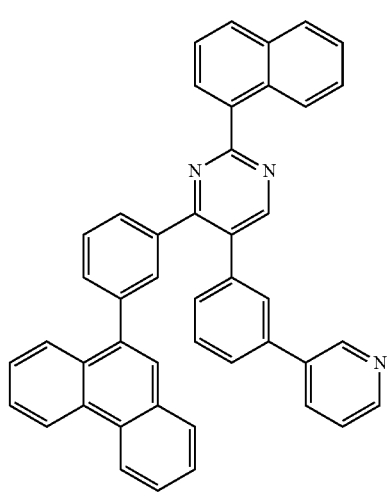
[Chemical Formula 124]
(3-65)
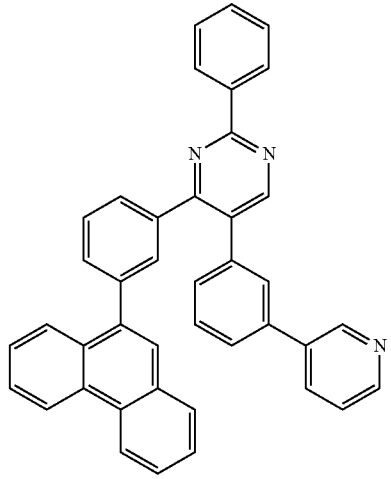
[Chemical Formula 125]
(3-66)
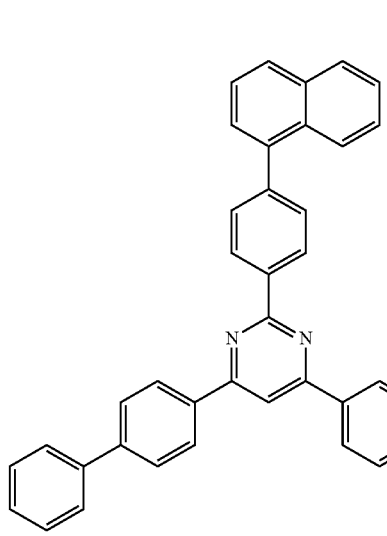

[Chemical Formula 126]
(3-67)
[Chemical Formula 127]
(3-68)
[Chemical Formula 128]
(3-69)
[Chemical Formula 129]
(3-70)
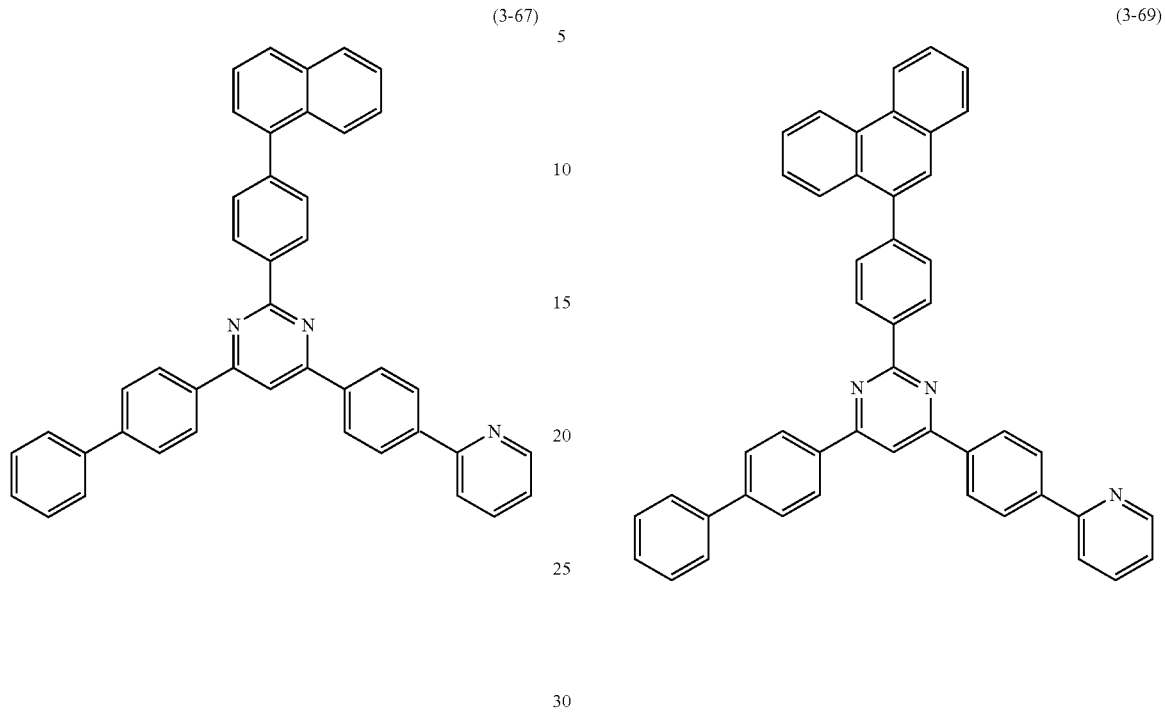
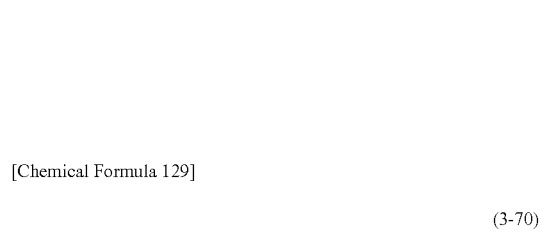
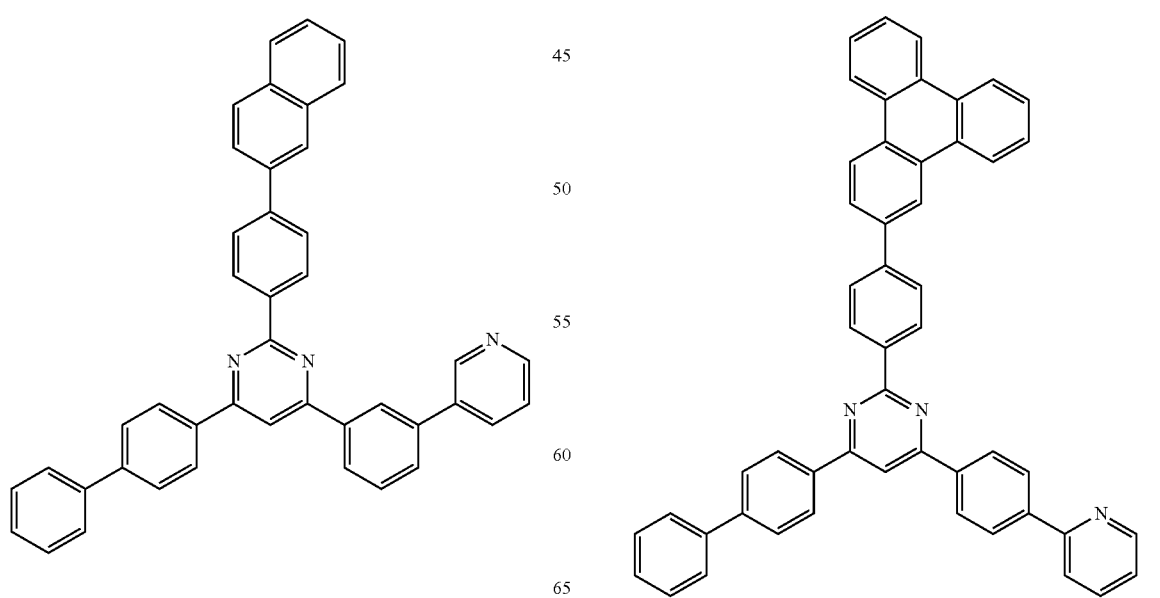

[Chemical Formula 130]
(3-71)
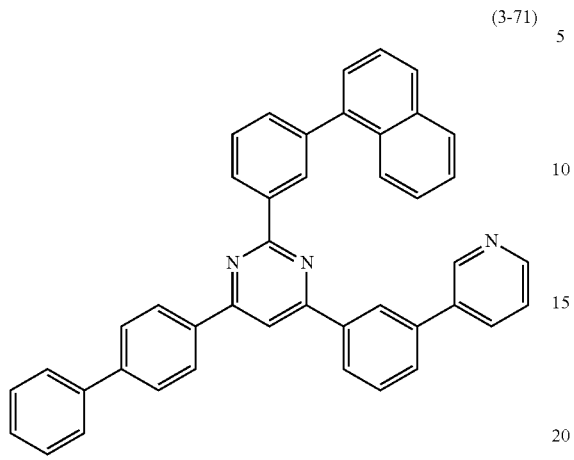
[Chemical Formula 131]
(3-72)
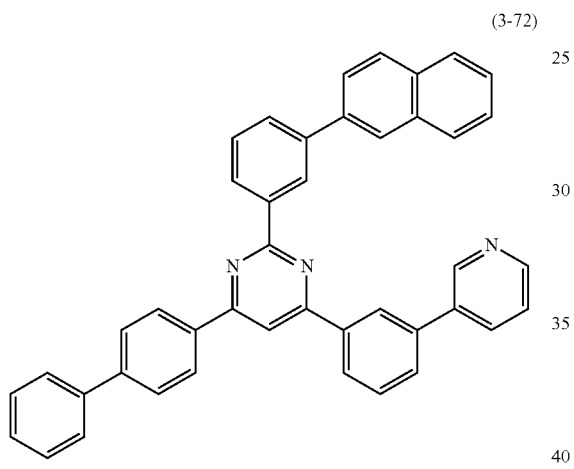
[Chemical Formula 132]
(3-73)
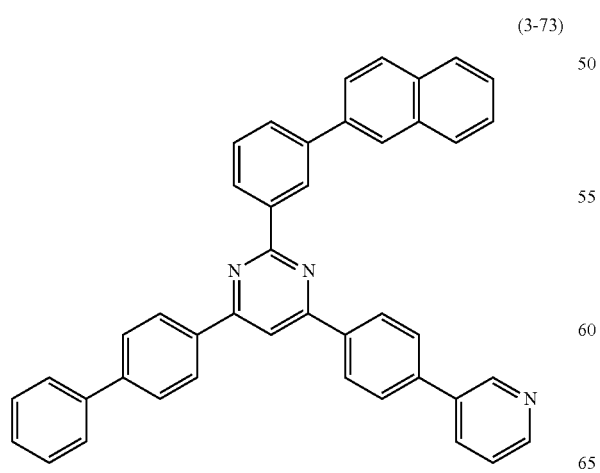
[Chemical Formula 133]
(3-74)
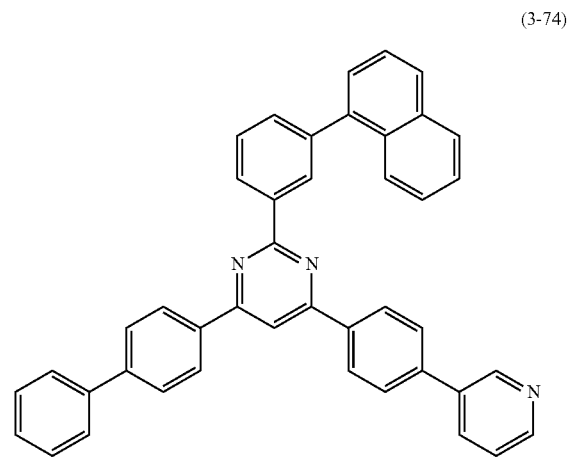
[Chemical Formula 134]
(3-75)
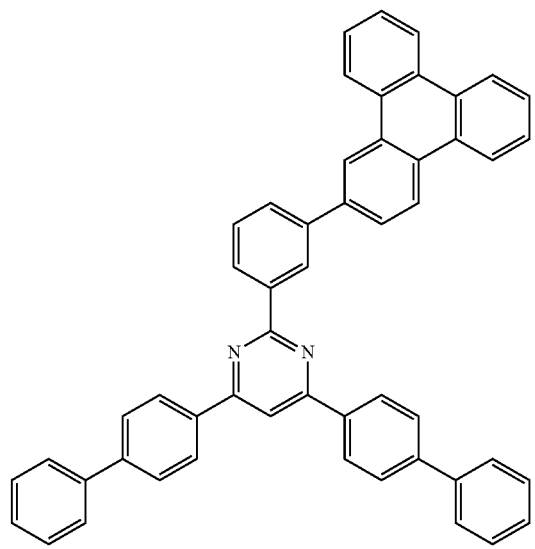

[Chemical Formula 135]
(3-76)
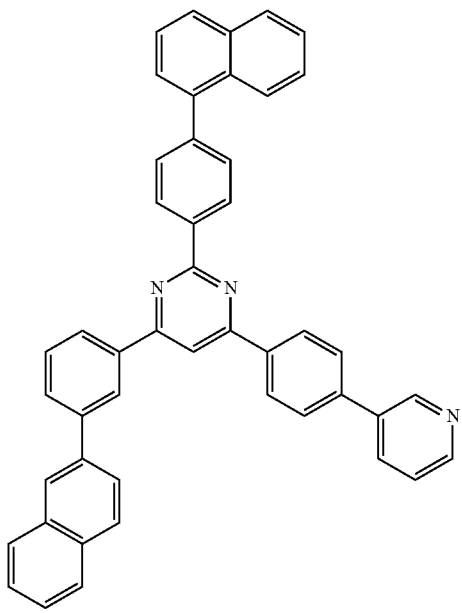
[Chemical Formula 136]
(3-77)
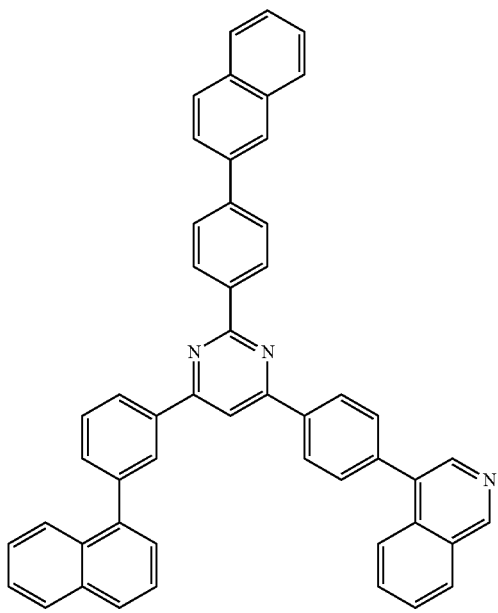
[Chemical Formula 137]
(3-78)
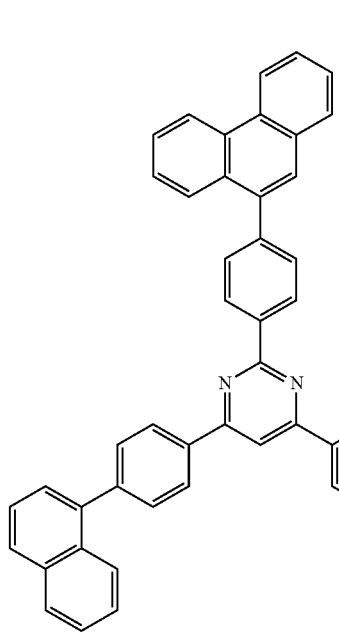
[Chemical Formula 138]
(3-79)
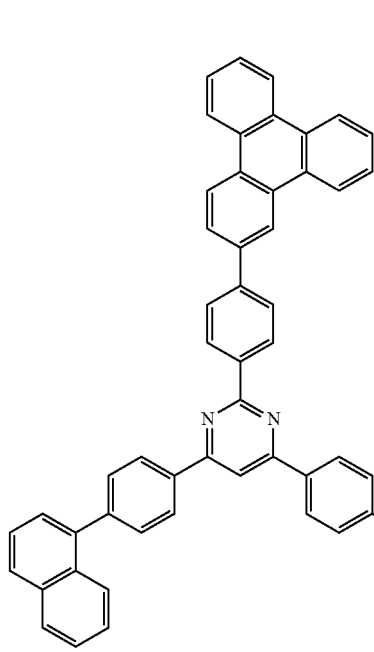

[Chemical Formula 139]
(3-80)
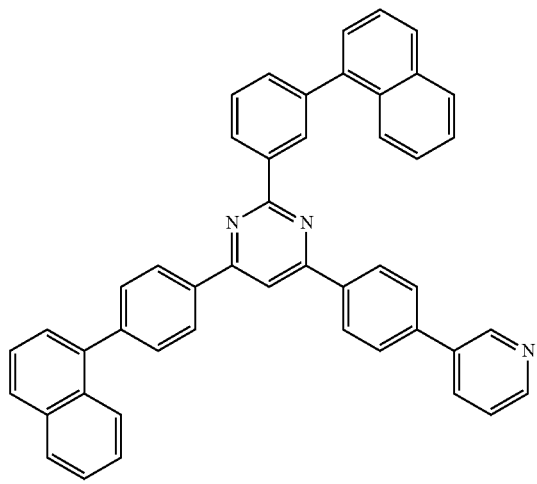
[Chemical Formula 140]
(3-81)
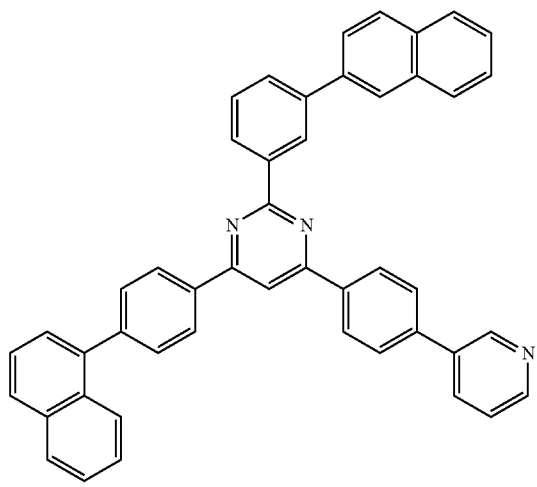
[Chemical Formula 141]
(3-82)
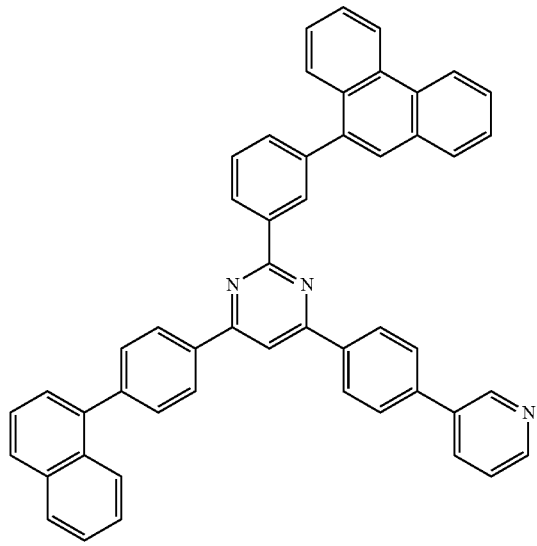
[Chemical Formula 142]
(3-83)
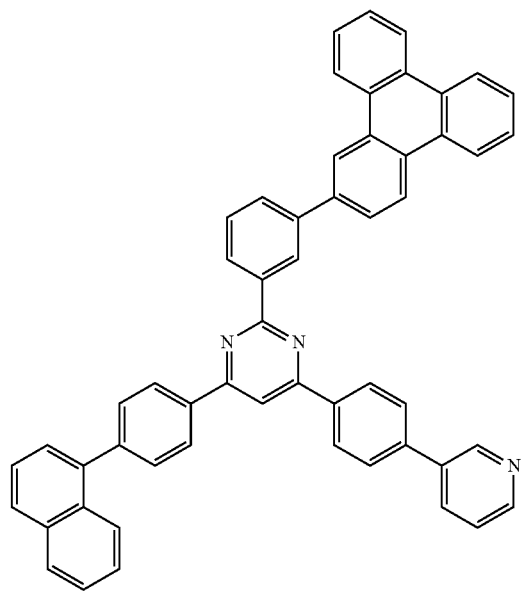

[Chemical Formula 143]
(3-84)
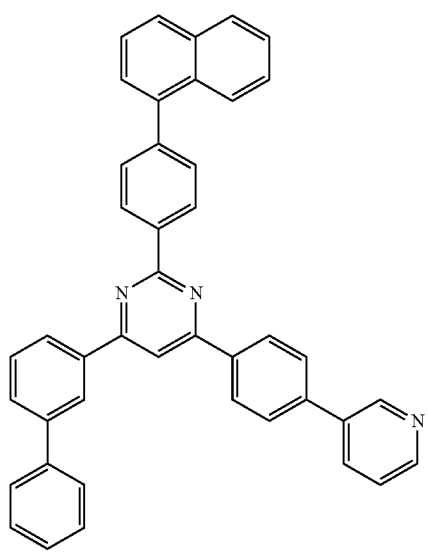
[Chemical Formula 144]
(3-85)
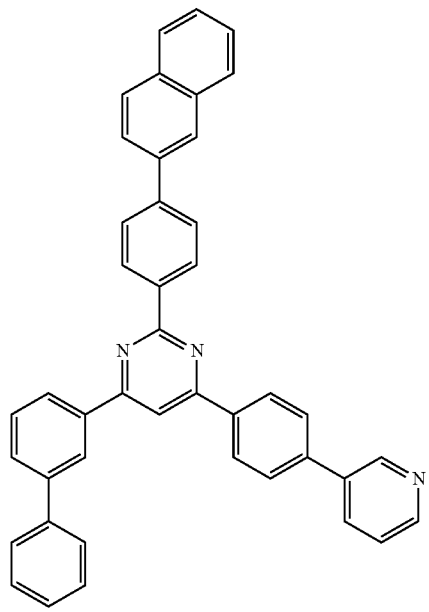
[Chemical Formula 145]
(3-86)
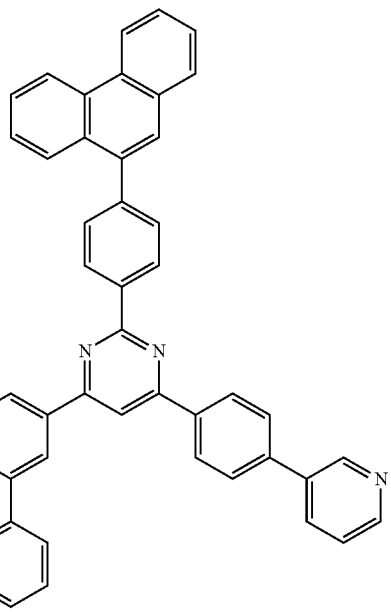
[Chemical Formula 146]
(3-87)
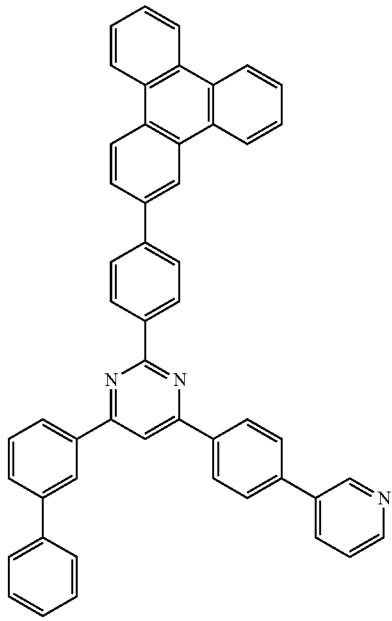

[Chemical Formula 147]
(3-88)
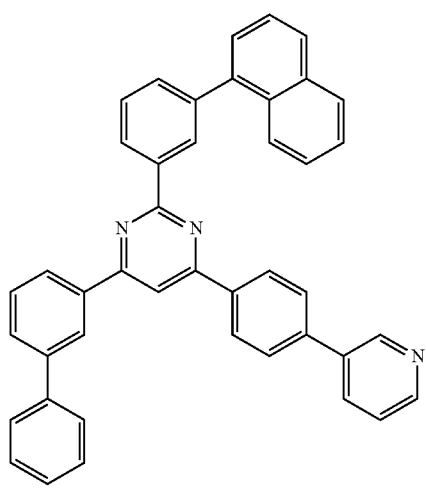
[Chemical Formula 148]
(3-89)
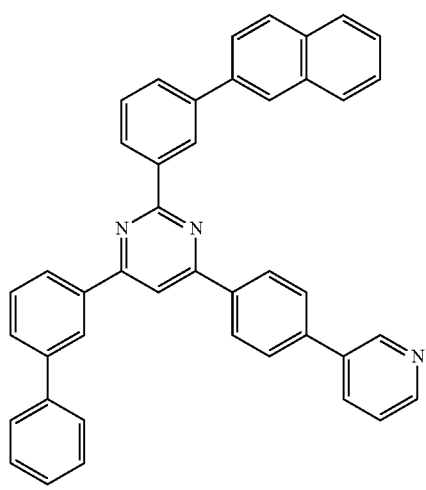
[Chemical Formula 149]
(3-90)
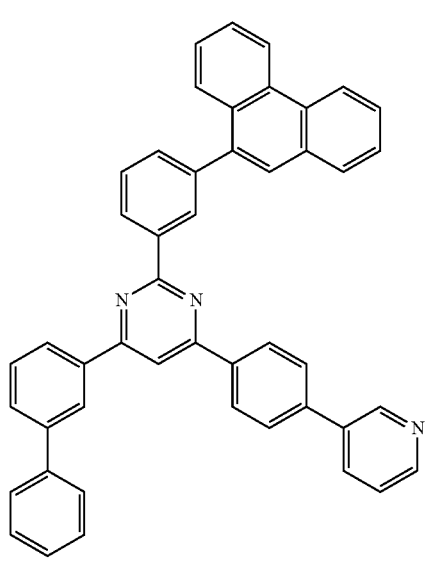
[Chemical Formula 150]
(3-91)
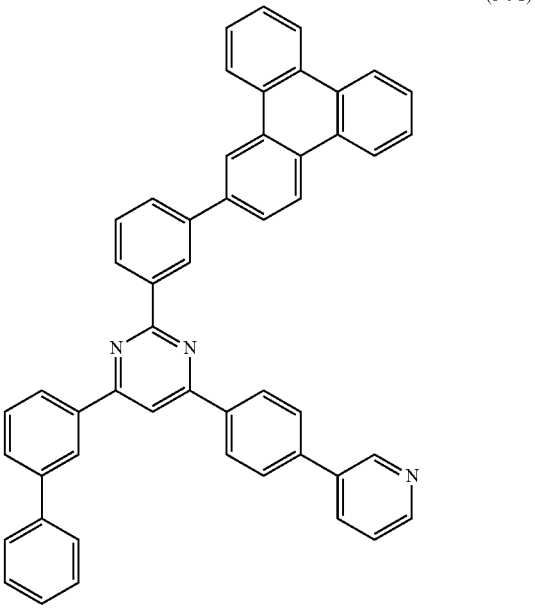
[Chemical Formula 151]
(3-92)
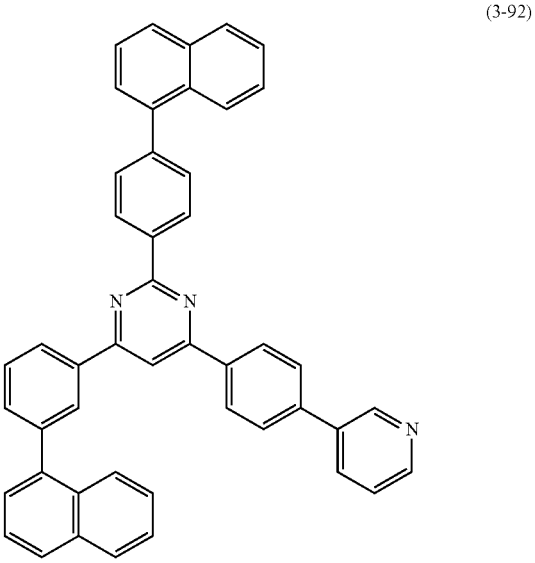

[Chemical Formula 152]
(3-93)
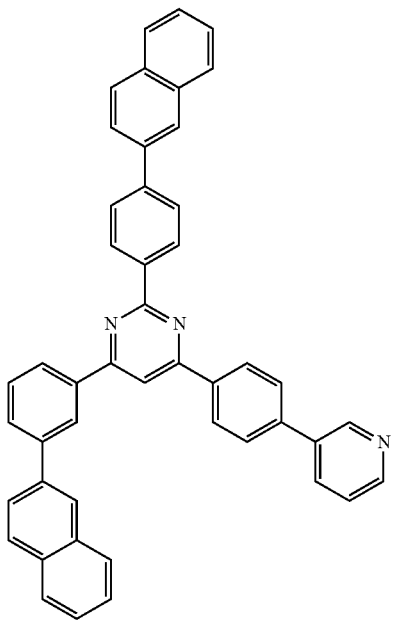
[Chemical Formula 153]
(3-94)
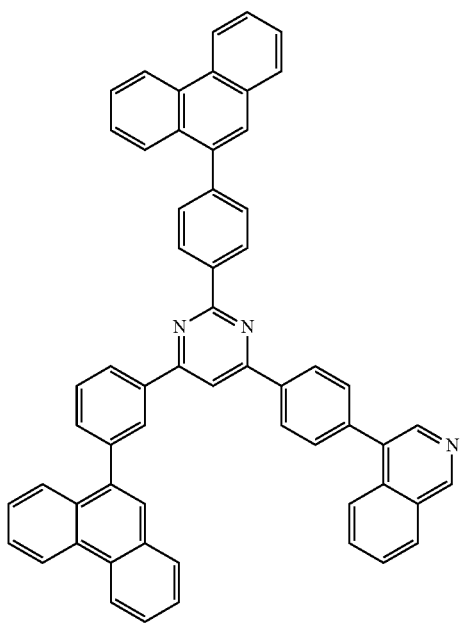
[Chemical Formula 154]
(3-95)
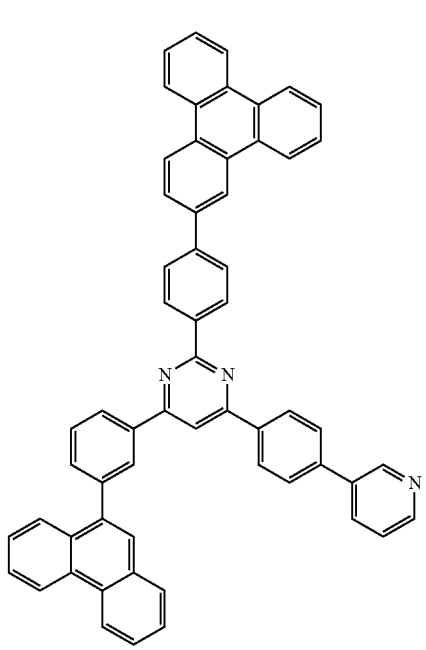
[Chemical Formula 155]
(3-96)
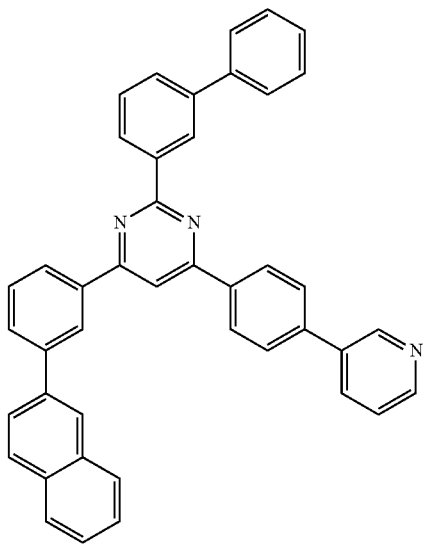

[Chemical Formula 156]
(3-97)
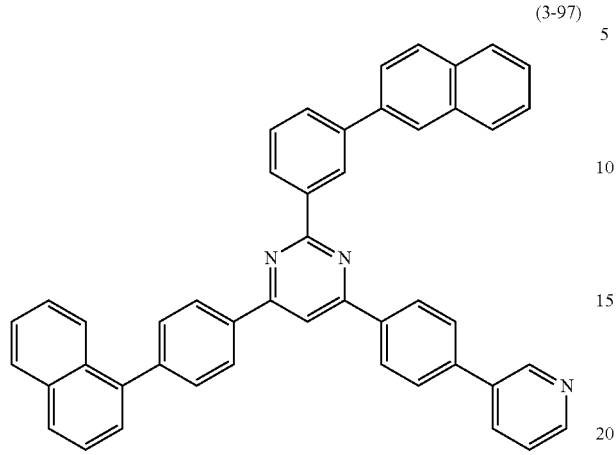
[Chemical Formula 157]
(3-98)
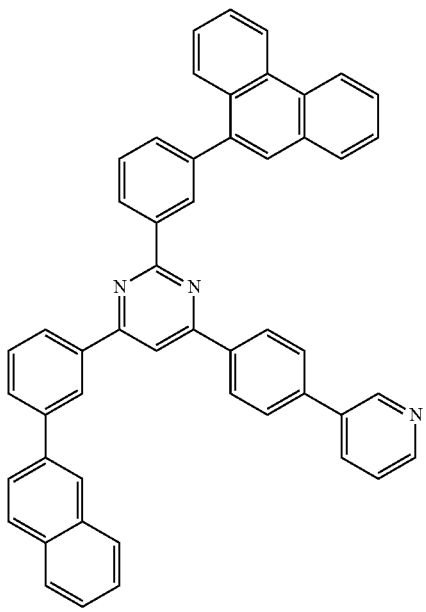
[Chemical Formula 158]
(3-99)
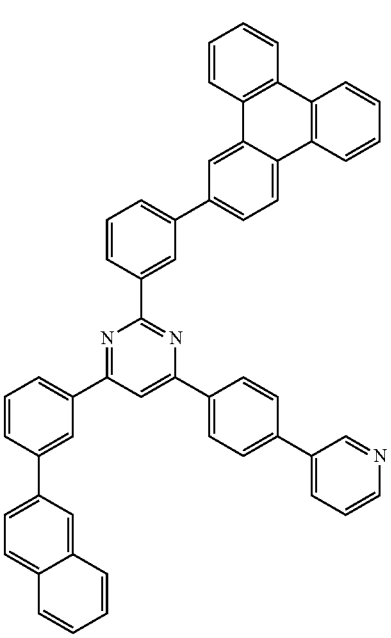
[Chemical Formula 159]
(3-100)
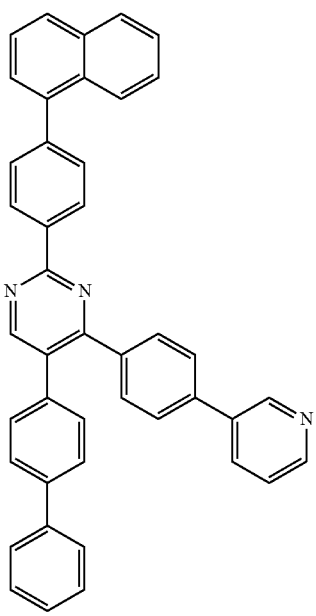

[Chemical Formula 160]
(3-101)
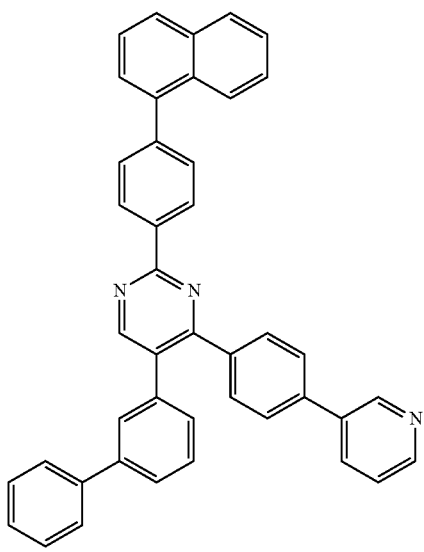
[Chemical Formula 161]
(3-102)
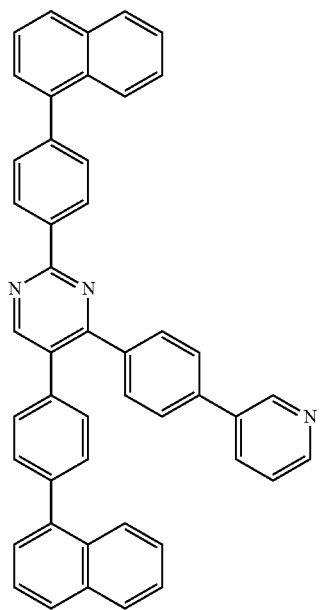
[Chemical Formula 162]
(3-103)
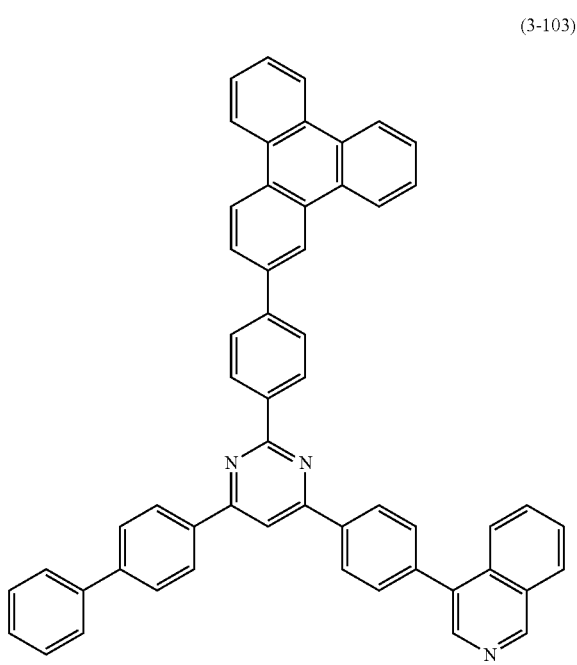
[Chemical Formula 163]
(3-104)
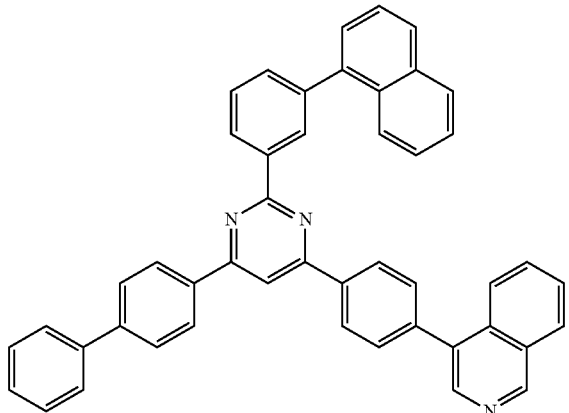

[Chemical Formula 164]
(3-105)
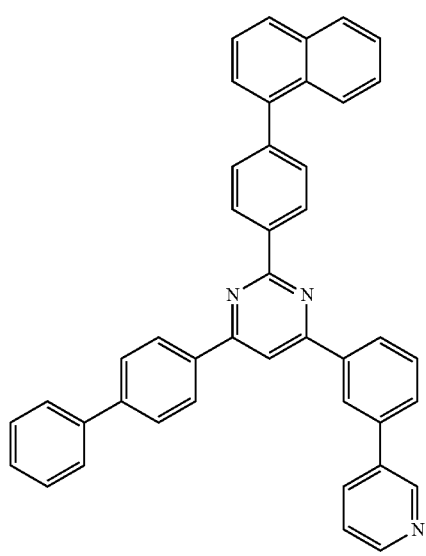
[Chemical Formula 165]
(3-106)
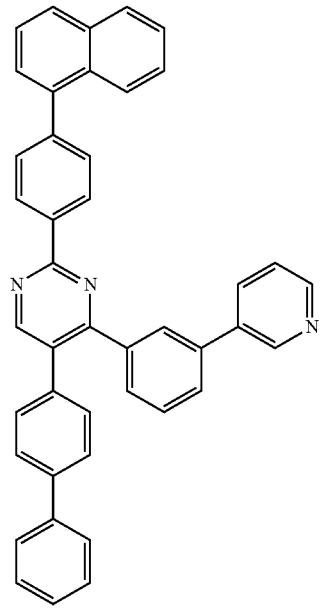
[Chemical Formula 166]
(3-107)
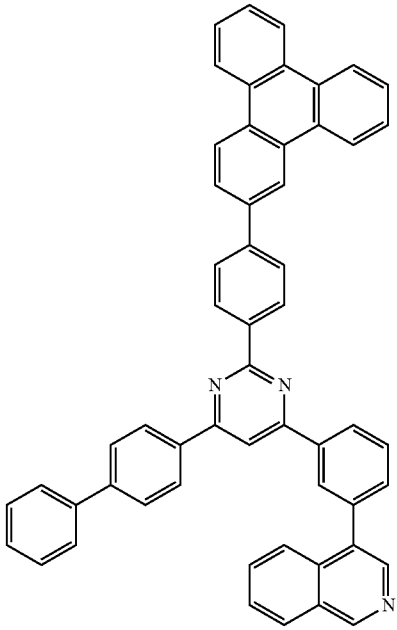
[Chemical Formula 167]
(3-108)
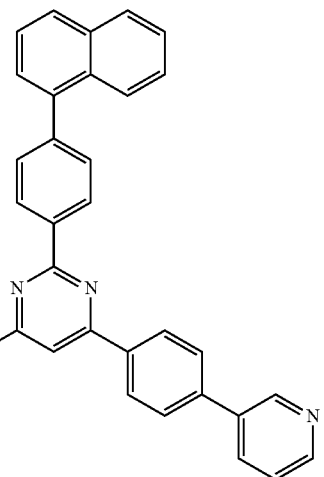

[Chemical Formula 168]
(3-109)
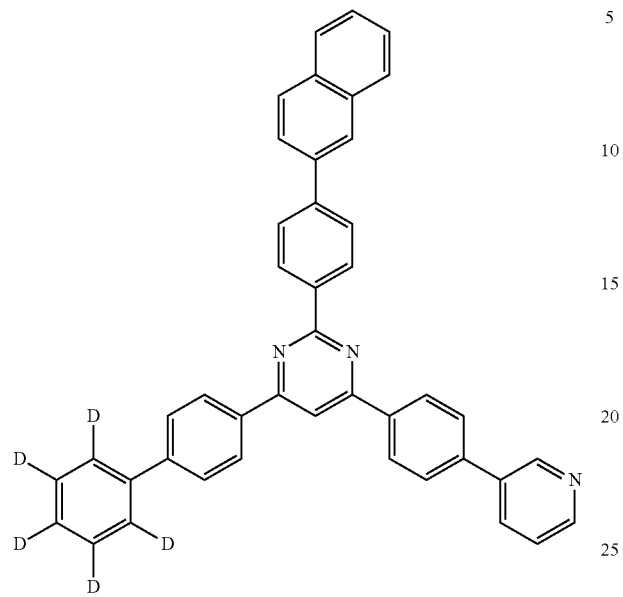
[Chemical Formula 169]
(3-110)
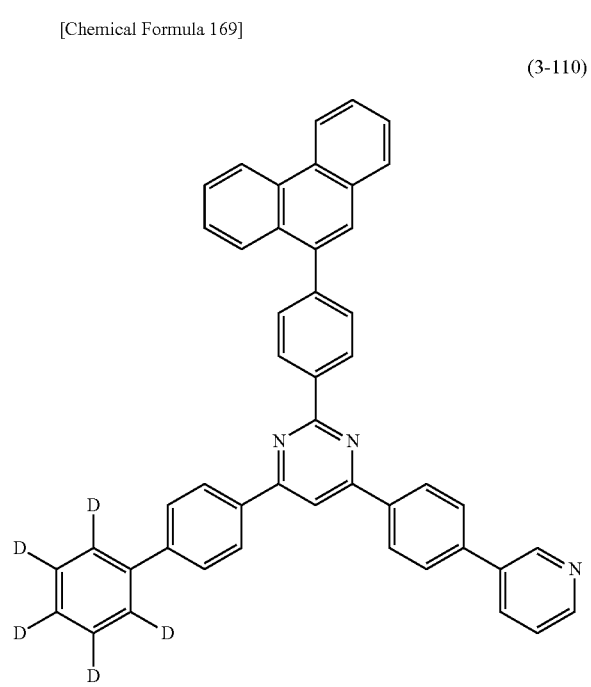
[Chemical Formula 170]
(3-111)
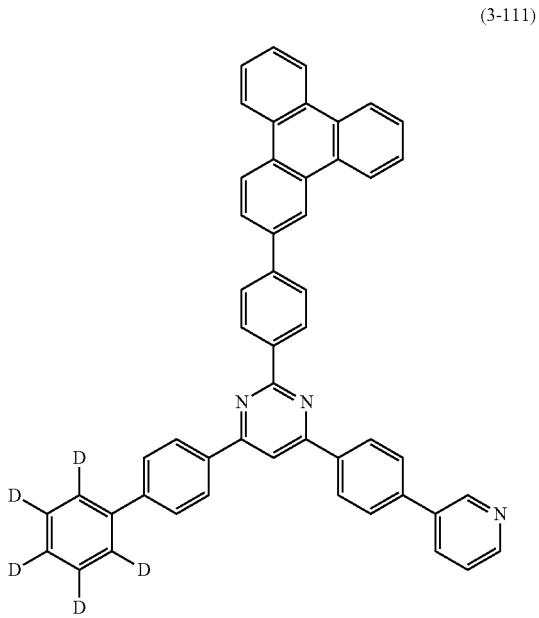
[Chemical Formula 171]
(3-112)
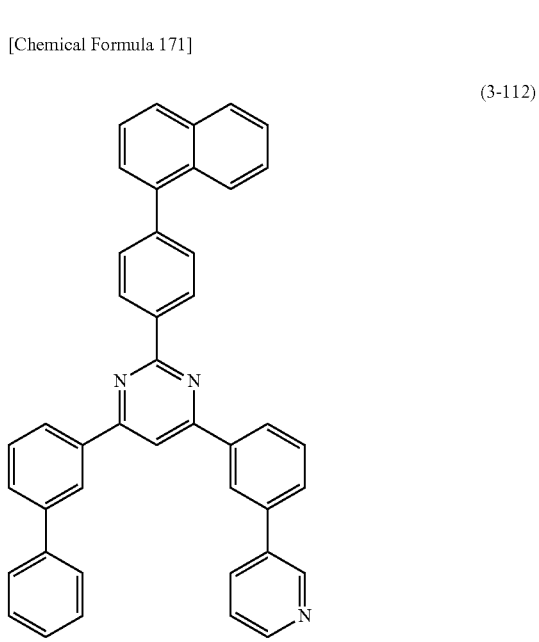

[Chemical Formula 172]
(3-113)
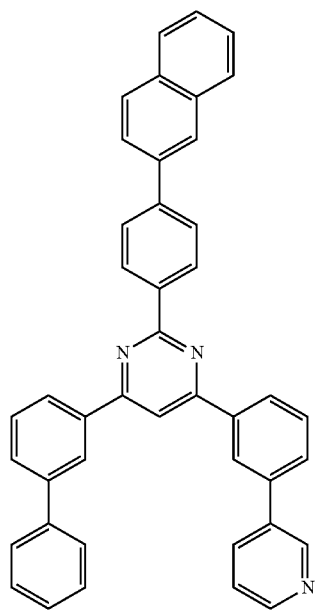
[Chemical Formula 173]
(3-114)
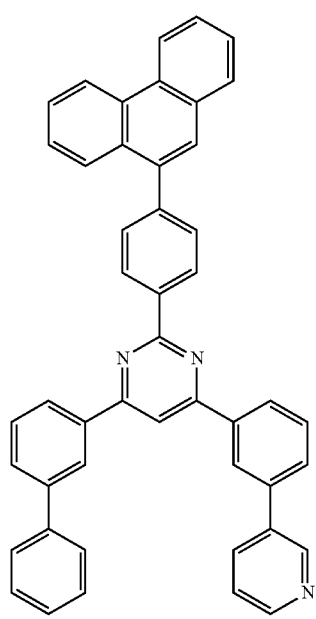
[Chemical Formula 174]
(3-115)
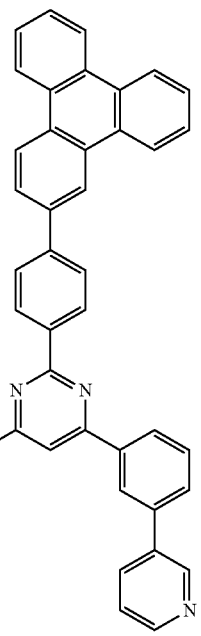
[Chemical Formula 175]
(3-116)
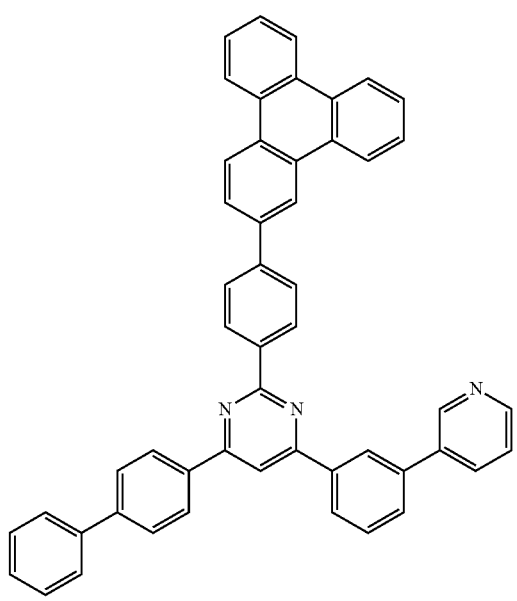

[Chemical Formula 176]
(3-117)
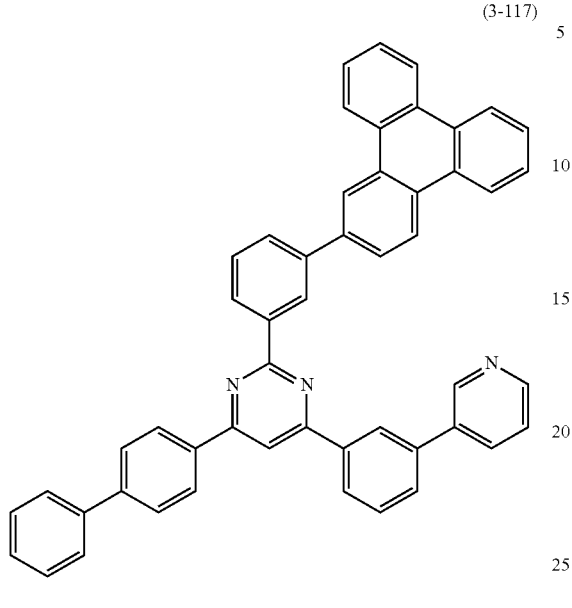
[Chemical Formula 177]
(3-118)
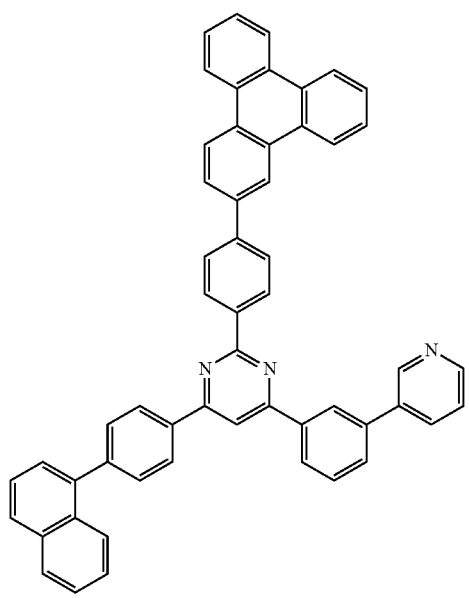
[Chemical Formula 178]
(3-119)
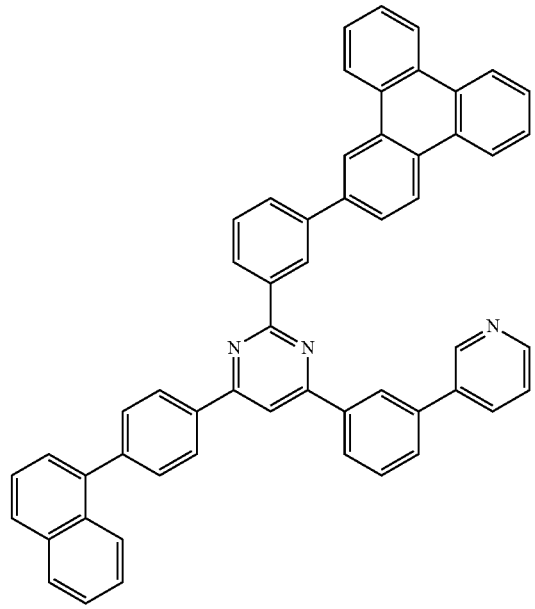
[Chemical Formula 179]
(3-120)

[Chemical Formula 180]
(3-121)
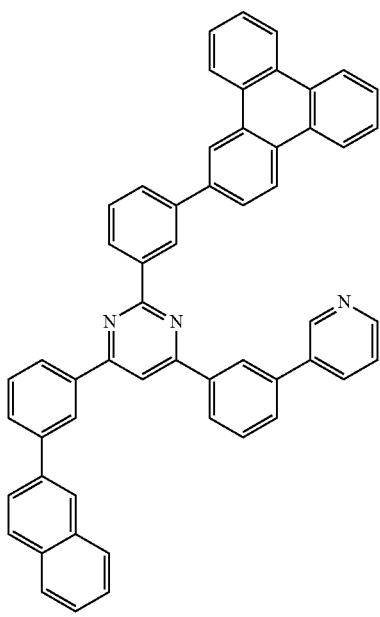
[Chemical Formula 181]
(3-122)
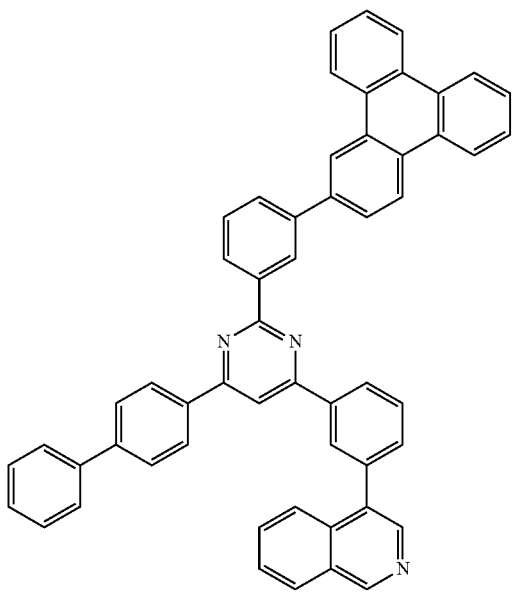
[Chemical Formula 182]
(3-123)
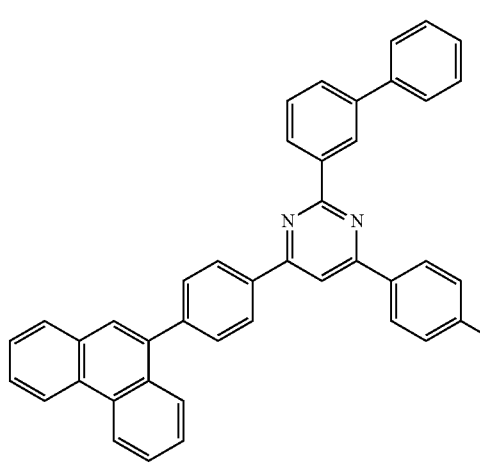
[Chemical Formula 183]
(3-124)
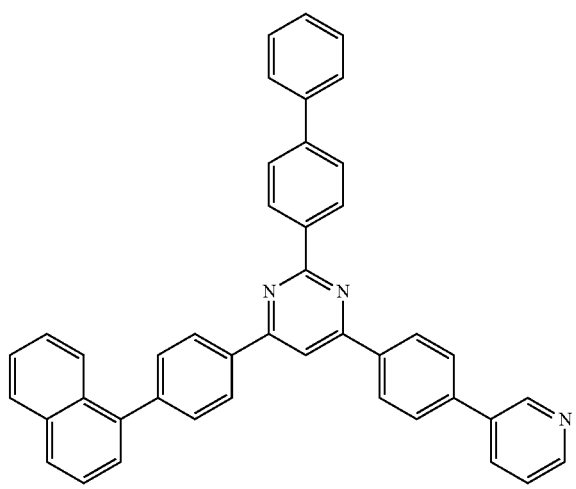
[Chemical Formula 184]
(3-125)
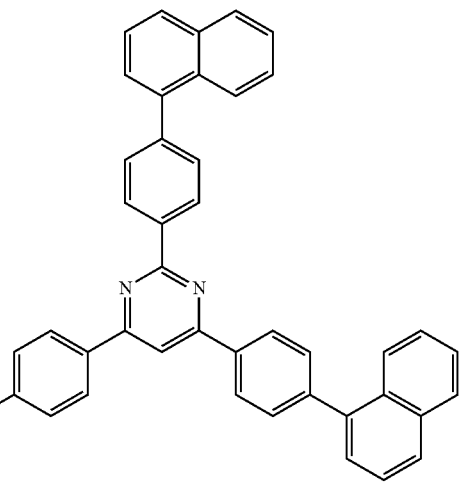

[Chemical Formula 185]

(3-126)

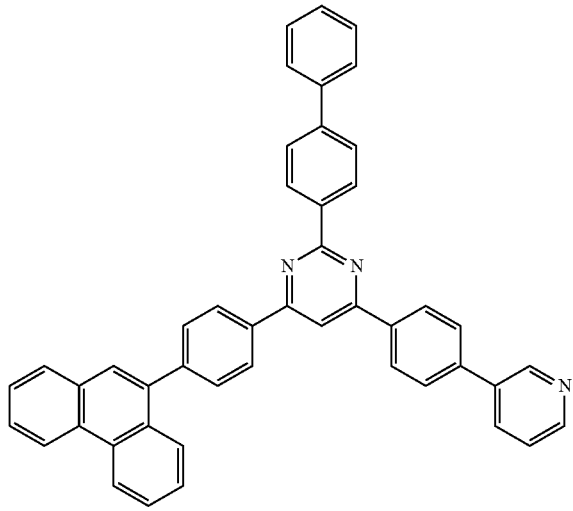

The compounds described above having a pyrimidine ring structure can be synthesized by a known method (refer to PTL 7, for example).

The carbazole compounds of the general formula (1) were purified by methods such as column chromatography, adsorption using, for example, a silica gel, activated carbon, or activated clay, recrystallization or crystallization using a solvent, and a sublimation purification method. The compounds were identified by an NMR analysis. A melting point, a glass transition point (Tg), and a work function were measured as material property values. The melting point can be used as an index of vapor deposition, the glass transition point (Tg) as an index of stability in a thin-film state, and the work function as an index of hole transportability and hole blocking performance.

Other compounds used for the organic EL device of the present invention were purified by methods such as column chromatography, adsorption using, for example, a silica gel, activated carbon, or activated clay, recrystallization or crystallization using a solvent, and a sublimation purification method, and finally purified by a sublimation purification method.

The melting point and the glass transition point (Tg) were measured by a high-sensitive differential scanning calorimeter (DSC3100SA produced by Bruker AXS) using powder.

For the measurement of the work function, a 100 nm-thick thin film was fabricated on an ITO substrate, and an ionization potential measuring device (PYS-202 produced by Sumitomo Heavy Industries, Ltd.) was used.

The organic EL device of the present invention may have a structure including an anode, a hole injection layer, a hole transport layer, a light emitting layer, an electron transport layer, and a cathode successively formed on a substrate, optionally with an electron blocking layer between the hole transport layer and the light emitting layer, a hole blocking layer between the light emitting layer and the electron transport layer, and an electron injection layer between the electron transport layer and the cathode. Some of the organic layers in the multilayer structure may be omitted, or may serve more than one function. For example, a single organic layer may serve as the hole injection layer and the hole transport layer, or as the electron injection layer and the electron transport layer, and so on. Further, any of the layers may be configured to laminate two or more organic layers having the same function, and the hole transport layer may have a two-layer laminated structure, the light emitting layer may have a two-layer laminated structure, the electron transport layer may have a two-layer laminated structure, and so on. The organic EL device of the present invention is preferably configured such that the electron blocking layer is provided between the hole transporting layer and the light emitting layer.

Electrode materials with high work functions such as ITO and gold are used as the anode of the organic EL device of the present invention. The hole injection layer of the organic EL device of the present invention may be made of, for example, material such as starburst-type triphenylamine derivatives and various triphenylamine tetramers; porphyrin compounds as represented by copper phthalocyanine; accepting heterocyclic compounds such as hexacyano azatriphenylene; and coating-type polymer materials, in addition to the carbazole compounds of the general formula (1). These materials may be formed into a thin film by a vapor deposition method or other known methods such as a spin coating method and an inkjet method.

Examples of material used for the hole transport layer of the organic EL device of the present invention can be benzidine derivatives such as N,N'-diphenyl-N,N'-di(m-tolyl)benzidine (TPD), N,N'-diphenyl-N,N'-di(α-naphthyl)benzidine (NPD), and N,N,N',N'-tetrabiphenylylbenzidine; 1,1-bis[4-(di-4-tolylamino)phenyl]cyclohexane (TAPC); triphenylamine derivatives having two triphenylamine skeletons as a whole molecule; triphenylamine derivatives having four triphenylamine skeletons as a whole molecule; and triphenylamine derivatives having three triphenylamine skeletons as a whole molecule, in addition to the carbazole compounds of the general formula (1). These may be individually deposited for film forming, may be used as a single layer deposited mixed with other materials, or may be formed as a laminate of individually deposited layers, a laminate of mixedly deposited layers, or a laminate of the individually deposited layer and the mixedly deposited layer. These materials may be formed into a thin-film by using a vapor deposition method or other known methods such as a spin coating method and an inkjet method.

The material used for the hole injection layer or the hole transport layer may be obtained by p-doping materials such as trisbromophenylamine hexachloroantimony, and radialene derivatives (refer to PTL 8, for example) into a material commonly used for these layers, or may be, for example, polymer compounds each having, as a part of the compound structure, a structure of a benzidine derivative such as TPD.

The carbazole compounds of the general formula (1) are used as the electron blocking layer of the organic EL device of the present invention. These may be individually deposited for film forming, may be used as a single layer deposited mixed with other hole transporting materials, or may be formed as a laminate of individually deposited layers, a laminate of mixedly deposited layers, or a laminate of the individually deposited layer and the mixedly deposited layer. These materials may be formed into a thin-film by a vapor deposition method or other known methods such as a spin coating method and an inkjet method.

Examples of a hole transporting material that can be mixed or can be used at the same time with the carbazole compounds of the general formula (1) can be compounds having an electron blocking effect, including, for example, carbazole derivatives such as 4,4',4"-tri(N-carbazolyl)triphenylamine (TCTA), 9,9-bis[4-(carbazol-9-yl)phenyl]fluorene, 1,3-bis(carbazol-9-yl)benzene (mCP), and 2,2-bis(4-carbazol-9-ylphenyl)adamantane (Ad-Cz); and compounds having a triphenylsilyl group and a triarylamine structure, as represented by 9-[4-(carbazol-9-yl)phenyl]-9-[4-(triphenylsilyl)phenyl]-9H-fluorene.

Examples of material used for the light emitting layer of the organic EL device of the present invention can be the amine derivative having a condensed ring structure of the general formula (2) and the pyrene derivative. Examples of a light emitting material that can be mixed or can be used at the same time with the amine derivative of the general formula (2) and the pyrene derivative can be various metal complexes such as quinolinol derivative metal complexes including $Alq_3$, anthracene derivatives, bis(styryl)benzene derivatives, oxazole derivatives, and polyparaphenylene vinylene derivatives. Further, the light emitting layer may be made of a host material and a dopant material. Examples of the host material can be thiazole derivatives, benzimidazole derivatives, and polydialkyl fluorene derivatives, in addition to the above light-emitting materials. Examples of the dopant material that can be mixed or can be used at the same time with a blue light emitting dopant such as the amine derivative having a condensed ring structure of the general formula (2) and the pyrene derivative can be quinacridone, coumarin, rubrene, perylene, derivatives thereof, benzopyran derivatives, indenophenanthrene derivatives, rhodamine derivatives, and aminostyryl derivatives. These may be individually deposited for film forming, may be used as a single layer deposited mixed with other materials, or may be formed as a laminate of individually deposited layers, a laminate of mixedly deposited layers, or a laminate of the individually deposited layer and the mixedly deposited layer.

As the light emitting layer of the organic EL device of the present invention, it is preferable to use the amine derivative having a condensed ring structure of the general formula (2) or the pyrene derivative as a dopant material, and it is more preferable to use the amine derivative having a condensed ring structure of the general formula (2) as a dopant material.

Further, examples of the light emitting material may be delayed fluorescent-emitting material such as a CDCB derivative of PIC-TRZ, CC2TA, PXZ-TRZ, 4CzIPN or the like (refer to NPL 3, for example).

These materials may be formed into a thin-film by using a vapor deposition method or other known methods such as a spin coating method and an inkjet method.

The hole blocking layer of the organic EL device of the present invention may be formed by using hole blocking compounds such as various rare earth complexes, triazole derivatives, triazine derivatives, and oxadiazole derivatives, in addition to metal complexes of phenanthroline derivatives such as bathocuproin (BCP), and the metal complexes of quinolinol derivatives such as aluminum(III) bis(2-methyl-8-quinolinate)-4-phenylphenolate (hereinafter referred to as BAlq). These materials may also serve as the material of the electron transport layer. These may be individually deposited for film forming, may be used as a single layer deposited mixed with other materials, or may be formed as a laminate of individually deposited layers, a laminate of mixedly deposited layers, or a laminate of the individually deposited layer and the mixedly deposited layer. These materials may be formed into a thin-film by using a vapor deposition method or other known methods such as a spin coating method and an inkjet method.

Examples of material used for the electron transport layer of the organic EL device of the present invention can be preferably the compounds having a pyrimidine ring structure of the general formula (3). These may be individually deposited for film forming, may be used as a single layer deposited mixed with other electron transport materials, or may be formed as a laminate of individually deposited layers, a laminate of mixedly deposited layers, or a laminate of the individually deposited layer and the mixedly deposited layer. These materials may be formed into a thin-film by using a vapor deposition method or other known methods such as a spin coating method and an inkjet method.

Examples of the electron transporting material that can be mixed or can be used at the same time with the compounds having a pyrimidine ring structure of the general formula (3) can be metal complexes of quinolinol derivatives including $Alq_3$ and BAlq, various metal complexes, triazole derivatives, triazine derivatives, oxadiazole derivatives, pyridine derivatives, pyrimidine derivatives, benzimidazole derivatives, thiadiazole derivatives, anthracene derivatives, carbodiimide derivatives, quinoxaline derivatives, pyridoindole derivatives, phenanthroline derivatives, and silole derivatives.

Examples of material used for the electron injection layer of the organic EL device of the present invention can be alkali metal salts such as lithium fluoride and cesium fluoride; alkaline earth metal salts such as magnesium fluoride; and metal oxides such as aluminum oxide. However, the electron injection layer may be omitted in the preferred selection of the electron transport layer and the cathode.

The cathode of the organic EL device of the present invention may be made of an electrode material with a low work function such as aluminum, or an alloy of an electrode material with an even lower work function such as a magnesium-silver alloy, a magnesium-indium alloy, or an aluminum-magnesium alloy.

The following describes an embodiment of the present invention in more detail based on Examples. The present invention, however, is not restricted to the following Examples.

Example 1

Synthesis of 3,6-bis(9'-phenyl-9'H-carbazole-3-yl)-9-phenyl-9H-carbazole (Compound 1-1)

Under a nitrogen atmosphere, 3,6-dibromo-9-phenyl-9H-carbazole (1.6 g), 9-phenyl-3-(4,4,5,5-tetramethyl-1,3,2-dioxaborolane-2-yl)-9H-carbazole (2.4 g), tetrakistriphenylphosphine palladium (0.23 g), 2 M potassium carbonate aqueous solution (6 ml), toluene (20 ml), and ethanol (5 ml) were added into a reaction vessel at reflux temperature, and the mixture was heated and stirred for 5 hours. After cooling to 40° C., the reaction solution was filtered and concentrated under reduced pressure to obtain a crude product. The crude product was purified by recrystallization (solvent: toluene/methanol), and dried to obtain a white powder of 3,6-bis (9'-phenyl-9'H-carbazole-3-yl)-9-phenyl-9H-carbazole (Compound 1-1; 1.76 g; yield 60.9%).

The structure of the obtained white powder was identified by NMR.

$^1$H-NMR (CDCl$_3$) detected 35 hydrogen signals, as follows.

δ(ppm)=8.56 (2H), 8.49 (2H), 8.24-8.26 (2H), 7.79-7.81 (4H), 7.62-7.67 (12H), 7.43-7.55 (11H), 7.30-7.33 (2H).

[Chemical Formula 186]

(1-1)

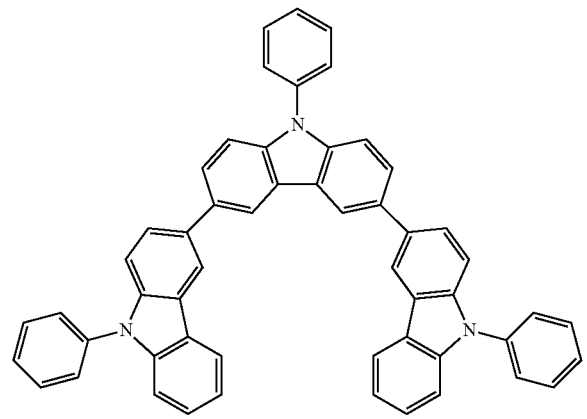

[Chemical Formula 187]

(1-2)

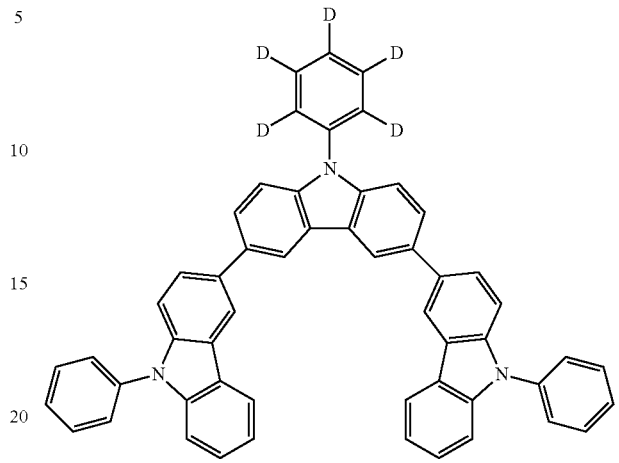

Example 2

Synthesis of 3,6-bis(9'-phenyl-9'H-carbazole-3-yl)-9-(phenyl-D5)-9H-carbazole (Compound 1-2)

Under a nitrogen atmosphere, 3,6-dibromo-9-(phenyl-d5)-9H-carbazole (26.1 g), 9-phenyl-3-(4,4,5,5-tetramethyl-1,3,2-dioxaborolane-2-yl)-9H-carbazole (48.7 g), tetrakistriphenylphosphine palladium (2.23 g), 2 M potassium carbonate aqueous solution (95 ml), toluene (326 ml), and ethanol (82 ml) were added into a reaction vessel at reflux temperature, and the mixture was heated and stirred for 6.5 hours. After cooling to a room temperature, methanol (650 ml) was added and a crude product was obtained by filtration. The crude product was purified by silica gel and dissolved in toluene (1130 ml). The crude product obtained by concentrating the solution under reduced pressure was purified by recrystallization (solvent: toluene/hexane), washed with methanol and dried to obtain a white powder of 3,6-bis(9'-phenyl-9'H-carbazole-3-yl)-9-(phenyl-d5)-9H-carbazole (Compound 1-2; 32.3 g; yield 69%).

The structure of the obtained white powder was identified by NMR.

$^1$H-NMR (CDCl$_3$) detected 30 hydrogen signals, as follows.

δ(ppm)=8.70 (2H), 8.60 (2H), 8.28 (2H), 7.83-7.86 (4H), 7.65-7.66 (8H), 7.49-7.54 (6H), 7.36-7.42 (4H), 7.27 (2H).

Example 3

Synthesis of 9'-phenyl-9-[4-(9-phenyl-9H-carbazole-3-yl)-phenyl]-9H,9'H-[3,3']bicarbazolyl (Compound 1-7)

Under a nitrogen atmosphere, 9-phenyl-9H,9'H-[3,3']bicarbazolyl (12.9 g), 4-bromo-iodobenzene (13.4 g), a copper powder (0.64 g), potassium carbonate (8.34 g), sodium hydrogen sulfite (0.49 g), and o-dichlorobenzene (50 ml) were added into a reaction vessel. The mixture was heated and stirred at 170° C. for 6.5 hours. After cooling to 90° C., toluene (200 ml) was added and the mixture was filtered. The crude product obtained by concentrating the filtrate under reduced pressure was purified by recrystallization (solvent: methanol), and dried to obtain a white powder of 9-(4-bromophenyl)-9'-phenyl-9H,9'H-[3,3']bicarbazolyl (17.3 g; yield 97%).

Under a nitrogen atmosphere, 9-(4-bromophenyl)-9'-phenyl-9H,9'H-[3,3']bicarbazolyl (17.0 g), 9-phenyl-3-(4,4,5,5-tetramethyl-1,3,2-dioxaborolane-2-yl)-9H-carbazole (12.3 g), tetrakistriphenylphosphine palladium (1.74 g), 2 M potassium carbonate aqueous solution (23 ml), toluene (160 ml), and ethanol (40 ml) were added into a reaction vessel at reflux temperature, and the mixture was heated and stirred for 13 hours. After cooling to a room temperature, toluene (100 ml) and water (150 ml) were added and stirred, and then the organic layer was separated with a separatory funnel. The organic layer was dried over magnesium sulfate. The obtained crude product was concentrated under reduced pressure, and then purified by column chromatography (carrier: silica gel, eluent: n-hexane/toluene) to obtain a pale yellow powder of 9'-phenyl-9-[4-(9-phenyl-9H-carbazol-3-yl)-phenyl]-9H,9TH-[3,3']bicarbazolyl (10.4 g; yield 48%).

The structure of the obtained pale yellow powder was identified by NMR.

$^1$H-NMR (CDCl$_3$) detected 35 hydrogen signals, as follows.

δ(ppm)=8.56-8.61 (3H), 8.26-8.30 (3H), 8.04-8.08 (2H), 7.81-7.85 (3H), 7.73-7.76 (2H), 7.64-7.69 (8H), 7.58 (1H), 7.48-7.53 (5H), 7.36-7.44 (5H), 7.25-7.31 (3H).

[Chemical Formula 188]

(1-5)

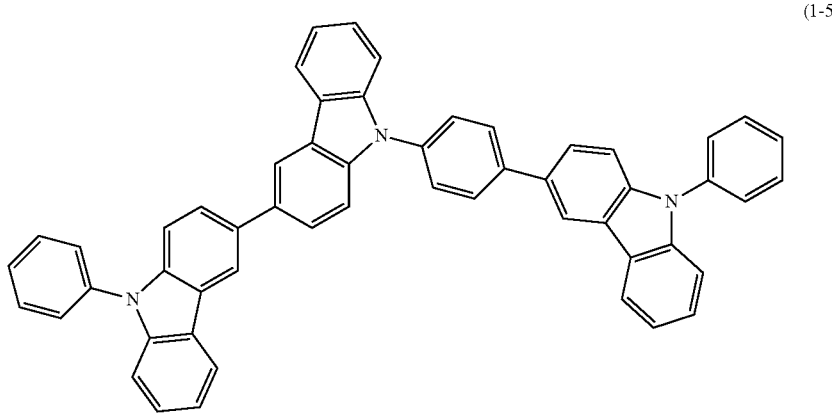

Example 4

The glass transition points of the carbazole compounds of the general formula (1) were measured using a high-sensitive differential scanning calorimeter (DSC3100SA produced by Bruker AXS).

|  | Glass transition point |
|---|---|
| Compound of Example 1 | 157° C. |
| Compound of Example 2 | 160° C. |
| Compound of Example 3 | 148° C. |

The carbazole compounds of the general formula (1) have glass transition points of 100° C. or higher, demonstrating that the compounds have a stable thin-film state.

Example 5

A 100 nm-thick vapor-deposited film was fabricated on an ITO substrate using the carbazole compounds of the general formula (1), and a work function was measured using an ionization potential measuring device (PYS-202 produced by Sumitomo Heavy Industries, Ltd.).

|  | Work function |
|---|---|
| Compound of Example 1 | 5.76 eV |
| Compound of Example 2 | 5.77 eV |
| Compound of Example 3 | 5.81 eV |

As the results show, the carbazole compounds of the general formula (1) have desirable energy levels compared to the work function 5.4 eV of common hole transport materials such as NPD and TPD, and thus possess desirable hole transportability.

Example 6

The organic EL device, as shown in FIG. 1, was fabricated by vapor-depositing a hole injection layer 3, a hole transport layer 4, an electron blocking layer 5, a light emitting layer 6, an electron transport layer 7, an electron injection layer 8, and a cathode (aluminum electrode) 9 in this order on a glass substrate 1 on which an ITO electrode was formed as a transparent anode 2 beforehand.

Specifically, the glass substrate 1 having ITO having a film thickness of 150 nm formed thereon was subjected to ultrasonic washing in isopropyl alcohol for 20 minutes and then dried for 10 minutes on a hot plate heated to 200° C. Thereafter, after performing a UV ozone treatment for 15 minutes, the glass substrate 1 with ITO was installed in a vacuum vapor deposition apparatus, and the pressure was reduced to 0.001 Pa or lower. Subsequently, as the hole injection layer 3 covering the transparent anode 2, an electron acceptor (Acceptor-1) of the structural formula below and Compound (HTM-1) of the structural formula below were formed in a film thickness of 5 nm by dual vapor deposition at a vapor deposition rate that satisfies a vapor deposition rate ratio of Acceptor-1/HTM-1=3/97. As the hole transport layer 4 on the hole injection layer 3, Compound (HTM-1) of the structural formula below was formed in a film thickness of 45 nm. As the electron blocking layer 5 on the hole transport layer 4, Compound (1-1) of the structural formula below was formed in a film thickness of 10 nm. As the light emitting layer 6 on the electron blocking layer 5, Compound (2-1) of the structural formula below and Compound (EMH-1) of the structural formula below were formed in a film thickness of 20 nm by dual vapor deposition at a vapor deposition rate that satisfies a vapor deposition rate ratio of Compound (2-1)/EMH-1=5/95. As the electron transport layer 7 on the light emitting layer 6, Compound (3-125) of the structural formula below and Compound (ETM-1) of the structural formula below were formed in a film thickness of 30 nm by dual vapor deposition at a vapor deposition rate that satisfies a vapor deposition rate ratio of Compound (3-125)/ETM-1=50/50. As the electron injection layer 8 on the electron transport layer 7, lithium fluoride was formed in a film thickness of 1 nm. Finally, aluminum was vapor-deposited in a thickness of 100 nm to form the cathode 9. The characteristics of the organic EL device were measured in the atmosphere at ordinary temperature. Table 1 summarizes the results of measurement of emission characteristics when applying a DC voltage to the fabricated organic EL device.

[Chemical Formula 189]
(Acceptor-1)
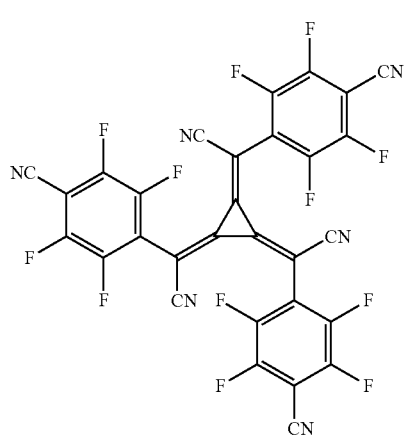
[Chemical Formula 190]
(HTM-1)
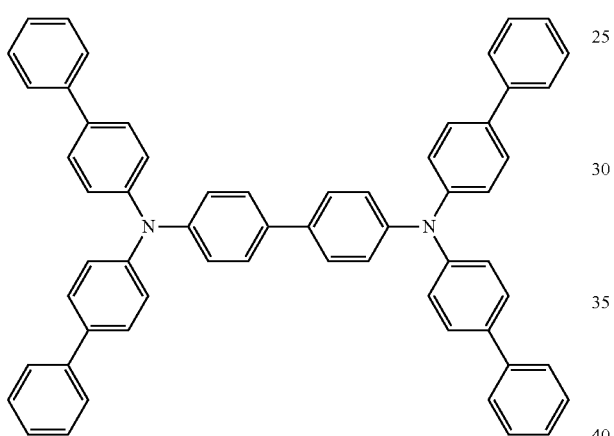
[Chemical Formula 191]
(1-1)
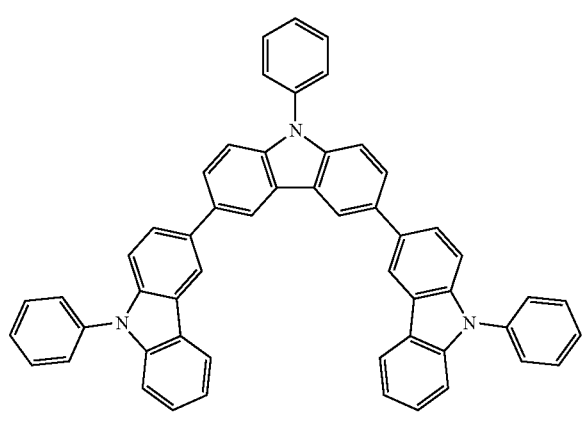
[Chemical Formula 192]
(2-1)
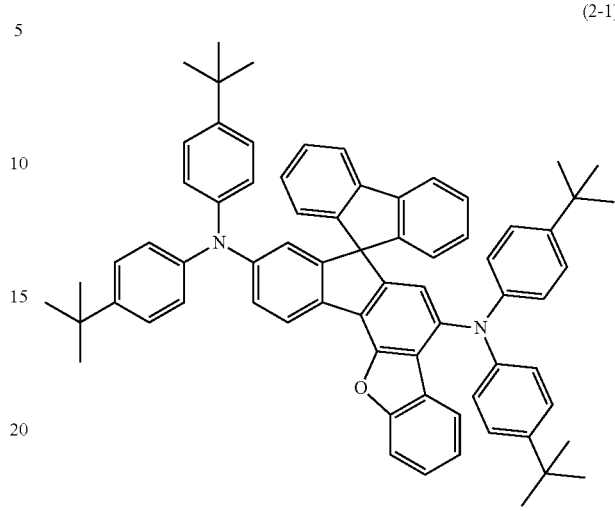
[Chemical Formula 193]
(EMH-1)
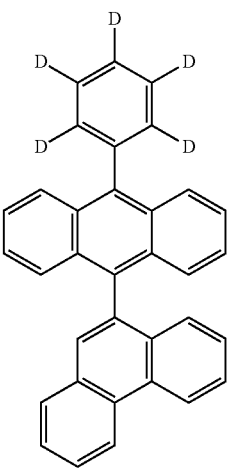
[Chemical Formula 194]
(3-125)
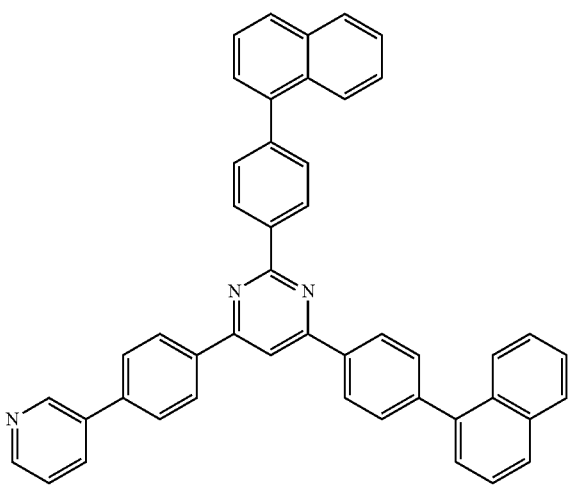

-continued

[Chemical Formula 195]

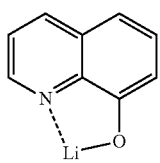

[Chemical Formula 196]

(ETM-1)

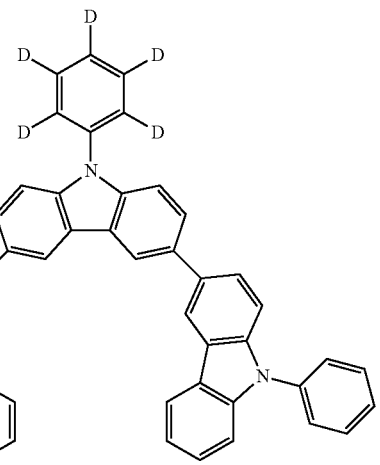

(1-2)

Example 7

An organic EL device was fabricated under the same conditions used in Example 6, except that the compound (1-1) of the structural formula above was replaced with the compound (1-2) of the structural formula below as material of the electron blocking layer 5. The characteristics of the organic EL device thus fabricated were measured in the atmosphere at an ordinary temperature. Table 1 summarizes the results of emission characteristics measurements performed by applying a DC voltage to the fabricated organic EL device.

Example 8

An organic EL device was fabricated under the same conditions used in Example 6, except that the compound (1-1) of the structural formula above was replaced with the compound (1-7) of the structural formula below as material of the electron blocking layer 5. The characteristics of the organic EL device thus fabricated were measured in the atmosphere at an ordinary temperature. Table 1 summarizes the results of emission characteristics measurements performed by applying a DC voltage to the fabricated organic EL device.

[Chemical Formula 197]

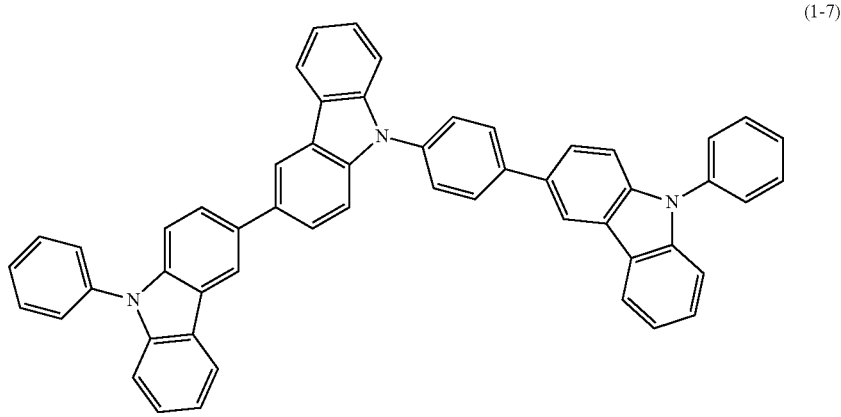

(1-7)

Comparative Example 1

For comparison, an organic EL device was fabricated under the same conditions used in Example 6, except that the compound (1-1) of the structural formula above was replaced with the compound (HTM-1) of the structural formula above as material of the electron blocking layer 5. The characteristics of the organic EL device thus fabricated were measured in the atmosphere at an ordinary temperature. Table 1 summarizes the results of emission characteristics measurements performed by applying a DC voltage to the fabricated organic EL device.

Table 1 summarizes the results of measurement of a device lifetime using the organic EL devices fabricated in Examples 6 to 8 and Comparative Example 1. The device lifetime was measured as a time elapsed until the emission luminance of 2,000 cd/m² (initial luminance) at the start of emission was attenuated to 1,900 cd/m² (corresponding to 95% when taking the initial luminance as 100%: Attenuation to 95%) when carrying out constant current driving.

[Chemical Formula 198]

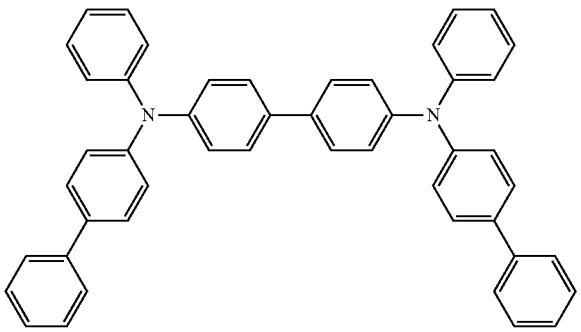

(HTM-2)

TABLE 1

| | Electron blocking layer | Voltage [V] (@10 mA/cm²) | Luminance [cd/m²] (@10 mA/cm²) | Luminous efficiency [cd/A] (@10 mA/cm²) | Power efficiency [lm/W] (@10 mA/cm²) | Lifetime of device, attenuation to 95% |
|---|---|---|---|---|---|---|
| Example 6 | Compound 1-1 | 3.57 | 750 | 7.50 | 6.61 | 189 hours |
| Example 7 | Compound 1-2 | 3.59 | 754 | 7.54 | 6.60 | 186 hours |
| Example 8 | Compound 1-7 | 3.59 | 756 | 7.56 | 6.61 | 182 hours |
| Comparative Example 1 | HTM-1 | 3.60 | 637 | 6.37 | 5.60 | 163 hours |

As shown in Table 1, the luminous efficiency upon passing a current with a current density of 10 mA/cm² was 7.50 to 7.56 cd/A for the organic EL devices in Examples 6 to 8, which was higher than 6.37 cd/A for the organic EL device in Comparative Example 1. Further, the power efficiency was 6.60 to 6.61 lm/W for the organic EL devices in Examples 6 to 8, which was higher than 5.60 lm/W for the organic EL device in Comparative Example 1. The device lifetime (95% attenuation) was 182 to 189 hours for the organic EL devices in Examples 6 to 8, showing achievement of a far longer lifetime than 163 hours for the organic EL device in Comparative Example 1.

Example 9

An organic EL device was fabricated under the same conditions used in Example 6, except that the compound (HTM-1) of the structural formula above was replaced with the compound (HTM-2) of the structural formula below as material of the hole injection layer 3 and the hole transport layer 4. The characteristics of the organic EL device thus fabricated were measured in the atmosphere at an ordinary temperature. Table 2 summarizes the results of emission characteristics measurements performed by applying a DC voltage to the fabricated organic EL device.

Example 10

An organic EL device was fabricated under the same conditions used in Example 6, except that the compound (HTM-1) of the structural formula above was replaced with the compound (HTM-3) of the structural formula below as material of the hole injection layer 3 and the hole transport layer 4. The characteristics of the organic EL device thus fabricated were measured in the atmosphere at an ordinary temperature. Table 2 summarizes the results of emission characteristics measurements performed by applying a DC voltage to the fabricated organic EL device.

[Chemical Formula 199]

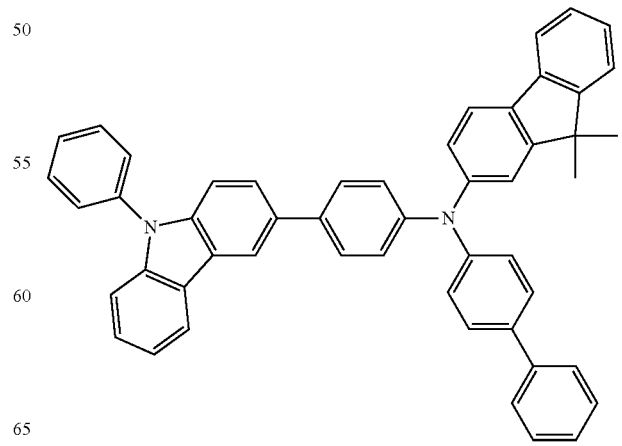

(HTM-3)

Comparative Example 2

For comparison, an organic EL device was fabricated under the same conditions used in Example 6, except that the compound (HTM-1) of the structural formula above was replaced with the compound (HTM-2) of the structural formula above as material of the hole injection layer 3 and the hole transport layer 4, and the compound (1-1) of the structural formula above was replaced with the compound (HTM-2) of the structural formula above as material of the electron blocking layer 5. The characteristics of the organic EL device thus fabricated were measured in the atmosphere at an ordinary temperature. Table 2 summarizes the results of emission characteristics measurements performed by applying a DC voltage to the fabricated organic EL device.

Comparative Example 3

For comparison, an organic EL device was fabricated under the same conditions used in Example 6, except that the compound (HTM-1) of the structural formula above was replaced with the compound (HTM-3) of the structural formula above as material of the hole injection layer 3 and the hole transport layer 4, and the compound (1-1) of the structural formula above was replaced with the compound (HTM-3) of the structural formula above as material of the electron blocking layer 5. The characteristics of the organic EL device thus fabricated were measured in the atmosphere at an ordinary temperature. Table 2 summarizes the results of emission characteristics measurements performed by applying a DC voltage to the fabricated organic EL device.

Table 2 summarizes the results of measurement of a device lifetime using the organic EL devices fabricated in Examples 9 to 10 and Comparative Examples 2 to 3. The device lifetime was measured as a time elapsed until the emission luminance of 2,000 cd/m$^2$ (initial luminance) at the start of emission was attenuated to 1,900 cd/m$^2$ (corresponding to 95% when taking the initial luminance as 100%: Attenuation to 95%) when carrying out constant current driving.

As shown in Table 2, the luminous efficiency upon passing a current with a current density of 10 mA/cm$^2$ was 7.45 to 7.56 cd/A for the organic EL devices in Examples 9 to 10, which was higher than 6.42 to 6.44 cd/A for the organic EL devices in Comparative Examples 2 to 3. Further, the power efficiency was 6.53 to 6.61 lm/W for the organic EL devices in Examples 9 to 10, which was higher than 5.58 to 5.63 lm/W for the organic EL devices in Comparative Examples 2 to 3. The device lifetime (95% attenuation) was 180 to 193 hours for the organic EL devices in Examples 9 to 10, showing achievement of a far longer lifetime than 151 to 165 hours for the organic EL devices in Comparative Examples 2 to 3.

It was found that the organic EL device of the present invention can achieve an organic EL device having high luminous efficiency and a long lifetime compared to the conventional organic EL devices by combining a carbazole compound having a specific structure and a specific light emitting material (dopant) so that carrier balance inside the organic EL device is improved, and further by combining the compounds so that the carrier balance matches the characteristics of the light emitting material.

INDUSTRIAL APPLICABILITY

In the organic EL device of the present invention in which a carbazole compound having a specific structure and a specific light emitting material (dopant) are combined, luminous efficiency can be improved, and also durability of the organic EL device can be improved to attain potential applications for, for example, home electric appliances and illuminations.

1 Glass substrate
2 Transparent anode
3 Hole injection layer
4 Hole transport layer
5 Electron blocking layer
6 Light emitting layer
7 Electron transport layer
8 Electron injection layer
9 Cathode

The invention claimed is:

1. An organic electroluminescent device comprising at least an anode, a hole transport layer, an electron blocking layer, a light emitting layer, an electron transport layer and a cathode in this order;

TABLE 2

| | Hole injection layer Hole transport layer | Electron blocking layer | Voltage [V] (@10 mA/cm$^2$) | Luminance [cd/m$^2$] (@10 mA/cm$^2$) | Luminous efficiency [cd/A] (@10 mA/cm$^2$) | Power efficiency [lm/W] (@10 mA/cm$^2$) | Lifetime of device, attenuation to 95% |
|---|---|---|---|---|---|---|---|
| Example 9 | HTM-2 | Compound 1-1 | 3.59 | 756 | 7.56 | 6.61 | 193 hours |
| Example 10 | HTM-3 | Compound 1-1 | 3.59 | 745 | 7.45 | 6.53 | 180 hours |
| Comparative Example 2 | HTM-2 | HTM-2 | 3.60 | 644 | 6.44 | 5.63 | 165 hours |
| Comparative Example 3 | HTM-3 | HTM-3 | 3.62 | 642 | 6.42 | 5.58 | 151 hours | wherein the electron blocking layer comprises a carbazole compound of the general formula (1)

[Chemical Formula 1]

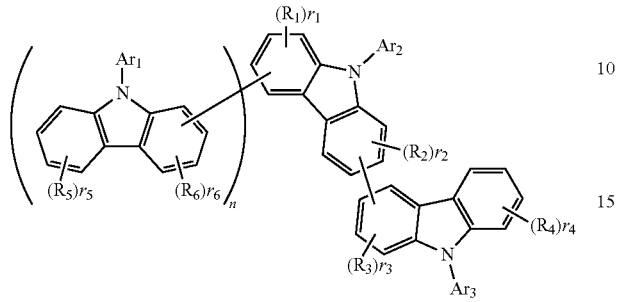

(1)

wherein $Ar_1$ to $Ar_3$ may be the same or different, and represent a substituted or unsubstituted aromatic hydrocarbon group, a substituted or unsubstituted aromatic heterocyclic group, or a substituted or unsubstituted condensed polycyclic aromatic group; $R_1$ to $R_6$ may be the same or different, and represent a deuterium atom, a fluorine atom, a chlorine atom, a cyano group, a nitro group, a linear or branched alkyl group of 1 to 6 carbon atoms that may have a substituent, a cycloalkyl group of 5 to 10 carbon atoms that may have a substituent, a linear or branched alkenyl group of 2 to 6 carbon atoms that may have a substituent, a linear or branched alkyloxy group of 1 to 6 carbon atoms that may have a substituent, a cycloalkyloxy group of 5 to 10 carbon atoms that may have a substituent, a substituted or unsubstituted aromatic hydrocarbon group, a substituted or unsubstituted aromatic heterocyclic group, a substituted or unsubstituted condensed polycyclic aromatic group, a substituted or unsubstituted aryloxy group, or a disubstituted amino group substituted with a group selected from an aromatic hydrocarbon group, an aromatic heterocyclic group, and a condensed polycyclic aromatic group, where the respective groups may bind to each other via a single bond, a substituted or unsubstituted methylene group, an oxygen atom, or a sulfur atom to form a ring, and the respective groups may bind to the benzene ring binding with $R_1$ to $R_6$ via a linking group such as substituted or unsubstituted methylene, an oxygen atom, a sulfur atom, or a monosubstituted amino group to form a ring; $r_4$ and $r_5$ represent an integer of 0 to 4, and $r_1$, $r_2$, $r_3$, and $r_6$ represent an integer of 0 to 3; and n represents 0 or 1; and wherein the light emitting layer comprises a blue light emitting dopant, wherein the blue light emitting dopant is a pyrene derivative, or an amine derivative having a condensed ring structure of the following general formula (2a-a), (2a-b), (2b-a), (2b-b), (2b-c), (2b-d), (2c-a), or (2c-b):

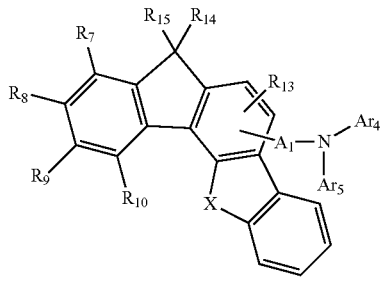

(2a-a)

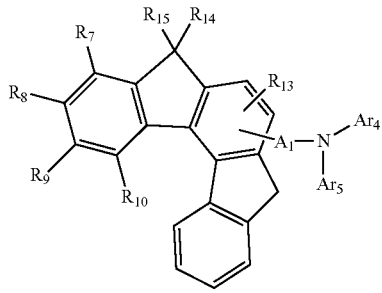

(2a-b)

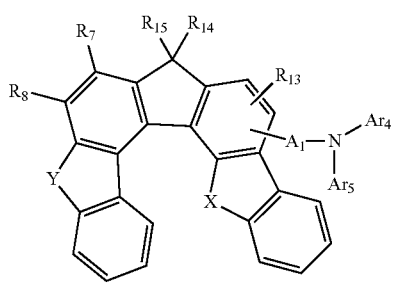

(2b-a)

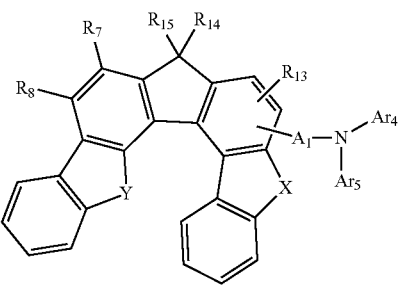

(2b-b)

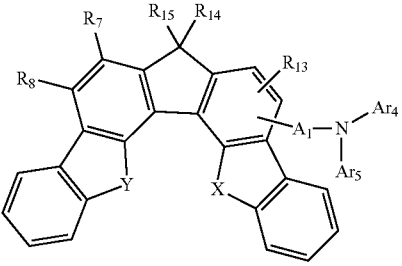

(2b-c)

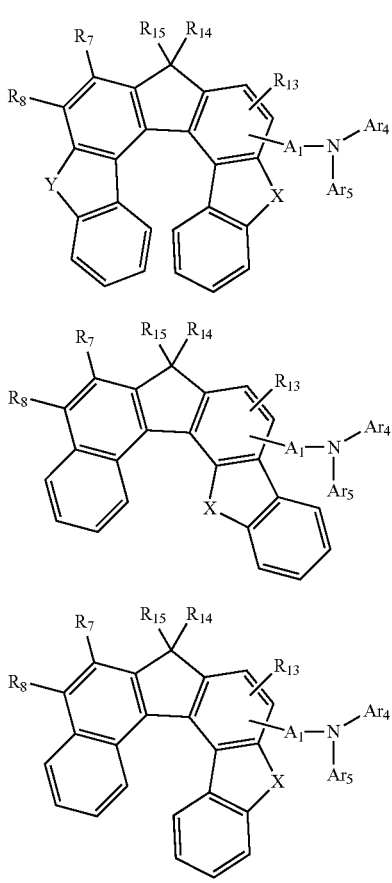

(2b-d)

(2c-a)

(2c-b)

wherein A₁ represents a divalent group of a substituted or unsubstituted aromatic hydrocarbon, a divalent group of a substituted or unsubstituted aromatic heterocyclic ring, a divalent group of substituted or unsubstituted condensed polycyclic aromatics, or a single bond;

Ar₄ and Ar₅ may be the same or different, and represent a substituted or unsubstituted aromatic hydrocarbon group, a substituted or unsubstituted aromatic heterocyclic group, or a substituted or unsubstituted condensed polycyclic aromatic group, where Ar₄ and Ar₅ may bind to each other via a single bond, substituted or unsubstituted methylene, an oxygen atom, or a sulfur atom to form a ring;

R₇ to R₁₀ may be the same or different, and represent a hydrogen atom, a deuterium atom, a fluorine atom, a chlorine atom, cyano, nitro, linear or branched alkyl of 1 to 6 carbon atoms that may have a substituent, cycloalkyl of 5 to 10 carbon atoms that may have a substituent, linear or branched alkenyl of 2 to 6 carbon atoms that may have a substituent, linear or branched alkyloxy of 1 to 6 carbon atoms that may have a substituent, cycloalkyloxy of 5 to 10 carbon atoms that may have a substituent, a substituted or unsubstituted aromatic hydrocarbon group, a substituted or unsubstituted aromatic heterocyclic group, a substituted or unsubstituted condensed polycyclic aromatic group, substituted or unsubstituted aryloxy, or a disubstituted amino group substituted with a group selected from an aromatic hydrocarbon group, an aromatic heterocyclic group, and a condensed polycyclic aromatic group, where the respective groups may bind to each other via a single bond, substituted or unsubstituted methylene, an oxygen atom, or a sulfur atom to form a ring, and the respective groups may bind to the benzene ring binding with R₇ to R₁₀ via a linking group such as substituted or unsubstituted methylene, an oxygen atom, a sulfur atom, or a monosubstituted amino group to form a ring;

R₁₃ represents a hydrogen atom, a deuterium atom, a fluorine atom, a chlorine atom, cyano, nitro, linear or branched alkyl of 1 to 6 carbon atoms that may have a substituent, cycloalkyl of 5 to 10 carbon atoms that may have a substituent, linear or branched alkenyl of 2 to 6 carbon atoms that may have a substituent, linear or branched alkyloxy of 1 to 6 carbon atoms that may have a substituent, cycloalkyloxy of 5 to 10 carbon atoms that may have a substituent, a substituted or unsubstituted aromatic hydrocarbon group, a substituted or unsubstituted aromatic heterocyclic group, a substituted or unsubstituted condensed polycyclic aromatic group, or substituted or unsubstituted aryloxy;

R₁₄ and R₁₅ may be the same or different, and represent linear or branched alkyl of 1 to 6 carbon atoms that may have a substituent, cycloalkyl of 5 to 10 carbon atoms that may have a substituent, linear or branched alkenyl of 2 to 6 carbon atoms that may have a substituent, a substituted or unsubstituted aromatic hydrocarbon group, a substituted or unsubstituted aromatic heterocyclic group, a substituted or unsubstituted condensed polycyclic aromatic group, or substituted or unsubstituted aryloxy, where the respective groups may bind to each other via a linking group such as a single bond, substituted or unsubstituted methylene, an oxygen atom, a sulfur atom, or a monosubstituted amino group to form a ring; and X and Y may be the same or different and represent an oxygen atom or a sulfur atom.

2. The organic electroluminescent device according to claim 1, wherein the hole transport layer includes a benzidine derivative, 1,1-bis[4-(di-4-tolylamino)phenyl]cyclohexane, a triphenylamine derivative having two triphenylamine skeletons as a whole molecule; a triphenylamine derivative having four triphenylamine skeletons as a whole molecule, or a triphenylamine derivative having three triphenylamine skeletons as a whole molecule.

3. The organic electroluminescent device according to claim 1, wherein the blue light emitting dopant is a pyrene derivative.

4. The organic electroluminescent device according to claim 1, wherein the electron transport layer includes a compound of the following general formula (3) having a pyrimidine ring structure:

[Chemical Formula 3]

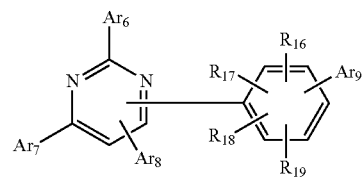

(3)

wherein $Ar_6$ represents a substituted or unsubstituted aromatic hydrocarbon group, or a substituted or unsubstituted condensed polycyclic aromatic group; $Ar_7$ and $Ar_8$ may be the same or different, and represent a hydrogen atom, a substituted or unsubstituted aromatic hydrocarbon group, or a substituted or unsubstituted condensed polycyclic aromatic group; $Ar_9$ represents a substituted or unsubstituted aromatic heterocyclic group; and $R_{16}$ to $R_{19}$ may be the same or different, and represent a hydrogen atom, a deuterium atom, a fluorine atom, a chlorine atom, cyano, trifluoromethyl, linear or branched alkyl of 1 to 6 carbon atoms, a substituted or unsubstituted aromatic hydrocarbon group, a substituted or unsubstituted aromatic heterocyclic group, or a substituted or unsubstituted condensed polycyclic aromatic group, where $Ar_7$ and $Ar_8$ are not simultaneously a hydrogen atom.

5. The organic electroluminescent device according to claim 1, wherein the light emitting layer includes an anthracene derivative.

6. The organic electroluminescent device according to claim 2, wherein the light emitting layer includes an anthracene derivative.

* * * * *